United States Patent
Shin et al.

(10) Patent No.: US 11,527,730 B2
(45) Date of Patent: Dec. 13, 2022

(54) ORGANIC ELECTROLUMINESCENCE DEVICE AND ORGANOMETALLIC COMPLEX FOR ORGANIC ELECTROLUMINESCENCE DEVICE

(71) Applicant: Samsung Display Co., Ltd., Yongin-Si (KR)

(72) Inventors: Sujin Shin, Daegu (KR); Soo-Byung Ko, Yongin-si (KR); Junghoon Han, Seoul (KR); Sungbum Kim, Yongin-si (KR); Haejin Kim, Hwaseong-si (KR); Eunsoo Ahn, Jinju-si (KR); Eunyoung Lee, Daejeon (KR); Jaesung Lee, Hwaseong-si (KR); Hyunjung Lee, Pohang-si (KR); Mina Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 380 days.

(21) Appl. No.: 16/813,381

(22) Filed: Mar. 9, 2020

(65) Prior Publication Data
US 2020/0373504 A1    Nov. 26, 2020

(30) Foreign Application Priority Data
May 20, 2019    (KR) .......................... 10-2019-0058768

(51) Int. Cl.
*H01L 51/00*    (2006.01)
*H01L 51/50*    (2006.01)

(52) U.S. Cl.
CPC ........ *H01L 51/009* (2013.01); *H01L 51/0087* (2013.01); *H01L 51/5056* (2013.01); *H01L 51/5072* (2013.01)

(58) Field of Classification Search
CPC ..................................................... H01L 51/009
USPC ........................................................ 428/690
See application file for complete search history.

(56) References Cited

U.S. PATENT DOCUMENTS

| 10,033,003 | B2 | 7/2018 | Li et al. |
| 2015/0105556 | A1 | 4/2015 | Li et al. |
| 2016/0028028 | A1 | 1/2016 | Li et al. |

FOREIGN PATENT DOCUMENTS

| KR | 10-2015-0043225 A | | 4/2015 | |
| KR | 20150048110 | * | 5/2015 | ........... H01L 51/009 |
| KR | 10-2016-0012941 A | | 2/2016 | |
| WO | WO-2018077769 A1 | * | 5/2018 | .......... C07F 15/0033 |

* cited by examiner

*Primary Examiner* — Christopher M Raabe
(74) *Attorney, Agent, or Firm* — Lewis Roca Rothgerber Christie LLP

(57) ABSTRACT

An organic electroluminescence device may include a first electrode, a second electrode opposite to the first electrode, and organic layers disposed between the first electrode and the second electrode. At least one of organic layers may include an organometallic complex including a first metal complex having a metal atom as a center atom of the first metal complex, a second metal complex having the metal atom as a center atom of the second metal complex, and an aromatic ring group connecting the first metal complex to the second metal complex.

20 Claims, 2 Drawing Sheets

ORGANIC ELECTROLUMINESCENCE DEVICE AND ORGANOMETALLIC COMPLEX FOR ORGANIC ELECTROLUMINESCENCE DEVICE

CROSS-REFERENCE TO RELATED APPLICATIONS

This U.S. non-provisional patent application claims priority under 35 U.S.C. § 119 to Korean Patent Application No. 10-2019-0058768, filed on May 20, 2019, in the Korean Intellectual Property Office, the entire Korean Patent Application is hereby incorporated by reference.

BACKGROUND

The present disclosure relates to an organic electroluminescence device and an organometallic complex used therefor.

Recently, an organic electroluminescence display device, which is one of image display devices, is being actively developed. The organic electroluminescence display device is a self-luminous display device. The organic electroluminescence display device is configured to produce excitons in a light emitting layer through recombinations of holes and electrons injected from a first electrode and a second electrode and to display an image using light, which is generated when the produced excitons fall to the ground state.

To use the organic electroluminescence device for a display apparatus, the organic electroluminescence device is required to have a low driving voltage, a high light-emitting efficiency, and a long lifetime. Moreover, there is an ever-increasing demand for development of materials for the organic electroluminescence device to stably realize such technical requirements.

With regard to the development of the materials for the light emitting layer, an organometallic complex, which is used as a dopant material, is being explored.

SUMMARY

An embodiment of the inventive concept provides an organic electroluminescence device with a long lifetime.

An embodiment of the inventive concept provides an organometallic complex with a long lifetime.

According to an embodiment of the inventive concept, an organic electroluminescence device may include a first electrode, a second electrode opposite to the first electrode, and organic layers disposed between the first electrode and the second electrode. At least one of the organic layers may be an organometallic complex including a first metal complex having a metal atom as a center atom of the first metal complex, a second metal complex having the metal atom as a center atom of the second metal complex, and an aromatic ring group connecting the first metal complex to the second metal complex.

In an embodiment, the first metal complex and the second metal complex may be the same as each other.

In an embodiment, the metal atom may be Pt, Pd, Cu, Ag, Au, Rh, Ir, Ru, or Os.

In an embodiment, the aromatic ring group may be an aryl group or a hetero aryl group.

In an embodiment, the first metal complex and the second metal complex each independently may further include a substituted or unsubstituted imidazolyl group bonded to the metal atom and a substituted or unsubstituted aryl group or a substituted or unsubstituted hetero aryl group bonded to the metal atom.

In an embodiment, the organic layers may include a hole transport region, a light emitting layer, and an electron transport region, and the organometallic complex is included in the light emitting layer.

In an embodiment, the organometallic complex may be represented by the following chemical formula 1.

[Chemical formula 1]

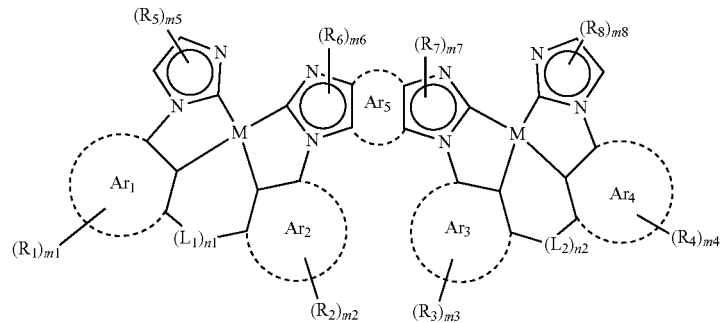

In the chemical formula 1,

M is Pt, Pd, Cu, Ag, Au, Rh, Ir, Ru, or Os, $Ar_1$, $Ar_2$, $Ar_3$, $Ar_4$, and $Ar_5$ are each independently a substituted or unsubstituted aryl group having 6 to 60 ring-forming carbon atoms or a substituted or unsubstituted hetero aryl group having 2 to 60 ring-forming carbon atoms, $L_1$ and $L_2$ are each independently selected from a direct linkage, *—O—*, *—S—*, *—C($R_{11}$)($R_{12}$)—*, *—C($R_{13}$)=*, *=C($R_{14}$)—*, *—C($R_{15}$)=C($R_{16}$)—*, *—C(=O)—*, *—C(=S)—*, *—C≡C—*, *—B($R_{17}$)—*, *—N($R_{18}$)—*, *—P($R_{19}$)—*, *—Si($R_{20}$)($R_{21}$)—*, *—P($R_{21}$)($R_{22}$)—*, and *—Ge($R_{22}$)($R_{23}$)—*;

$n_1$ and $n_2$ are each independently an integer from 0 to 3, $m_1$ to $m_5$ and $m_8$ are each independently an integer from 0 to 3, $m_6$ and $m_7$ are each independently an integer from 0 to 1, $R_1$ to $R_8$ are each independently a hydrogen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms, or are bonded to an adjacent group to form a ring, and $R_{11}$ to $R_{23}$ are each independently a hydrogen atom, an oxygen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms.

In an embodiment, the organometallic complex represented by the chemical formula 1 may be represented by the following chemical formula 1-1 or 1-2.

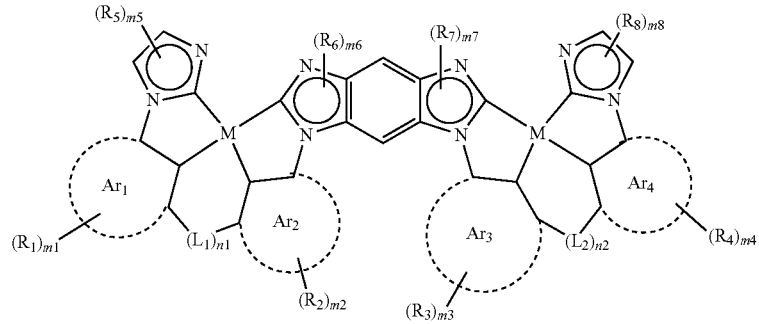

[Chemical formula 1-1]

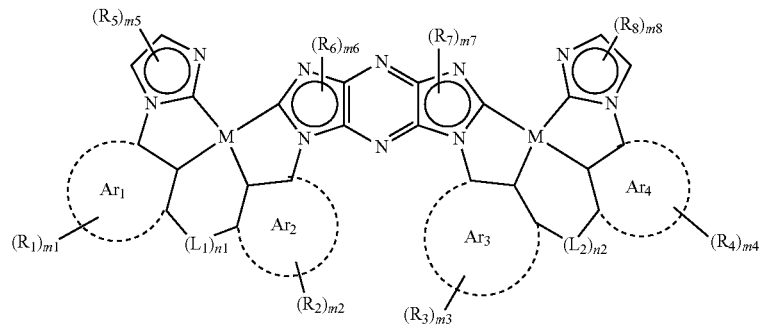

[Chemical formula 1-2]

In the chemical formulae 1-1 and 1-2, and

M, $Ar_1$ to $Ar_2$, $R_1$ to $R_8$, $m_1$ to $m_8$, $L_1$, $L_2$, $n_1$, and $n_2$ are defined the same as in the chemical formula 1.

In an embodiment, the organometallic complex represented by the chemical formula 1 may be represented by the following chemical formula 1-3.

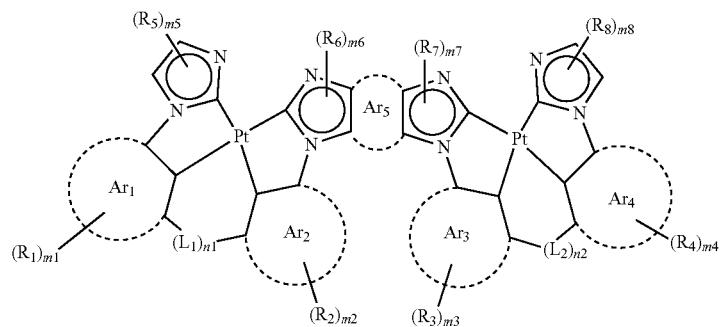

[Chemical formula 1-3]

In the chemical formula 1-3, $Ar_1$ to $Ar_5$, $R_1$ to $R_8$, $m_1$ to $m_8$, $L_1$, $L_2$, $n_1$, and $n_2$ are defined the same as in the chemical formula 1.

In an embodiment, the $R_1$ to $R_8$ may be each independently represented by the following structure S1, S2, or S3.

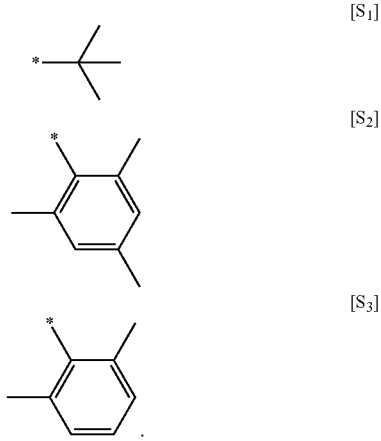

In an embodiment, $Ar_1$ to $Ar_4$ may be each independently a substituted or unsubstituted benzene ring.

In an embodiment, the organometallic complex represented by the chemical formula 1 may be phosphorescence dopants or thermally activated delayed fluorescent dopants.

BRIEF DESCRIPTION OF THE DRAWINGS

Example embodiments will be more clearly understood from the following brief description taken in conjunction with the accompanying drawings. The accompanying drawings represent example embodiments as described herein.

Figure 1:
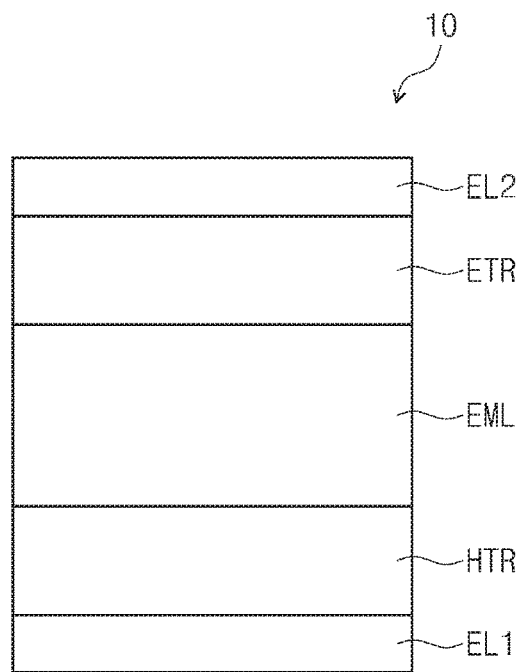
FIG. 1 is a sectional view schematically illustrating an organic electroluminescence device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion, e.g., "between" versus "directly between," "adjacent" versus "directly adjacent," "on" versus "directly on".

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms, including technical and scientific terms, used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, an organic electroluminescence device and an organometallic complex, according to an embodiment of the inventive concept will be described in more detail with reference to the accompanying drawings.

Figure 2:
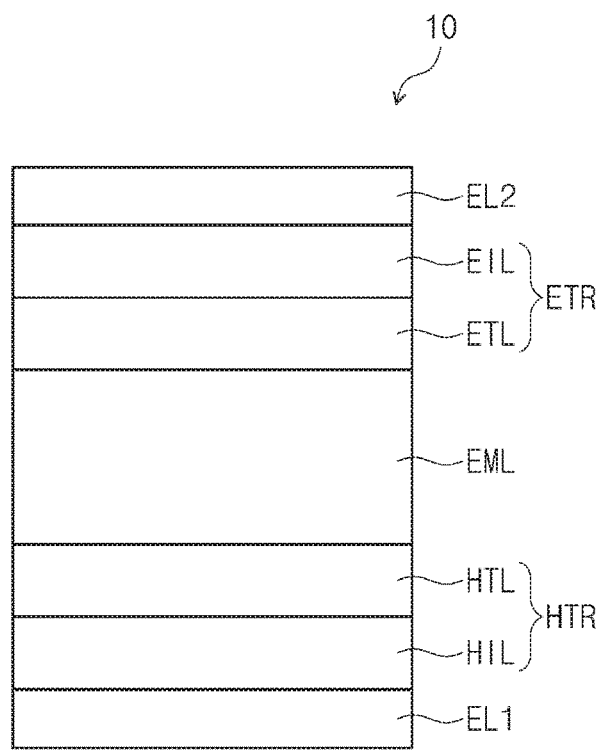
FIG. 2 is a sectional view schematically illustrating an organic electroluminescence device according to an embodiment of the inventive concept.
Figure 3:
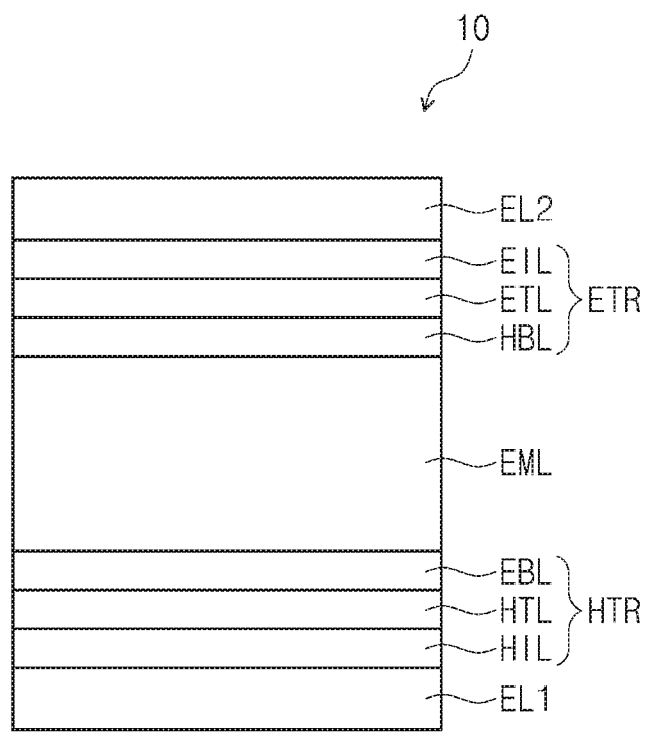
FIG. 3 is a sectional view schematically illustrating an organic electroluminescence device according to an embodiment of the inventive concept.

FIGS. 1, 2, and 3 are sectional views, each of which illustrates an organic electroluminescence device 10 according to an embodiment of the inventive concept. Referring to FIGS. 1, 2, and 3, the organic electroluminescence device 10 according to an embodiment of the inventive concept may include a first electrode EL1, a hole transport region HTR, a light emitting layer EML, an electron transport region ETR, and a second electrode EL2, which are sequentially stacked.

The first electrode EL1 and the second electrode EL2 may be disposed to be opposite to each other, and organic layers may be disposed between the first electrode EL1 and the second electrode EL2. The organic layers may include the hole transport region HTR, the light emitting layer EML, and the electron transport region ETR. In an embodiment, at least one layer of the organic layers in the organic electroluminescence device 10 may include an organometallic complex to be described below.

In the organic electroluminescence device 10 shown FIG. 2, the hole transport region HTR may include a hole injection layer HIL and a hole transport layer HTL. The electron transport region ETR may include an electron injection layer EIL and an electron transport layer ETL. In addition, in the organic electroluminescence device 10 shown in FIG. 3, the hole transport region HTR may include the hole injection layer HIL, the hole transport layer HTL, and an electron blocking layer EBL. The electron transport region ETR may include the electron injection layer EIL, the electron transport layer ETL, and a hole blocking layer HBL.

The first electrode EL1 may be conductive. The first electrode EL1 may be formed of or include a metal alloy or a conductive compound. The first electrode EL1 may be an anode. In addition, the first electrode EL1 may be a pixel electrode. The first electrode EL1 may be a transparent electrode, a transflective electrode, or a reflective electrode. In the case where the first electrode EL1 is the transparent electrode, the first electrode EL1 may be formed of or include a transparent metal oxide, e.g., indium tin oxide (ITO), indium zinc oxide (IZO), zinc oxide (ZnO), or indium tin zinc oxide (ITZO). In the case where the first electrode EL1 is the transflective electrode or the reflective electrode, the first electrode EL1 may be formed of or include at least one of Ag, Mg, Cu, Al, Pt, Pd, Au, Ni, Nd, Ir, Cr, Li, Ca, LiF/Ca, LiF/Al, Mo, Ti, compounds thereof, or mixtures thereof, e.g., a mixture of Ag and Mg. Alternatively, the first electrode EL1 may be a multi-layered structure including a reflective or transflective layer, e.g., of the above material, and a transparent conductive layer, e.g., of indium tin oxide (ITO), indium zinc oxide (IZO), zinc oxide (ZnO), or indium tin zinc oxide (ITZO). For example, the first electrode EL1 may have a triple-layered structure of ITO/Ag/ITO The first electrode EL1 may have a thickness ranging from about 1000 Å to about 10000 Å, in particular, from about 1000 Å to about 3000 Å.

The hole transport region HTR may be provided on the first electrode EL1. The hole transport region HTR may include at least one of the hole injection layer HIL, the hole transport layer HTL, a hole buffer layer, and the electron blocking layer EBL. A thickness of the hole transport region HTR may range from, for example, about 1000 Å to about 1500 Å.

The hole transport region HTR may have a single-layered structure made of a single material, a single-layered structure made of different materials, or a multi-layered structure including layers made of different materials.

For example, the hole transport region HTR may have a single-layered structure of the hole injection layer HIL or the hole transport layer HTL or may have a single-layered structure made of a hole injection material and a hole transport material. In certain embodiments, the hole transport region HTR may include a single-layered structure, which is made of different materials, or a multi-layered structure, in which the hole injection layer HIL/the hole transport layer HTL, the hole injection layer HIL/the hole transport layer HTL/the hole buffer layer, the hole injection layer HIL/the hole buffer layer, the hole transport layer HTL/the hole buffer layer, or the hole injection layer HIL/the hole transport layer HTL/the electron blocking layer EBL are stacked on the first electrode EL1.

The hole transport region HTR may be formed by at least one of various methods, such as a vacuum deposition method, a spin coating method, a cast method, a Langmuir-Blodgett (LB) method, an inkjet printing method, a laser printing method, and a laser-induced thermal imaging (LITI) method.

The hole injection layer HIL may include, for example, phthalocyanine compounds (such as copper phthalocyanine), DNTPD(N,N'-diphenyl-N,N'-bis-[4-(phenyl-m-tolyl-amino)-phenyl]-biphenyl-4,4'-diamine), m-MTDATA(4,4', 4"-tris(3-methylphenylphenylamino)triphenylamine), TDATA(4,4'4"-Tris(N,N-diphenylamino)triphenylamine), 2-TNATA(4,4',4"-tris {N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate)), NPB(N,N'-di(naphthalene-1-yl)-N,N'-diphenyl-benzidine), polyether ketone(TPAPEK) containing triphenylamine, 4-Isopropyl-4'-methyldiphenyliodonium Tetrakis(pentafluorophenyl)borate, or HAT-CN(dipyrazino [2,3-f: 2',3'-h] quinoxaline-2,3,6,7,10,11-hexacarbonitrile).

The hole transport layer HTL may include, for example, carbazole derivatives (such as N-phenylcarbazole or polyvinylcarbazole), fluorine derivatives, triphenylamine derivatives (such as TPD(N,N'-bis(3-methylphenyl)-N,N'-diphenyl-[1,1-biphenyl]-4,4'-diamine) or TCTA(4,4',4"-tris(N-carbazolyl)triphenylamine)), NPB (N,N'-di(naphthalene-1-yl)-N,N'-diphenyl-benzidine), TAPC(4,4'-Cyclohexylidene bis[N,N-bis(4-methylphenyl)benzenamine]), HMTPD(4,4'-Bis[N,N'-(3-tolyl)amino]-3,3'-dimethylbiphenyl), or mCP (1,3-Bis(N-carbazolyl)benzene).

A thickness of the hole transport region HTR may range from about 100 Å to about 10000 Å, in particular, from about 100 Å to about 5000 Å. For example, a thickness of the hole injection layer HIL may range from about 30 Å to about 1000 Å, and a thickness of the hole transport layer HTL may range from about 30 Å to about 1000 Å. For example, a thickness of the electron blocking layer EBL may range from about 10 Å to about 1000 Å. In the case where the thicknesses of the hole transport region HTR, the hole injection layer HIL, the hole transport layer HTL, and the electron blocking layer EBL are within the above ranges, it may be possible to obtain a satisfactory electron transport property, without a substantial increase in driving voltage.

The hole transport region HTR may further include a charge producing material for increasing conductivity, in addition to the afore-mentioned materials. The charge producing material may be uniformly or non-uniformly distributed in the hole transport region HTR. In an embodiment, the charge producing material may be p-dopants. The p-dopants may be one of quinone derivatives, metal oxides, and cyano-containing compounds. Examples of the p-dopants may be quinone derivatives, such as TCNQ(Tetracyanoquinodimethane) and F4-TCNQ(2,3,5,6-tetrafluoro-tetracyano-quinodimethane), or metal oxides, such as tungsten oxide and molybdenum oxide.

As described above, the hole transport region HTR may further include at least one of a hole buffer layer or an electron blocking layer, in addition to the hole injection layer HIL and the hole transport layer HTL. The hole buffer layer may compensate a resonance distance, which varies depending on the wavelength of light emitted from the light emitting layer EML, thereby increasing light emission efficiency. The hole buffer layer may be formed of or include a material contained in the hole transport region HTR. The electron blocking layer may prevent electrons from being injected from the electron transport region ETR into the hole transport region HTR.

The light emitting layer EML may be provided on the hole transport region HTR. In an embodiment, the light emitting layer EML may have a thickness ranging from about 100 Å to about 1000 Å or from about 100 Å to about 300 Å. The light emitting layer EML may have a single-layered structure made of a single material, a single-layered structure made of different materials, or a multi-layered structure including layers made of different materials.

In the organic electroluminescence device 10, the light emitting layer EML may include the organometallic complex according to an embodiment of the inventive concept. The organometallic complex according to an embodiment of the inventive concept may include a first metal complex, in which a metal atom is provided as a center atom of the first metal complex, a second metal complex, in which a metal atom is provided as a center atom of the second metal complex, and an aromatic ring group connecting the first metal complex to the second metal complex.

The organometallic complex according to an embodiment of the inventive concept may have two substituted or unsubstituted imidazolyl groups bonded to a metal atom and additional two substituted or unsubstituted aromatic rings bonded to a metal atom. Additional two substituted or unsubstituted aromatic rings may be selected from substituted or unsubstituted aryl groups and substituted or unsubstituted hetero aryl groups.

In the organometallic complex according to an embodiment of the inventive concept, the first metal complex and the second metal complex may be the same. For example, the center metal atoms of the first metal complex and the second metal complex may be the same, the substituted or unsubstituted imidazolyl groups bonded to the center metal atoms of the first metal complex and the second metal complex each other may be symmetric, and the substituted or unsubstituted aryl group or the substituted or unsubstituted hetero aryl group bonded to the center metal atoms of the first metal complex and the second metal complex each other may be symmetric.

In the organometallic complex according to an embodiment of the inventive concept, the metal atom may be Pt, Pd, Cu, Ag, Au, Rh, Ir, Ru, or Os. For example, the metal atom may be Pt.

In the organometallic complex according to an embodiment of the inventive concept, the aromatic ring group connecting the first metal complex and the second metal complex may be a substituted or unsubstituted aryl group or a substituted or unsubstituted hetero aryl group. For example, the aromatic ring group may be an aromatic hexagonal ring. In detail, the aromatic ring group may be a benzene ring. In an embodiment, the aromatic ring group may be a hexagonal hetero ring, in which N is used as the hetero atom of the hetero aryl group. For example, the aromatic ring group may be pyrazine.

In the organometallic complex according to an embodiment of the inventive concept, the first metal complex and the second metal complex may further include, each independently, a substituted or unsubstituted imidazolyl group bonded to the metal atom and a substituted or unsubstituted aryl group or a substituted or unsubstituted hetero aryl group bonded to the metal atom.

For example, the substituted or unsubstituted imidazolyl group bonded to the metal atom may be an unsubstituted imidazolyl group or an imidazolyl group substituted with at least one methyl group.

In an embodiment, the substituted or unsubstituted aryl group bonded to the metal atom may be an unsubstituted aryl group having 6 to 18 ring-forming carbon atoms or a substituted aryl group having 6 to 18 ring-forming carbon atoms. For example, a benzene ring, a benzene ring substituted with t-butyl group, a benzene ring substituted with 2,6-dimethyl group, or a benzene ring substituted with 2,4,6-trimethyl group.

In the present specification, the expression "substituted or unsubstituted" means that it is substituted or unsubstituted with one or more substituent, which is selected from the group consisting of a deuterium atom, a halogen atom, a nitro group, an alkyl group, an aryl group, and a hetero ring group, unless the context clearly indicates otherwise. In addition, each of the substituents mentioned as the examples may be a substituted or unsubstituted substituent. For example, a biphenyl group may be interpreted as an aryl group, and a phenyl group may be interpreted as a substituted phenyl group. The hetero ring group may include an aliphatic hetero ring and an aromatic hetero ring, e.g., a hetero aryl group.

In the present specification, the alkyl group may have a linear, branched, or cyclic form. The number of carbon atoms in the alkyl group may be 1-30, 1-20, 1-10, or 1-5. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, a adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group.

In the present specification, the aryl group means any functional group or substituent derived from the aromatic hydrocarbon ring. The aryl group may be a monocyclic aryl group or a polycyclic aryl group. The number of ring-forming carbon atoms in the aryl group may be 6-60, 6-30, 6-20, or 6-15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a biphenylene group, a triphenylene group, a pyrenyl group, a benzo fluoranthenyl group, and a chrysenyl group.

In the present specification, the hetero aryl group may include at least one of B, 0, N, P, Si, or S as a hetero atom. In the case where the hetero aryl group includes two or more hetero atoms, the two or more hetero atoms may be the same as each other or may be different from each other. The hetero aryl group may be a monocyclic hetero ring group or a polycyclic hetero ring group. The number of ring-forming carbon atoms in the hetero aryl group may be 2-30, 2-20, or 2-10. Examples of the hetero aryl group may include a thiophene group, a furan group, a pyrrole group, an imidazole group, a thiazole group, a oxazole group, a oxadiazole group, a triazole group, a pyridine group, a bipyridine group, a pyrimidine group, a triazine group, a triazole group, a acridyl group, a pyridazine group, a pyrazinyl group, a quinoline group, a quinazoline group, a quinoxaline group, a phenoxazin group, a phthalazine group, a pyrido pyrimidine group, a pyrido pyrazine group, a pyrazino pyrazine group, an isoquinoline group, an indole group, a carbazole group, an N-arylcarbazole group, an N-hetero arylcarbazole group, an N-alkylcarbazole group, a benzooxazole group, a benzoimidazole group, a benzothiazole group, a benzocarbazole group, a benzothiophene group, a dibenzothiophene group, a thienothiophene group, a benzofuran group, a phenanthroline group, a thiazole group, an isooxazole group, a oxadiazole group, a thiadiazole group, a phenothiazine group, a dibenzosilole group, and a dibenzofuran group.

In the present specification, the expression "an element is bonded to an adjacent group to form a ring" may means that the element is bonded to the adjacent group to form a substituted or unsubstituted hydrocarbon ring or a substituted or unsubstituted hetero ring. The hydrocarbon ring may include an aliphatic hydrocarbon ring and an aromatic hydrocarbon ring. The hetero ring may include an aliphatic hetero ring and an aromatic hetero ring. The hydrocarbon ring and the hetero ring may be monocyclic or polycyclic. In addition, a ring may be combined with another ring to form a spiro structure.

In the present specification, the "adjacent" group may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as groups "adjacent" to each other, and two ethyl groups in 1,1-diethylcyclopentane may be interpreted as groups "adjacent" to each other.

In the present specification, examples of the halogen atom may include a fluorine atom, a chlorine atom, a bromine atom, or an iodine atom.

In the present specification, the direct linkage may mean a single bond.

In the present specification, the symbol "-*" may represent a position connected to an adjacent portion.

The organometallic complex according to an embodiment of the inventive concept may be represented by the following chemical formula 1.

[Chemical formula 1]

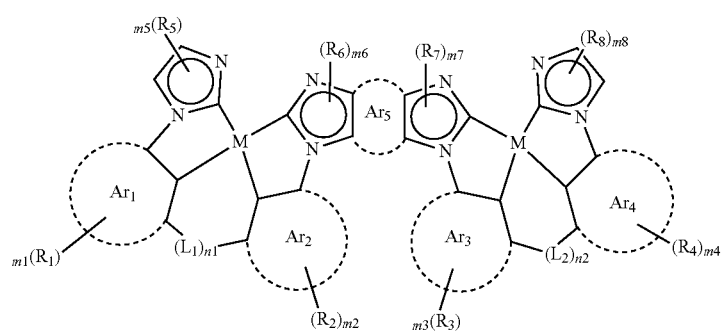

In the chemical formula 1, M may be Pt, Pd, Cu, Ag, Au, Rh, Ir, Ru, or Os. In an embodiment, M may be Pt.

$Ar_1$, $Ar_2$, $Ar_3$, $Ar_4$, and $Ar_5$ may be each independently a substituted or unsubstituted aryl group having 6 to 60 ring-forming carbon atoms or a substituted or unsubstituted hetero aryl group having 2 to 60 ring-forming carbon atoms. For example, $Ar_1$ to $Ar_4$ may be an unsubstituted aryl group having 6 to 60 ring-forming carbon atoms or an aryl group, which is substituted with alkyl group and has 6 to 60 carbon atoms. In detail, $Ar_1$ to $Ar_4$ may be a benzene ring, a benzene ring substituted with a t-butyl group, a benzene ring substituted with 2,6-dimethyl group, a benzene ring substituted with 2,4,6-trimethyl group.

Also, $Ar_5$ may be an aryl group or a hetero aryl group. For example, in the case where $Ar_5$ is an aryl group, the aryl group may be a hexagonal ring, in particular, benzene. In the case where $Ar_5$ is a hetero aryl group, the hetero aryl group may be an aromatic hexagonal ring including N, in particular, pyrazine.

$L_1$ and $L_2$ may be each independently selected from a direct linkage, *—O—*, *—S—*, *—C($R_{11}$)($R_{12}$)—*, *—C($R_{13}$)=*, *=C($R_{14}$)—*, *—C($R_{15}$)=C($R_{16}$)—*, *—C(=O)—*, *—C(=S)—*, *—C≡C—*, *—B($R_{17}$)—*, *—N($R_{18}$)—*, *—P($R_{19}$)—*, *—Si($R_{20}$)($R_{21}$)—*, *—P($R_{21}$)($R_{22}$)—*, and *—Ge($R_{22}$)($R_{23}$)—*. $L_1$ and $L_2$ may be the same or different from each other. For example, $L_1$ and $L_2$ may be oxygen.

$n_1$ and $n_2$ may be each independently an integer from 0 to 3. In the case where $n_1$ is an integer of 2 or larger, ($L_1$)s may be the same or different from each other. In the case where $n_2$ is an integer of 2 or larger, ($L_2$)s may be the same or different from each other. In an embodiment, $n_1$ and $n_2$ may be 1.

$R_{11}$ to $R_{23}$ may be each independently a hydrogen atom, a deuterium atom, an oxygen atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms.

$M_1$ to $m_5$ and $m_8$ may be each independently an integer from 0 to 3, and $m_6$ and $m_7$ may be each independently an integer from 0 to 1. In the case where $m_1$ is an integer of 2 or larger, ($R_1$)s may be the same or different from each other. In the case where each of $m_2$ to $m_5$ and $m_8$ is an integer of 2 or larger, ($R_2$)s to ($R_5$)s and ($R_8$)s may respectively be the same or different from each other, as described above.

$R_1$ to $R_8$ may be each independently a hydrogen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms, or may be bonded to an adjacent group to form a ring. For example, $R_1$ to $R_8$ may be each independently represented by the following structure S1, S2, or S3.

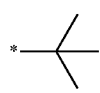

[S1]

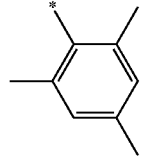

[S2]

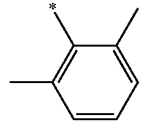

[S3]

In the organometallic complex represented by the chemical formula 1, the first metal complex may be

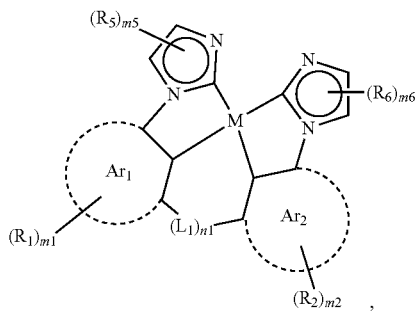

and the second metal complex may be

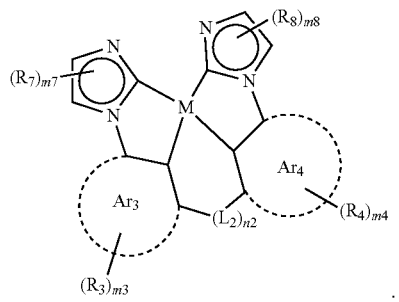

The first metal complex and the second metal complex may be connected to each other with the aromatic ring group represented by "$Ar_5$".

In the organometallic complex according to an embodiment of the inventive concept, the organometallic complex represented by the chemical formula 1 may be represented by the following chemical formula 1-1 or 1-2.

[Chemical formula 1-1]

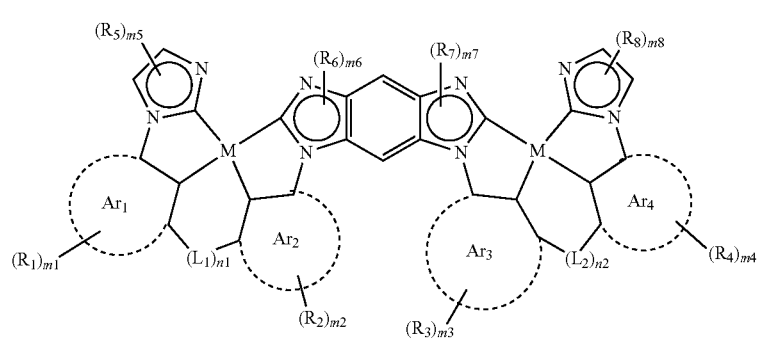

[Chemical formula 1-2]

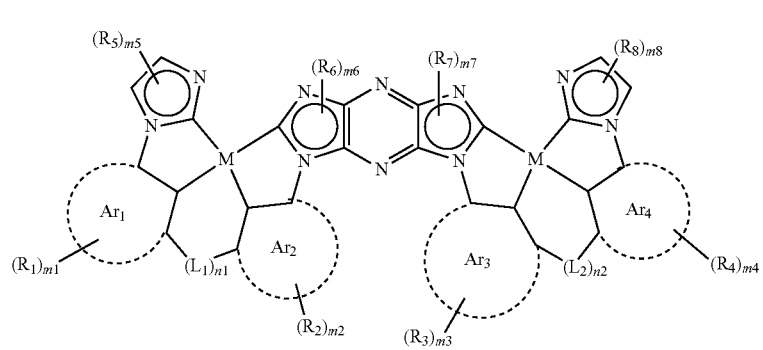

The chemical formula 1-1 represents a case, in which $Ar_5$ has a benzene ring group, and the chemical formula 1-2 represents a case, in which $Ar_5$ is pyrazine.

The above explanation described with reference to the chemical formula 1 may be applied to M, $Ar_1$ to $Ar_4$, $R_1$ to $R_8$, $m_1$ to $m_5$, $L_1$, $L_2$, $n_1$ and $n_2$ in the chemical formulas 1-1 and 1-2 in the same manner.

In the organometallic complex according to an embodiment of the inventive concept, the organometallic complex represented by the chemical formula 1 may be expressed by the following chemical formula 1-3.

[Chemical formula 1-3]

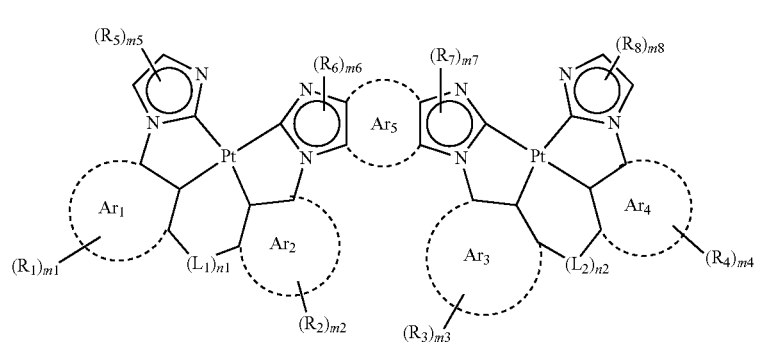

The chemical formula 1-3 represents a case, in which M in the chemical formula 1 is Pt.

The above explanation described with reference to the chemical formula 1 may be applied to M, $Ar_1$ to $Ar_5$, $R_1$ to $R_5$, $m_1$ to $m_5$, $L_1$, $L_2$, $n_1$ and $n_2$ in the chemical formula 1-3 in the same manner.

The organometallic complex according to an embodiment of the inventive concept may include at least one of compounds in the following compound group 1.

[Compound group 1]

1
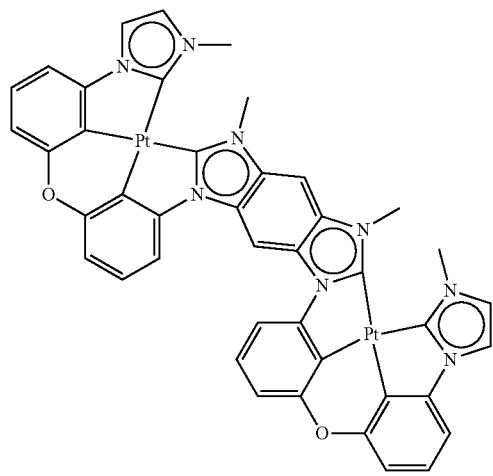

2
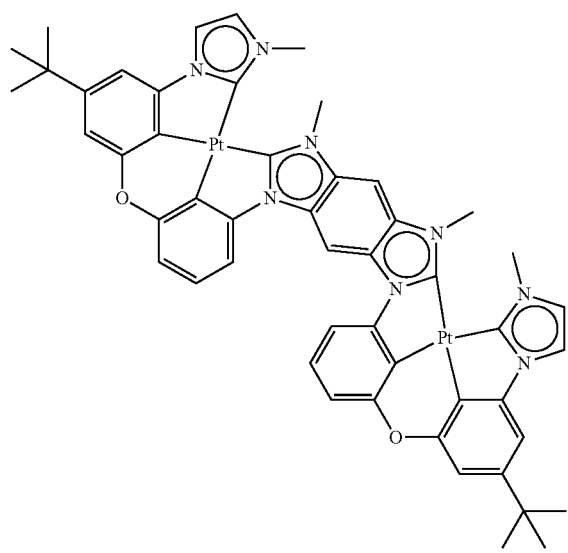

3
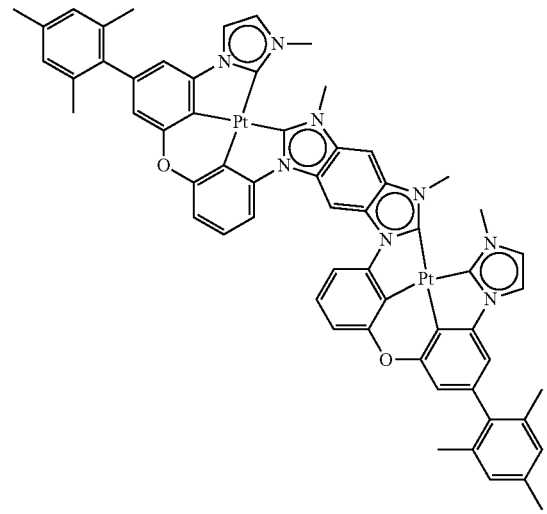

4
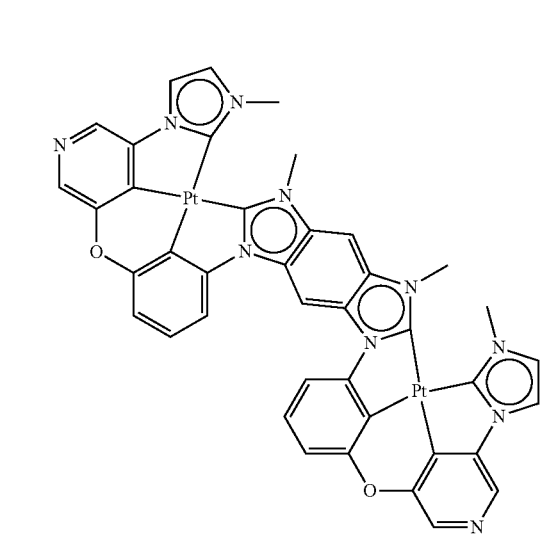

5
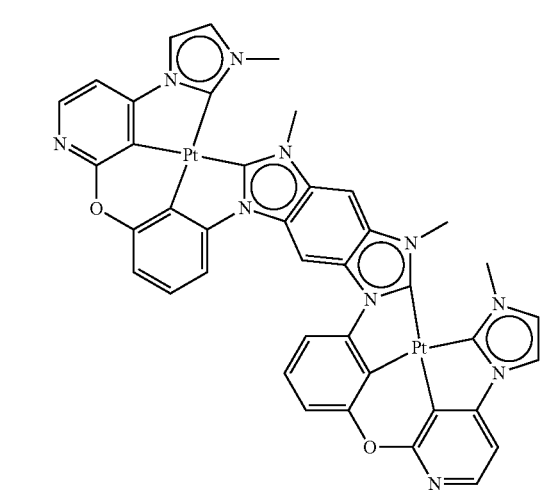

19
-continued
6
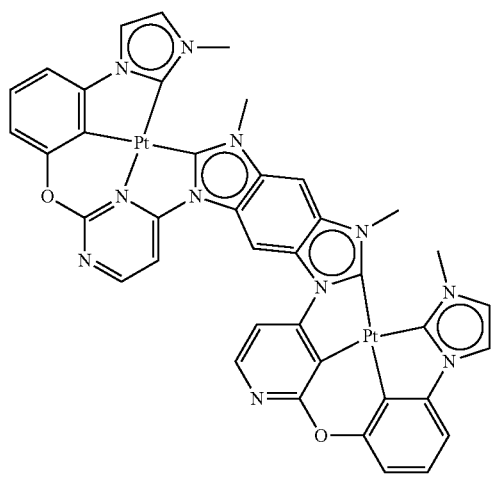
7
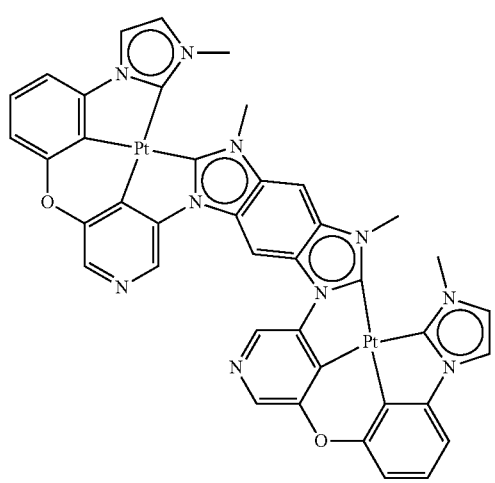
8
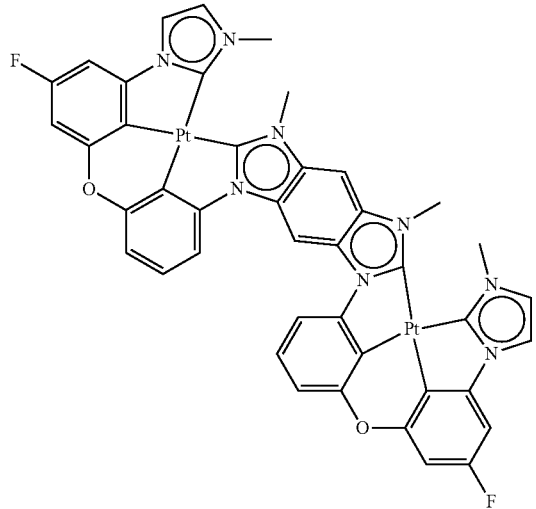
20
-continued
9
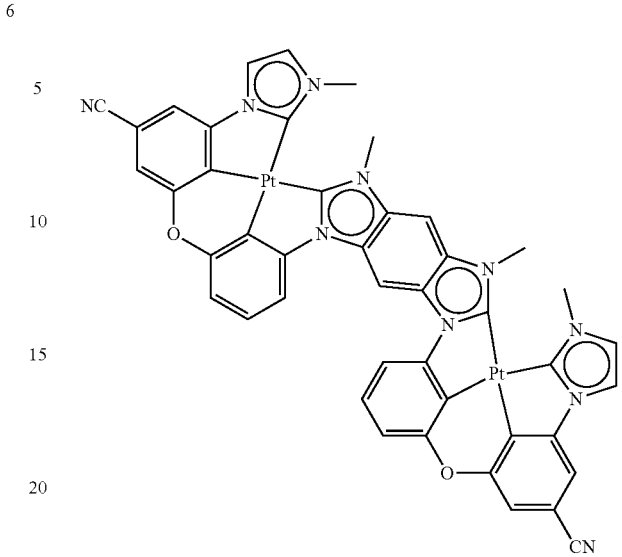
10
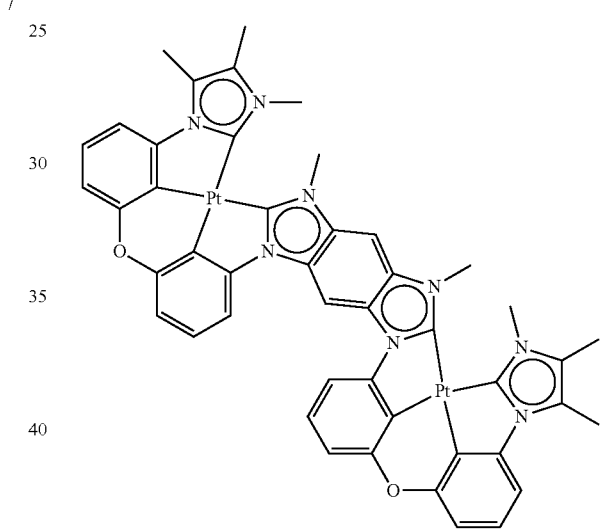
11
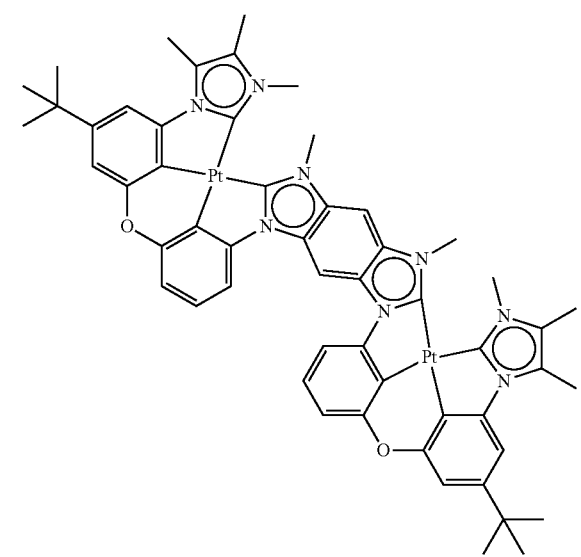

12
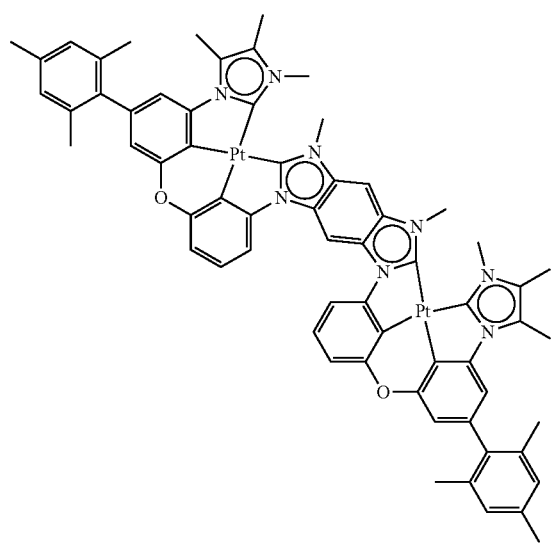
13
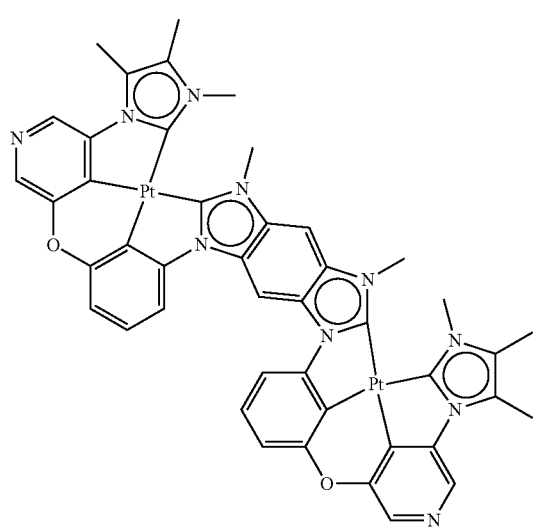
14
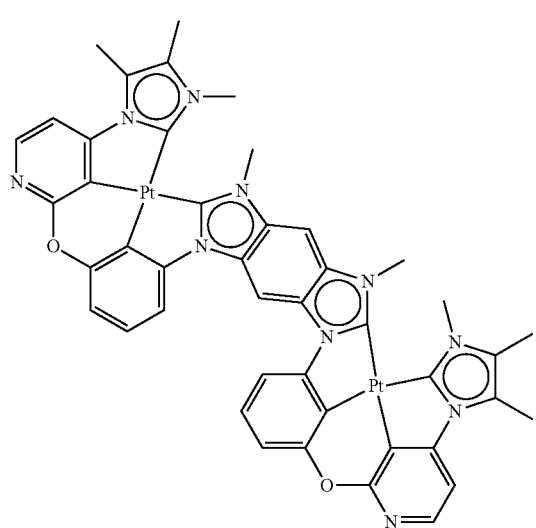
15
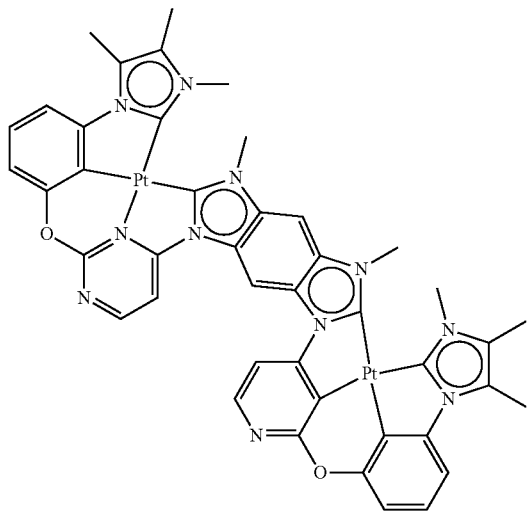
16
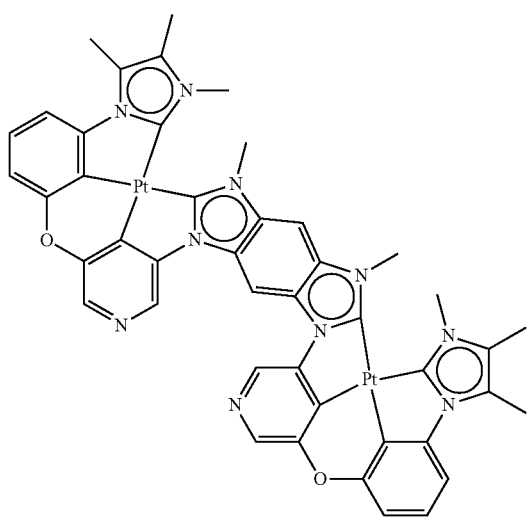
17
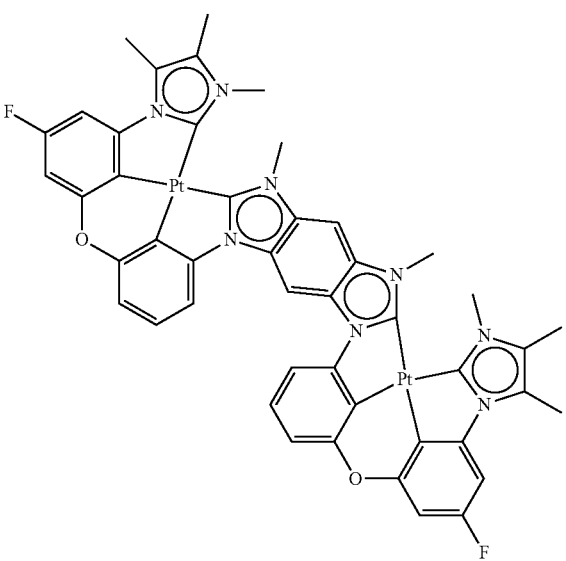

18
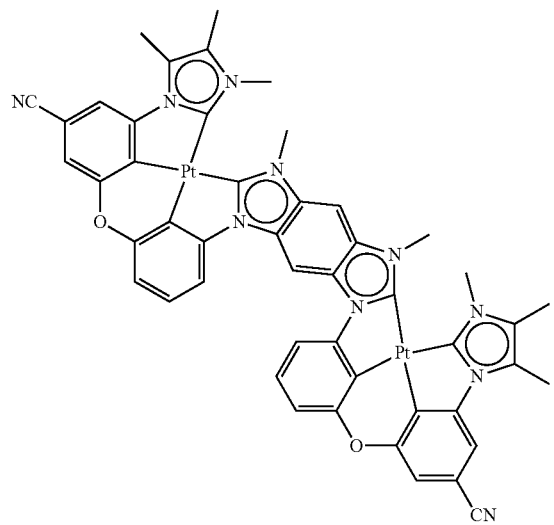
19
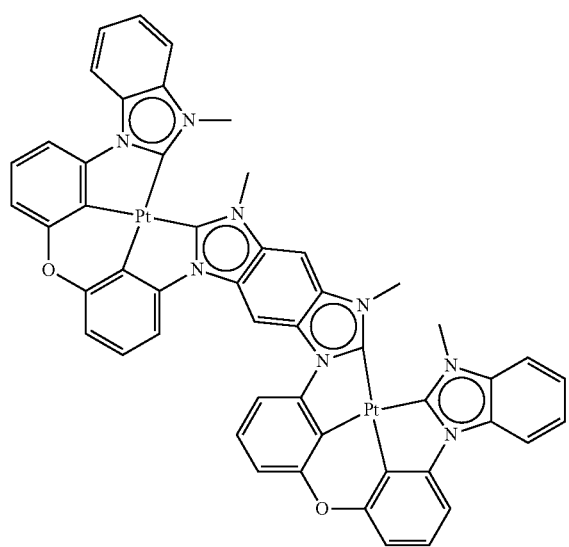
20
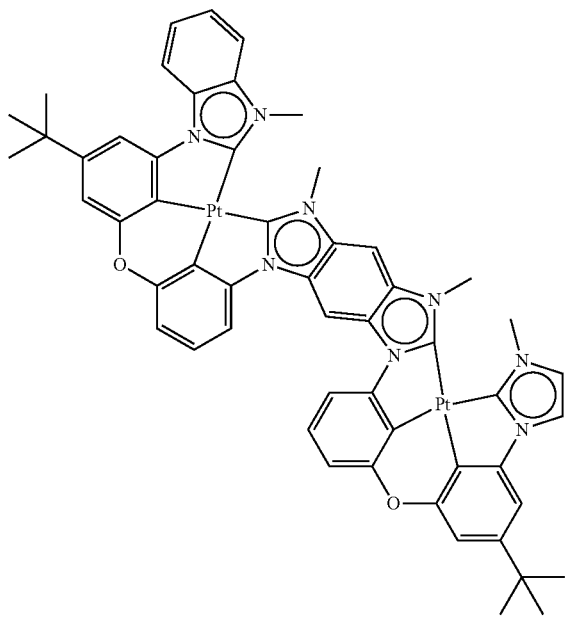
21
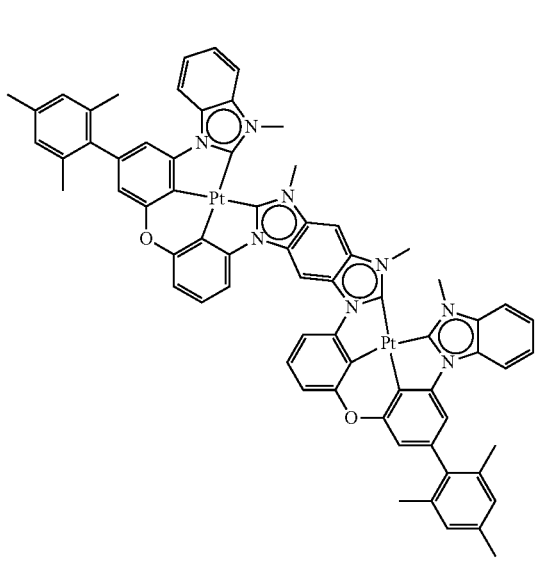

22
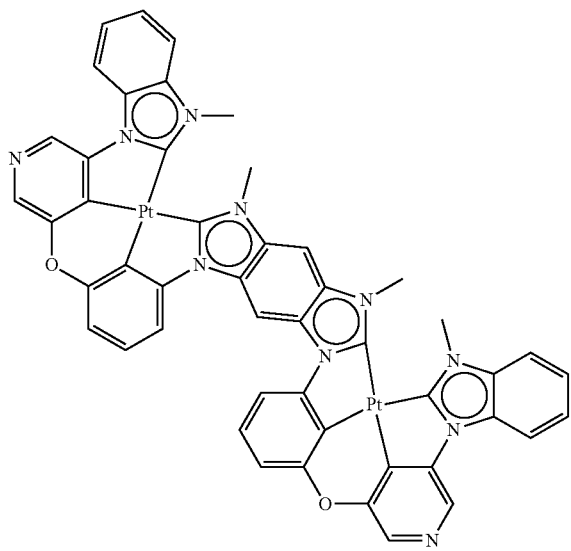
23
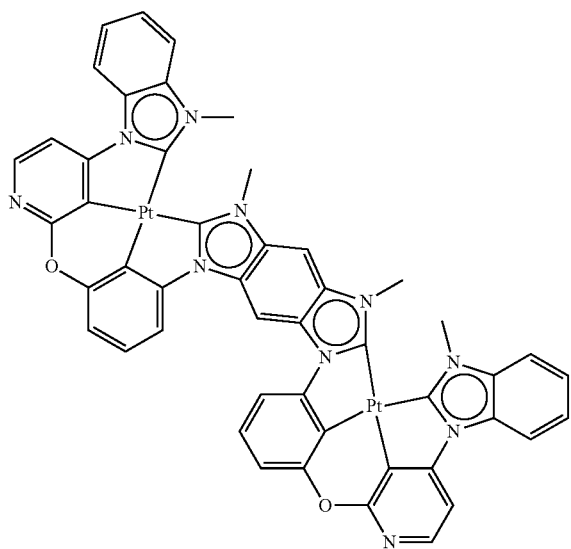
24
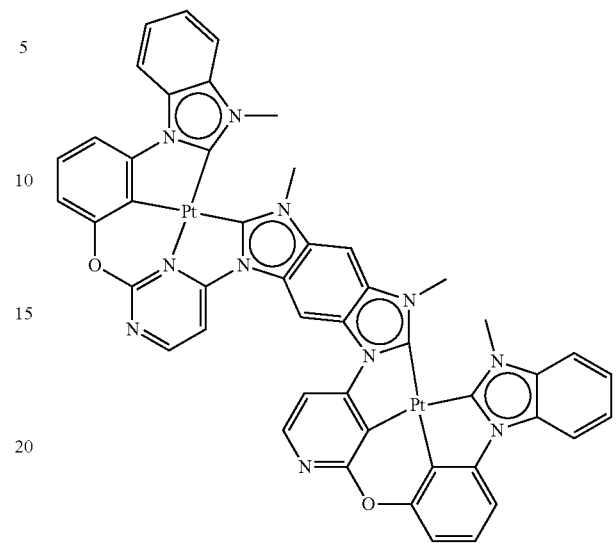
25
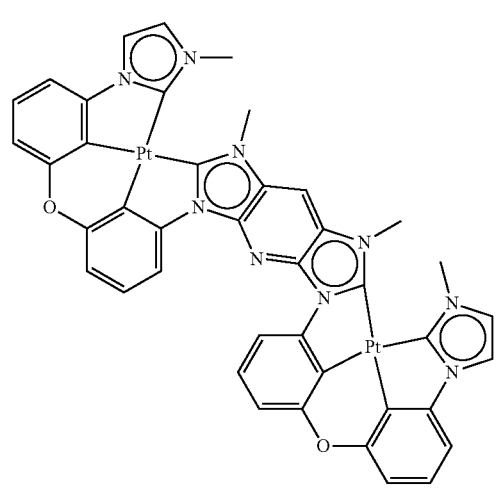
26

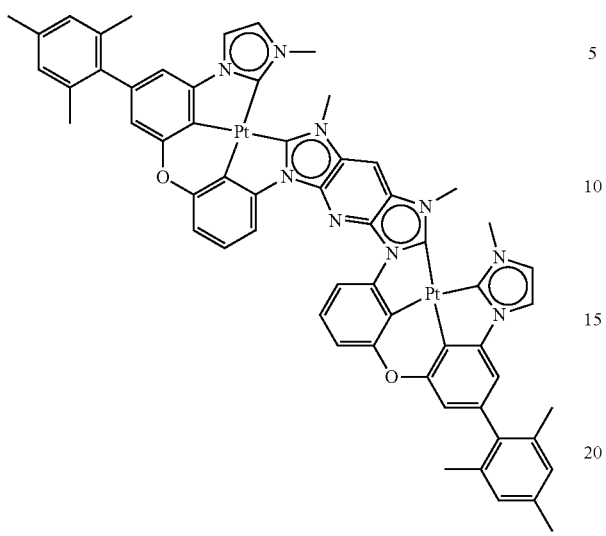
27
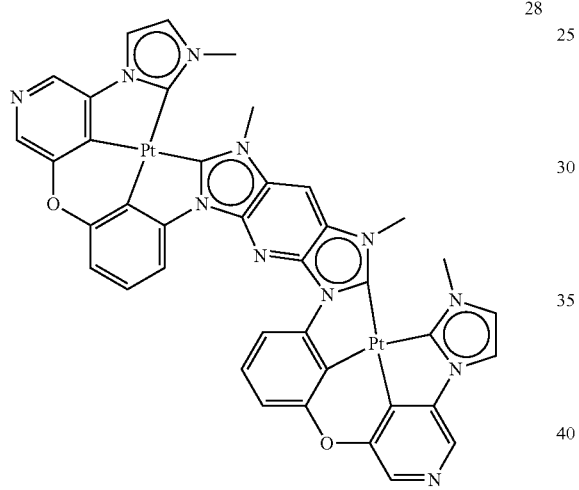
28
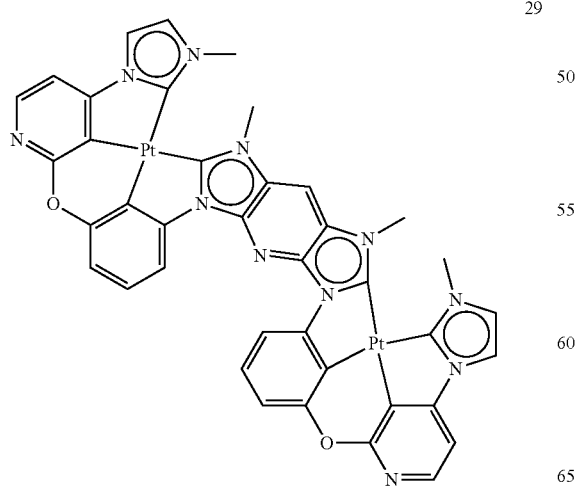
29
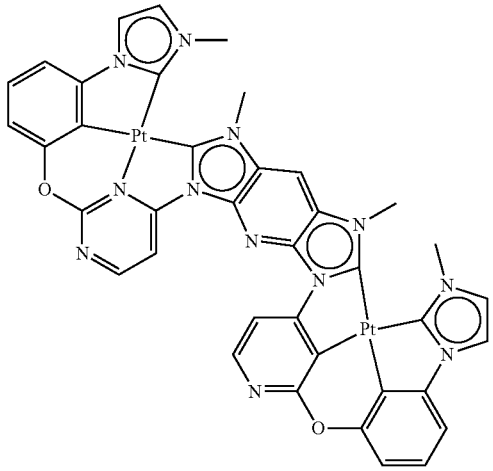
30
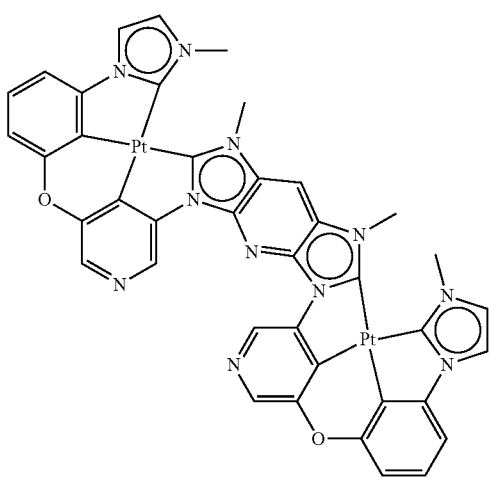
31
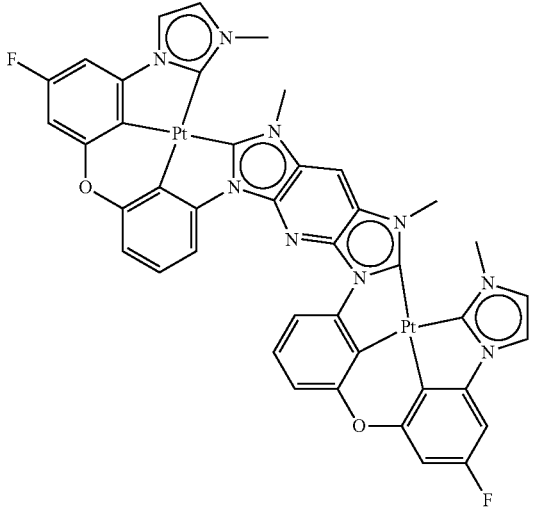
32

33
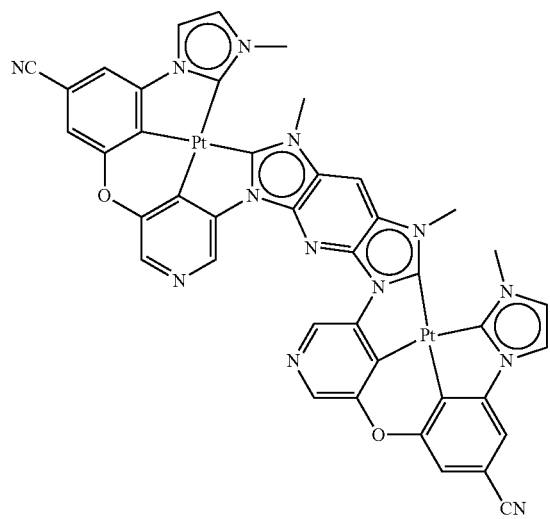
34
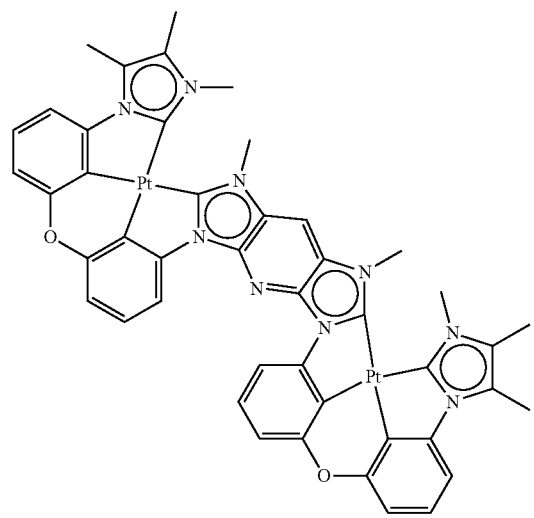
35
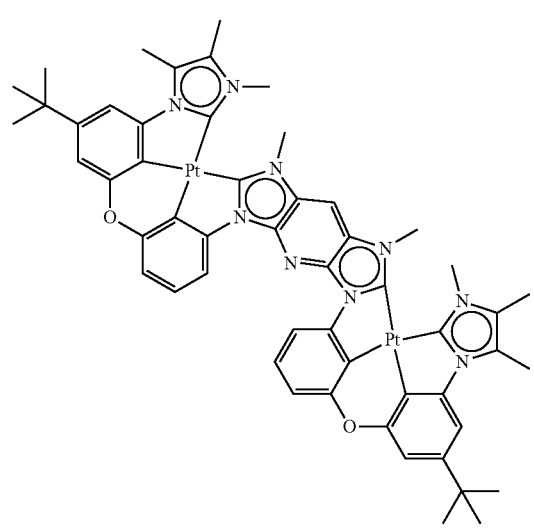
36
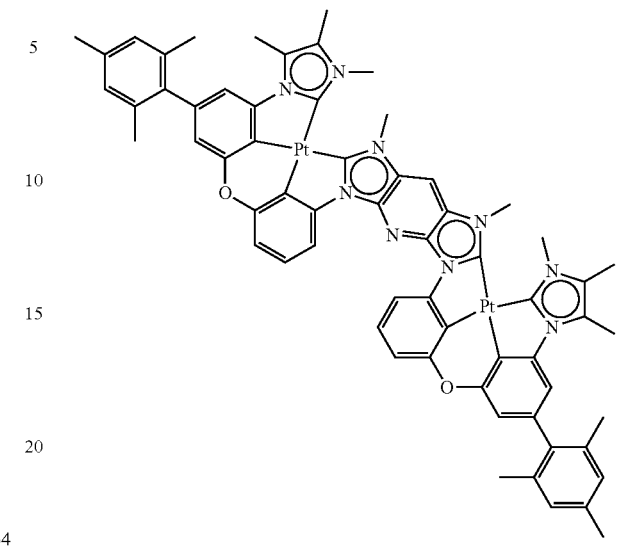
37
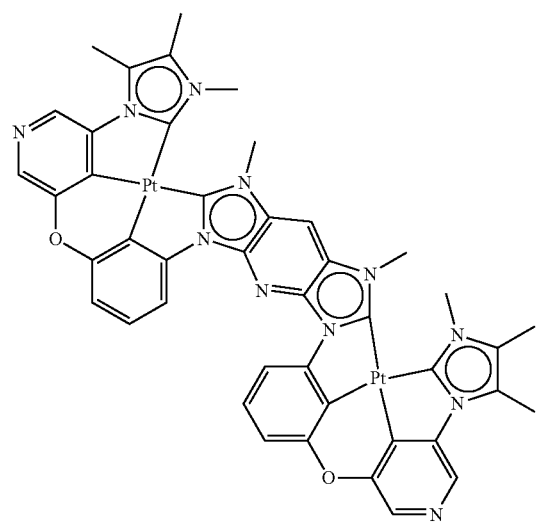
38
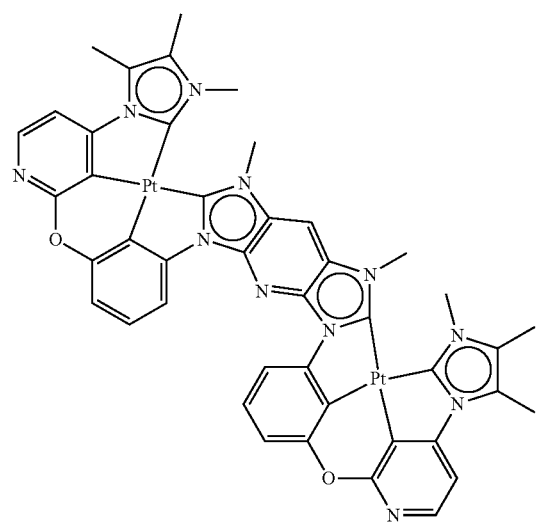

39
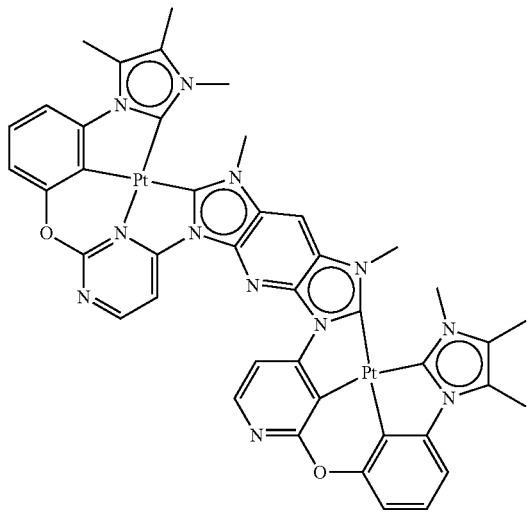
40
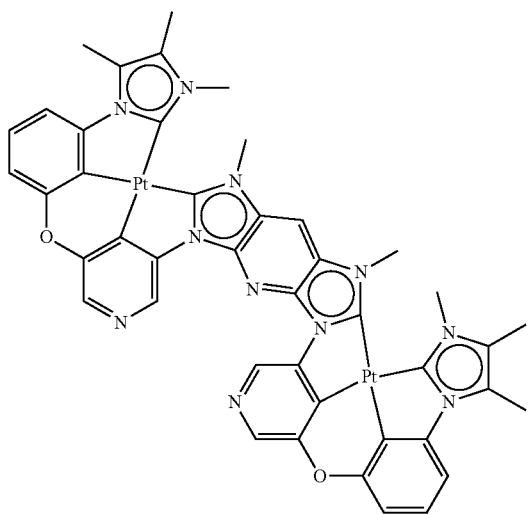
41
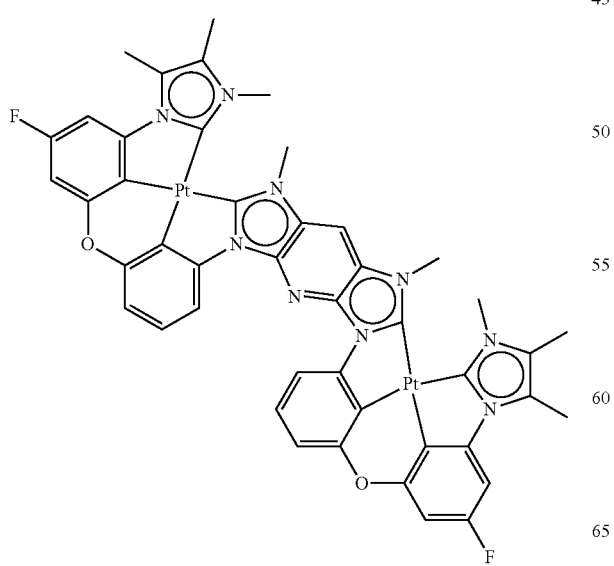
42
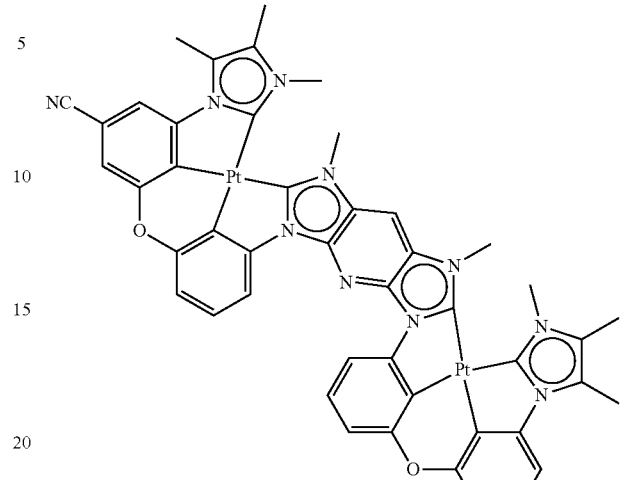
43
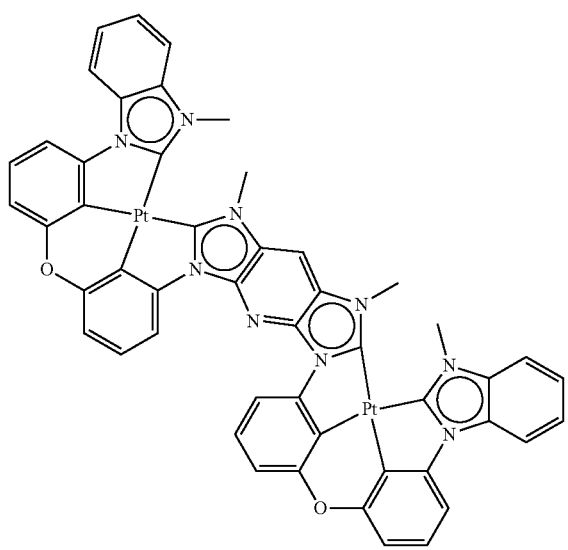

44
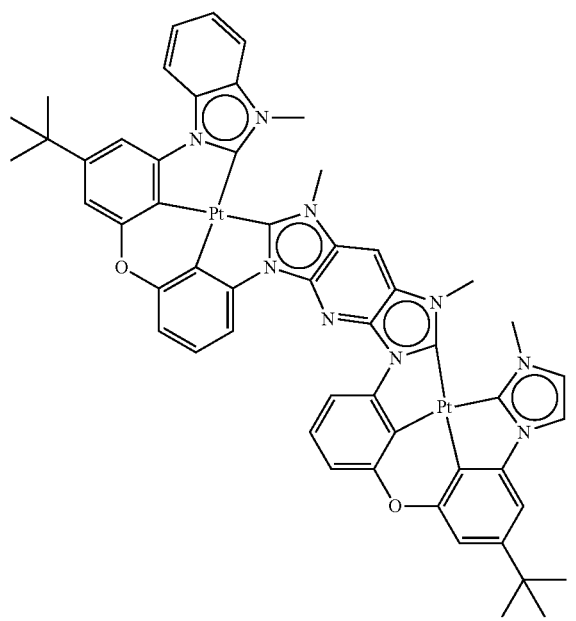
45
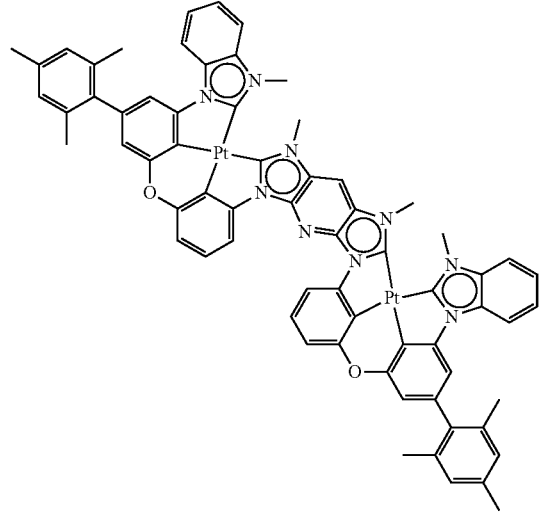
46
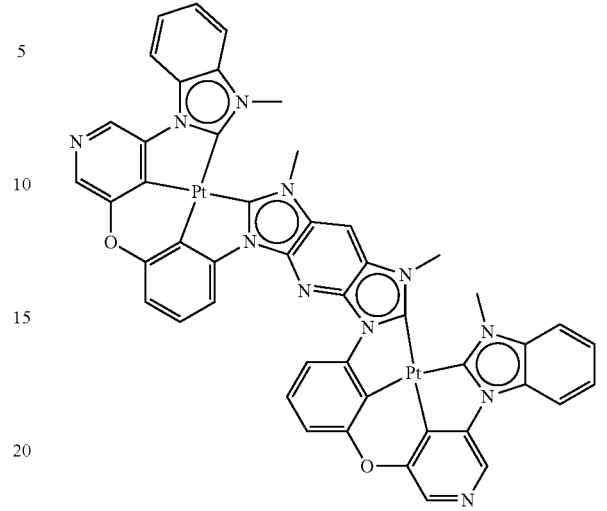
47
48
In the organic electroluminescence device 10 shown in FIGS. 1 to 3, the light emitting layer EML may include a host material and a dopant material. In an embodiment, the light emitting layer EML may include the organometallic complex represented by the chemical formula 1 as the dopant material of the light emitting layer EML.

The organometallic complex according to an embodiment of the inventive concept may be a phosphorescent dopant or a thermally activated delayed fluorescent dopant. The light emitting layer EML may be a layer exhibiting a phosphorescent or thermally-activated-delayed-type light emitting property.

The light emitting layer EML may include one or more organometallic complexes, which are selected from the organometallic complexes in the afore-stated compound group 1. The light emitting layer EML may further include at least one material, in addition to the afore-stated organometallic complex.

In an embodiment, any suitable material may be used as a host material of the light emitting layer EML. For example, the light emitting layer EML may include at least one of DPEPO(Bis[2-(diphenylphosphino)phenyl] ether oxide), CBP(4,4'-Bis(carbazol-9-yl)biphenyl), mCP(1,3-Bis(carbazol-9-yl)benzene), PPF (2,8-Bis(diphenylphosphoryl)dibenzo[b,d]furan), TcTa(4,4',4"-Tris(carbazol-9-yl)-triphenylamine), or TPBi(1,3,5-tris(N-phenylbenzimidazole-2-yl)benzene). Further, in an embodiment, the light emitting layer EML may further include at least one of $Alq_3$(tris(8-hydroxyquinolino)aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2'-dimethyl-biphenyl), MADN(2-Methyl-9,10-bis(naphthalen-2-yl)anthracene), DPEPO(bis[2-(diphenylphosphino)phenyl]ether oxide), CP1(Hexaphenyl cyclotriphosphazene), UGH2 (1,4-Bis(triphenylsilyl)benzene), $DPSiO_3$ (Hexaphenylcyclotrisiloxane), $DPSiO_4$ (Octaphenylcyclotetra siloxane), PPF(2,8-Bis(diphenylphosphoryl)dibenzofuran), or the like as the host material.

In the organic electroluminescence device 10 according to an embodiment, the light emitting layer EML may further include at least one dopant material, in addition to the organometallic complex in the afore-stated embodiment. In an embodiment, the light emitting layer EML may further include styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), or N-(4-((E)-2-(6-((E)-4-(diphenylamino)styryl)naphthalen-2-yl)vinyl)phenyl)-N-phenylbenzenamine (N-BDAVBi), perylene and its derivatives (e.g., 2,5,8,11-Tetra-t-butylperylene (TBP)), pyrene and its derivative (e.g., 1,1-dipyrene, 1,4-dipyrenylbenzene, or 1,4-Bis(N, N-Diphenylamino)pyrene), as the dopant material.

In the organic electroluminescence device 10 shown in FIGS. 1 to 3, the electron transport region ETR may be provided on the light emitting layer EML. The electron transport region ETR may include at least one of the hole blocking layer HBL, the electron transport layer ETL, and the electron injection layer EIL.

The electron transport region ETR may have a single-layered structure made of a single material, a single-layered structure made of different materials, or a multi-layered structure including layers made of different materials.

For example, the electron transport region ETR may have a single-layered structure of the electron injection layer EIL or the electron transport layer ETL or may have a single-layered structure made of an electron injection material and an electron transport material. In addition, the electron transport region ETR may have a single-layered structure, which is made of different materials, or may have a structure of the electron transport layer ETL/the electron injection layer EIL or of the hole blocking layer HBL/the electron transport layer ETL/the electron injection layer EIL, which are sequentially stacked from the emission layer EML. A thickness of the electron transport region ETR may range from, for example, about 1000 Å to about 1500 Å.

The electron transport region ETR may be formed by at least one of various methods, such as a vacuum deposition method, a spin coating method, a cast method, a Langmuir-Blodgett (LB) method, an inkjet printing method, a laser printing method, and a laser-induced thermal imaging (LITI) method.

In the case where the electron transport region ETR includes the electron transport layer ETL, the electron transport region ETR may include at least one of anthracene-based compounds. Further, in an embodiment, the electron transport region ETR may include for example, at least one of $Alq_3$(Tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), $Bebq_2$(berylliumbis(benzoquinolin-10-olate), ADN(9,10-di(naphthalene-2-yl)anthracene), or mixtures thereof. A thickness of the electron transport layer ETL may range from about 1001 to about 10001, in particular, from about 150 Å to about 500 Å. In the case where the thickness of the electron transport layer ETL is within such a range, it may be possible to obtain a satisfactory electron transport property, without a substantial increase in driving voltage.

In the case where the electron transport region ETR includes the electron injection layer EIL, metal halides, e.g., LiF, NaCl, CsF, RbCl, and RbI, lanthanide metals, e.g., Yb, metal oxides, e.g., Li2O and BaO, or LiQ (Lithium quinolate) may be used for the electron transport region ETR. In an embodiment, the electron injection layer EIL may be formed of a material, in which an electron transport material and an insulating organo metal salt are mixed. The organo metal salt may be a material whose energy band gap is about 4 eV or higher. In detail, for example, the organo metal salt may include metal acetate, metal benzoate, metal acetoacetate, metal acetylacetonate, or metal stearate. A thickness of the electron injection layer EIL may range from about 1 Å to about 100 Å or range from about 3 Å to about 901. In the case where the thickness of the electron injection layer EIL is within such a range, it may be possible to obtain a satisfactory electron injection property, without a substantial increase in driving voltage.

As described above, the electron transport region ETR may include the hole blocking layer HBL. The hole blocking layer HBL may include at least one of, for example, BCP (2,9-dimethyl-4,7-diphenyl-1,10-phenanthroline) or Bphen (4,7-diphenyl-1,10-phenanthroline).

The second electrode EL2 may be provided on the electron transport region ETR. The second electrode EL2 may be a common electrode or a cathode. The second electrode EL2 may be a transparent electrode, a transflective electrode, or a reflective electrode. If the second electrode EL2 is the transparent electrode, the second electrode EL2 may be formed of a transparent metal oxide, e.g., indium tin oxide (ITO), indium zinc oxide (IZO), zinc oxide (ZnO), or indium tin zinc oxide (ITZO).

If the second electrode EL2 is the transflective or reflective electrode, the second electrode EL2 may be formed of or include at least one of Ag, Mg, Cu, Al, Pt, Pd, Au, Ni, Nd, Ir, Cr, Li, Ca, LiF/Ca, LiF/Al, Mo, Ti, compounds thereof, or mixtures thereof, e.g., a mixture of Ag and Mg. Alternatively, the second electrode EL2 may be a multi-layered structure including a reflective or transflective layer, e.g., of the above material, and a transparent conductive layer, e.g., of indium tin oxide (ITO), indium zinc oxide (IZO), zinc oxide (ZnO), or indium tin zinc oxide (ITZO).

Although not shown, the second electrode EL2 may be connected to an auxiliary electrode. If the second electrode EL2 is connected to the auxiliary electrode, the resistance of the second electrode EL2 may be decreased.

Although not illustrated in the drawings, a capping layer (not shown) may be further disposed on the second electrode EL2 of the organic electroluminescence device 10 according to an embodiment. The capping layer (not shown) may include, for example, α-NPD, NPB, TPD, m-MTDATA, Alq3, CuPc, TPD15(N4,N4,N4',N4'-tetra (biphenyl-4-yl) biphenyl-4,4'-diamine), TCTA(4,4',4"-Tris (carbazol sol-9-yl) triphenylamine), N, N'-bis (naphthalen-1-yl), or the like.

In the organic electroluminescence device 10 according to an embodiment of the inventive concept, the afore-stated organometallic complex may be included in at least one organic layer, which is disposed between the first electrode EL1 and the second electrode EL2, or a capping layer (not shown), which is disposed on the second electrode EL2.

In the organic electroluminescence device 10, if voltages are applied to the first electrode EL1 and the second electrode EL2, holes injected from the first electrode EL1 may be moved into the light-emitting layer EML through the hole transport region HTR, and electrons injected from the second electrode EL2 may be moved into the light-emitting layer EML through the electron transport region ETR. In the light-emitting layer EML, the electrons and the holes may recombine with each other, thereby producing excitons. When the exciton makes a transition from an excited state to a ground state, light may be emitted from the light-emitting layer EML.

In the afore-stated explanation of the organic electroluminescence device 10, embodiments, in which the organometallic complex is included in the light emitting layer EML, have been mainly described. The organometallic complex may be included in at least one layer of other organic layers or the capping layer (not shown) provided on the second electrode EL2. For example, a metal complex may be included in the hole transport region and the electron transport region.

In the organic electroluminescence device according to an embodiment of the inventive concept, the organometallic complex of the light emitting layer may have a stable structure, in which the first metal complex and the second metal complex are connected to each other with an aromatic ring. Thus, even under a low driving voltage, the light emitting layer may exhibit an improved light-emitting efficiency property, compared with a light emitting layer, in which an organometallic complex including only one metal complex is used. In particular, since the organic electroluminescence device according to an embodiment of the inventive concept includes the stable structure of the organometallic complex, in which the first and second metal complexes are connected to each other with the aromatic ring group, the organic electroluminescence device may exhibit a long lifetime property. In addition, since the organometallic complex according to an embodiment of the inventive concept includes the first metal complex, the second metal complex, and the aromatic ring group connecting the first and second metal complexes to each other, the organometallic complex may have a stable structure. Thus, the organometallic complex according to an embodiment of the inventive concept may be used to extend the lifetime property of the organic electroluminescence device.

Hereinafter, example and comparative embodiments will be described to explain an organometallic complex according to an embodiment of the inventive concept and an organic electroluminescence device, in which the organometallic complex is used. The embodiments to be described below may be some examples, which are presented to provide better understanding of the inventive concept.

Embodiments

1. Synthesis of Organometallic Complex

For example, an organometallic complex according to an embodiment of the inventive concept may be synthesized by the following method.

1) An Example of Synthesis of Compound 1

[Reaction formula 1]

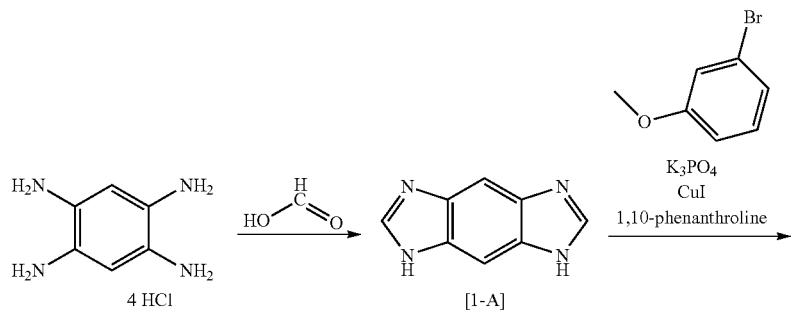

-continued
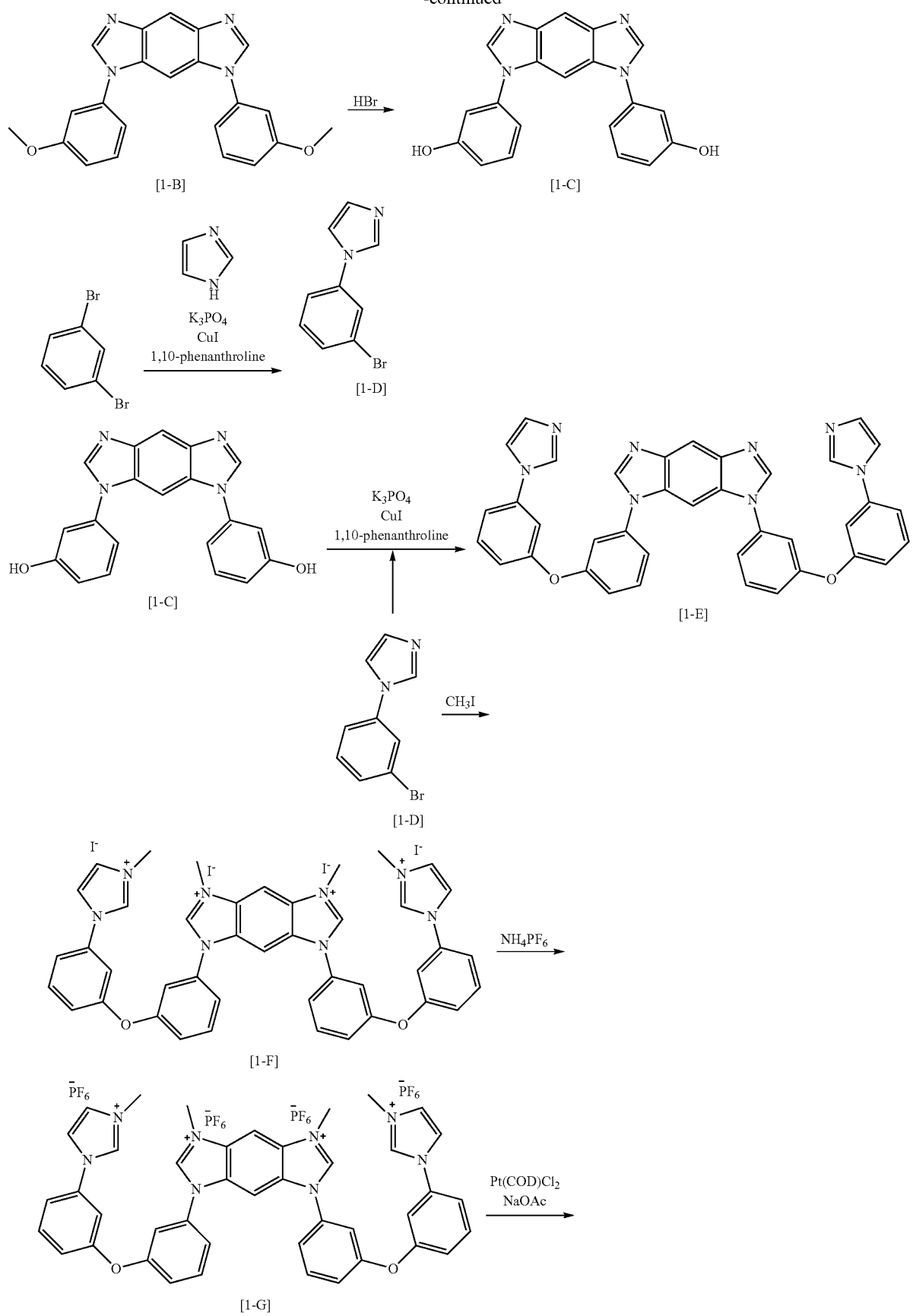

-continued

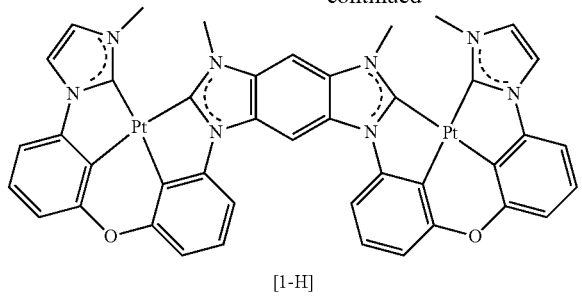

[1-H]

(1) Synthesis of Intermediate Compound [1-A]

1,2,4,5-Benzenetetramine, hydrochloride (1:4), and formic acid (0.1)M were placed in a reaction vessel and were stirred at 110° C. for 24 hours. After completion of the reaction, the mixture was cooled down to a room temperature, was neutralized, was cooled down, and was extracted with distilled water and ethyl acetate. The extracted organic layer was washed with saturated NaCl aqueous solution and was dried with magnesium sulfate. A target compound was obtained by separating a residue, from which solvent was removed, using column chromatography (yield 80%).

(2) Synthesis of Intermediate Compound [1-B]

3-bromoanisole(2.6 eq), the [1-A] intermediate compound (1.0 eq), $K_3PO_4$(4.0 eq), CuI (0.2 eq), and 1,10-phenanthroline(0.2 eq) were placed in a reaction vessel and were suspended in DMF (0.25M). The reaction mixture was heated and was stirred at 160° C. for 24 hours. After completion of the reaction, it was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 66%).

(3) Synthesis of Intermediate Compound [1-C]

The [1-B] material was suspended in a large amount of HBr solution. The reaction mixture was heated and was stirred at 110° C. for 24 hours. After completion of the reaction, the resulting material was cooled at the room temperature and was added with a large amount of distilled water, and this solution was neutralized with sodium hydroxide aqueous solution and ammonium chloride. Deposited solid was filtered, was dissolved in acetone, and was dried with magnesium sulfate, and then, a target compound was obtained by removing solvent (yield 90%).

(4) Synthesis of Intermediate Compound [1-D]

1,3-dibromobenzene (1.0 eq), imidazole (1.3 eq), $K_3PO_4$ (2.0 eq), CuI (0.1 eq), and 1,10-phenanthroline (0.1 eq) were placed in a reaction vessel and were suspended in DMF (0.25M). The reaction mixture was heated and was stirred at 160° C. for 24 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 75%).

(5) Synthesis of Intermediate Compound [1-E]

The [1-C] intermediate compound (1.0 eq), the [1-D] intermediate compound (2.6 eq), $K_3PO_4$(4.0 eq), CuI (0.2 eq), and 1,10-phenanthroline (0.2 eq) were placed in a reaction vessel and were suspended in DMF (0.25M). The reaction mixture was heated and was stirred at 160° C. for 24 hours. After completion of the reaction, the resulting material was cooled down to the room temperature and was extracted with distilled water and ethyl acetate. The extracted organic layer was washed with saturated NaCl aqueous solution and was dried with magnesium sulfate. A target compound was obtained by separating a residue, from which solvent was removed, using column chromatography (yield 58%).

(6) Synthesis of Intermediate Compound [1-F]

The [1-E] intermediate compound (1.0 eq) and iodomethane (40.0 eq) were placed in a reaction vessel and were suspended in toluene (0.1M). The reaction mixture was heated and was stirred at 110° C. for 24 hours. After completion of the reaction, the resulting material was cooled down to the room temperature and was extracted with distilled water and ethyl acetate. An extracted organic layer was dried with magnesium sulfate, and then, a target compound was obtained by removing solvent (yield 91%).

(7) Synthesis of Intermediate Compound [1-G]

The [1-F] intermediate compound (1.0 eq) was placed in a reaction vessel and were suspended in a mixture solution, in which methanol and distilled water were contained with a ratio of 1:1. Ammonium hexafluorophosphate (1.1 eq) was slowly added in the resulting solution, in which the [1-F] material was sufficiently dissolved, and then, the reaction solution was stirred at the room temperature for 24 hours. After completion of the reaction, a produced solid was filtered and was washed with diethyl ether. A target compound was obtained by drying the washed solid (yield 88%).

(8) Synthesis of Compound 1

The [1-G] intermediate compound (1.0 eq), dichloro(1,5-cyclooctadiene)platinum (1.05 eq), and sodium acetate (3.0 eq) were suspended in 1,4-dioxane(0.1M). The reaction mixture was heated and was stirred at 120° C. for 72 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 34%).

2) An Example of Synthesis of Compound 25

[Reaction formula 2]
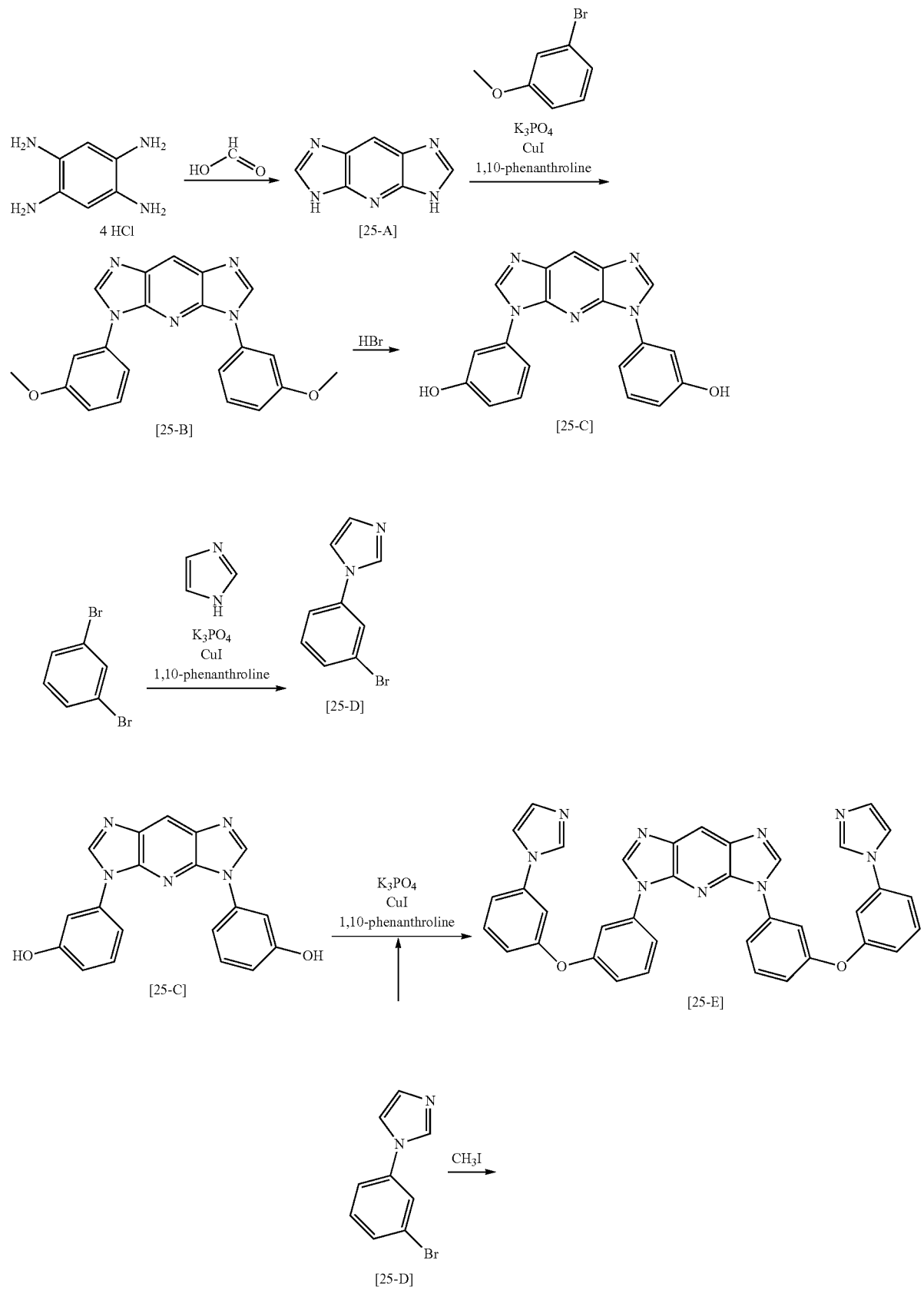

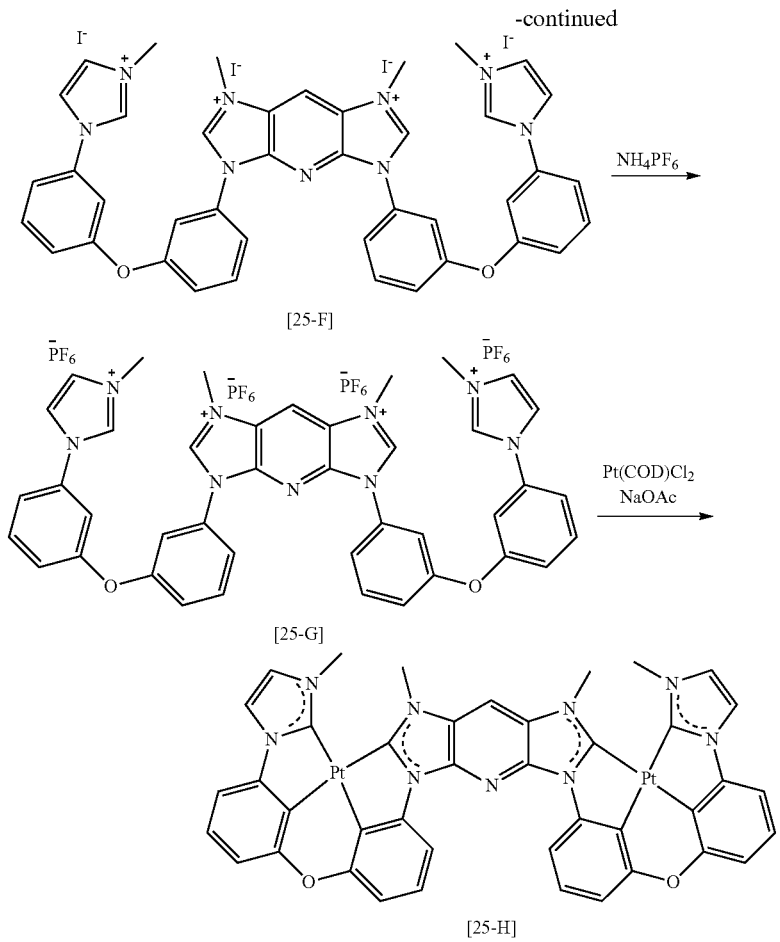

[25-F]

[25-G]

[25-H]

(1) Synthesis of Intermediate Compound [25-A]

Except for the use of 2,3,5,6-Pyridinetetramine hydrochloride, and hydrate (1:3:1), instead of 1,2,4,5-Benzenetetramine and hydrochloride (1:4), a target compound was obtained using the same synthesis method as that for the intermediate compound [1-A] (yield 62%).

(2) Synthesis of Intermediate Compound [25-B]

3-bromoanisole (2.6 eq), the [25-A] intermediate compound (1.0 eq), $K_3PO_4$ (4.0 eq), CuI (0.2 eq), and 1,10-phenanthroline (0.2 eq) were placed in a reaction vessel and were suspended in DMF (0.25M). The reaction mixture was heated and was stirred at 160° C. for 24 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 58%).

(3) Synthesis of Intermediate Compound [25-C]

The [25-B] Material was Suspended in a Large Amount of HBr Solution. The Reaction mixture was heated and was stirred at 110° C. for 24 hours. After completion of the reaction, the resulting material was cooled down to the room temperature and was added with a large amount of distilled water, and then, this solution was neutralized with sodium hydroxide aqueous solution and ammonium chloride. Deposited solid was filtered, was dissolved in acetone, and was dried with magnesium sulfate, and then, a target compound was obtained by removing solvent (yield 87%).

(4) Synthesis of Intermediate Compound [25-D]

A target compound was obtained using the same synthesis method as that for the intermediate compound [1-D] (yield 78%).

(5) Synthesis of Intermediate Compound [25-E]

The [25-C] intermediate compound (1.0 eq), the [25-D] intermediate compound (2.6 eq), $K_3PO_4$ (4.0 eq), CuI (0.2 eq), and 1,10-phenanthroline (0.2 eq) were placed in a reaction vessel and were suspended in DMF (0.25M). The reaction mixture was heated and was stirred at 160° C. for 24 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 61%).

(6) Synthesis of Intermediate Compound [25-F]

The [25-E] intermediate compound (1.0 eq) and iodomethane (40.0 eq) were placed in a reaction vessel and were suspended in toluene (0.1M). The reaction mixture was heated and was stirred at 110° C. for 24 hours. After completion of the reaction, the resulting material was cooled down to the room temperature and was extracted with distilled water and ethyl acetate. An extracted organic layer was dried with magnesium sulfate, and then, a target compound was obtained by removing solvent (yield 93%).

(7) Synthesis of Intermediate Compound [25-G]

The [25-F] intermediate compound (1.0 eq) was placed in a reaction vessel and were suspended in a mixture solution, in which methanol and distilled water were contained with a ratio of 1:1. Ammonium hexafluorophosphate (1.1 eq) was slowly added in the resulting solution, in which the [25-F] material was sufficiently dissolved, and then, the reaction solution was stirred at the room temperature for 24 hours. After completion of the reaction, a produced solid was filtered and was washed with diethyl ether. A target compound was obtained by drying the washed solid (yield 83%).

(8) Synthesis of Compound 25

The [25-G] intermediate compound (1.0 eq), dichloro(1, 5-cyclooctadiene)platinum (1.05 eq), and sodium acetate (3.0 eq) were suspended in 1,4-dioxane (0.1M). The reaction mixture was heated and was stirred at 120° C. for 72 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 30%).

3) An Example of Synthesis of Compound 33

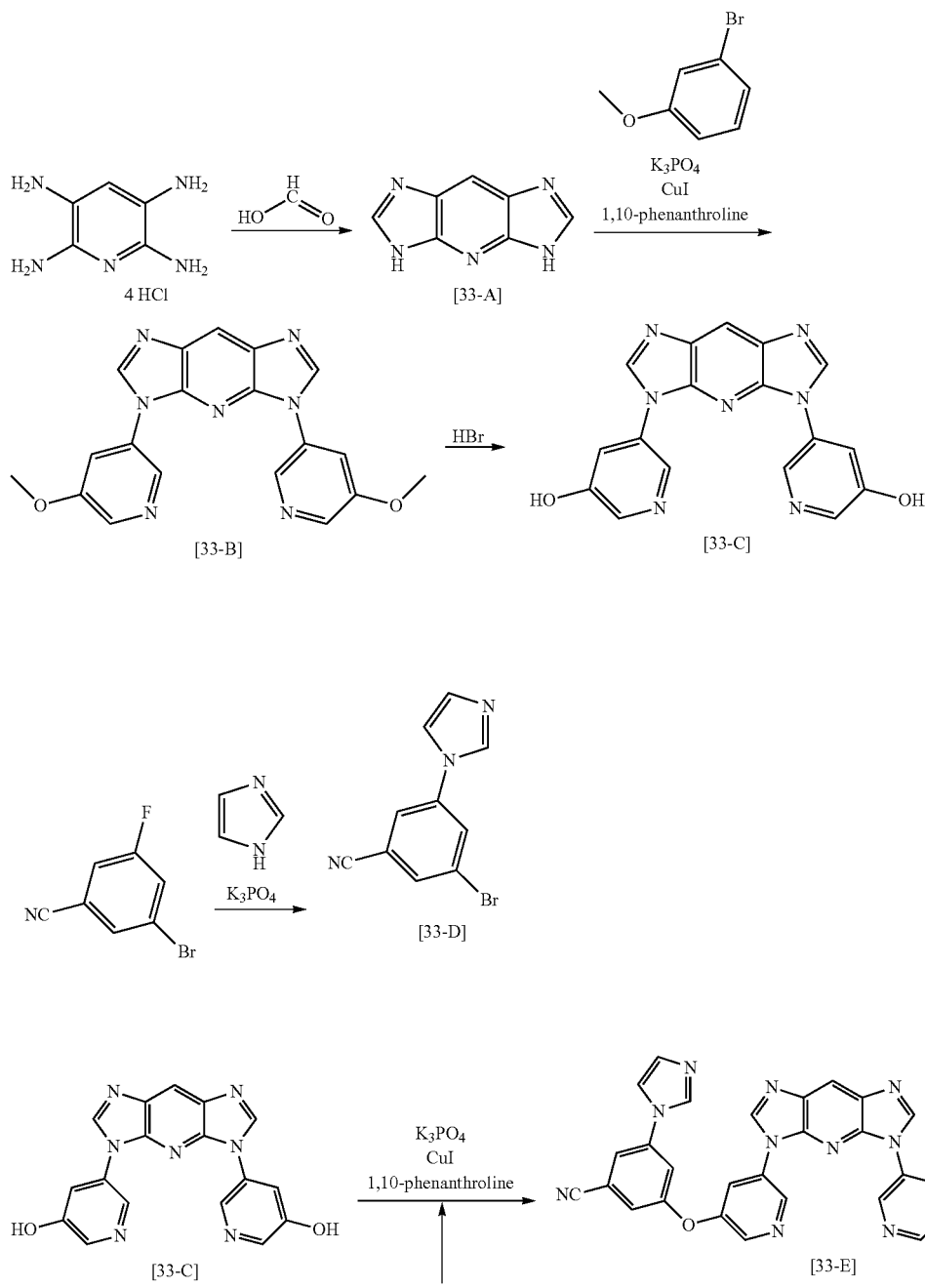

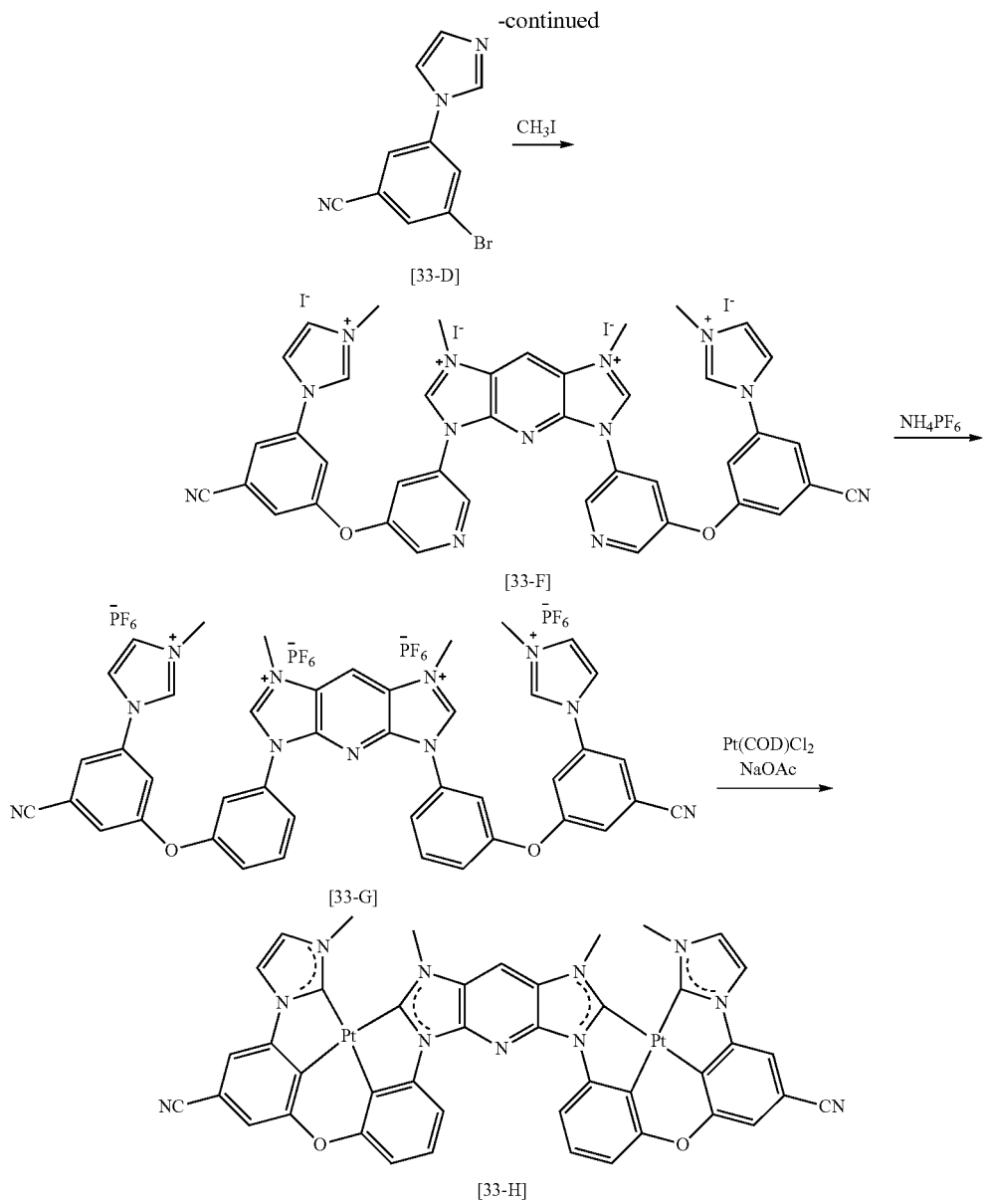

(1) Synthesis of Intermediate Compound [33-A]

A target compound was obtained using the same synthesis method as that for the intermediate compound [25-A].

(2) Synthesis of Intermediate Compound [33-B]

3-bromo-5-methoxypyridine (2.6 eq), the [25-A] intermediate compound (1.0 eq), $K_3PO_4$ (4.0 eq), CuI (0.2 eq), and 1,10-phenanthroline (0.2 eq) were placed in a reaction vessel and were suspended in DMF (0.25M). The reaction mixture was heated and was stirred at 160° C. for 24 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 60%).

(3) Synthesis of Intermediate Compound [33-C]

The [33-B] material was suspended in a large amount of HBr solution. The reaction mixture was heated and was stirred at 110° C. for 24 hours. After completion of the reaction, the resulting material was cooled at the room temperature and was added with a large amount of distilled water, and this solution was neutralized with sodium hydroxide aqueous solution and ammonium chloride. Deposited solid was filtered, was dissolved in acetone, and was dried with magnesium sulfate, and then, a target compound was obtained by removing solvent (yield 89%).

(4) Synthesis of Intermediate Compound [33-D]

3-bromo-5-fluorobenzonitrile (1.0 eq), imidazole (1.3 eq), and $K_3PO_4$ (2.0 eq) were placed in a reaction vessel and were suspended in DMF (0.25M). The reaction mixture was heated and was stirred at 160° C. for 24 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 62%).

(5) Synthesis of Intermediate Compound [33-E]

The [33-C] intermediate compound (1.0 eq), the [33-D] intermediate compound (3.3 eq), K₃PO₄ (4.0 eq), CuI (0.2 eq), and 1,10-phenanthroline (0.2 eq) were placed in reaction vessel and were suspended in DMF(0.25M). The reaction mixture was heated and was stirred at 160° C. for 24 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 60%).

(6) Synthesis of Intermediate Compound [33-F]

The [33-E] intermediate compound (1.0 eq) and iodomethane (40.0 eq) were placed in a reaction vessel and were suspended in toluene (0.1M). The reaction mixture was heated and was stirred at 110° C. for 24 hours. After completion of the reaction, the resulting material was cooled down to the room temperature and was extracted with distilled water and ethyl acetate. An extracted organic layer was dried with magnesium sulfate, and then, a target compound was obtained by removing solvent (yield 90%).

(7) Synthesis of Intermediate Compound [33-G]

The [33-F] (1.0 eq) was placed in a reaction vessel and were suspended in a mixture solution, in which methanol and distilled water were contained with a ratio of 1:1. Ammonium hexafluorophosphate (1.1 eq) was slowly added in the resulting solution, in which the [33-F] material was sufficiently dissolved, and then, the reaction solution was stirred at the room temperature for 24 hours. After completion of the reaction, a produced solid was filtered and was washed with diethyl ether. A target compound was obtained by drying the washed solid (yield 78%).

(8) Synthesis of Compound 33

The [33-G] intermediate compound (1.0 eq), dichloro(1, 5-cyclooctadiene)platinum (1.05 eq), and sodium acetate (3.0 eq) were suspended in 1,4-dioxane (0.1M). The reaction mixture was heated and was stirred at 120° C. for 72 hours. After completion of the reaction, the resulting material was cooled down to the room temperature and was extracted with distilled water and ethyl acetate. An extracted organic layer was washed with saturated NaCl aqueous solution and was dried with magnesium sulfate. A target compound was obtained by separating a residue, from which solvent was removed, using column chromatography (yield 37%).

The following table 1 shows ¹H NMR and MS/FAB characteristics of the synthesized compounds.

2. Calculation of Energy Level of Organometallic Complex

The following table 2 shows T1 level, emission wavelength, and Metal-to-Ligand-Charge-Transfer (MLCT) ratio characteristics, measured from the Example compounds 1, 25, and 33 and the comparative compounds A and B.

[Example Compounds]

1

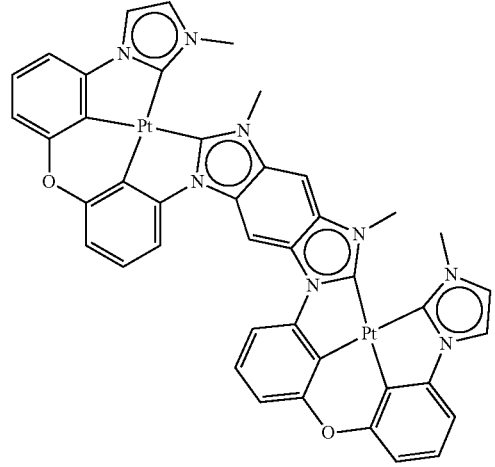

25

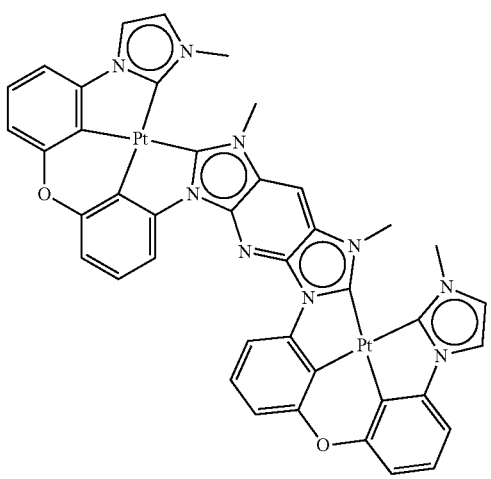

TABLE 1

| Compound number | 1H NMR (CDCl3, 400 MHz) | MS/FAB Found | Calc. |
|---|---|---|---|
| Compound 1 | 6.91(m, 2H), 6.75(m, 2H), 6.58(m, 2H), 6.31(m, 2H), 6.22(m, 2H), 6.05(s, 1H), 6.00(m, 2H), 5.86(m, 2H), 5.84(m, 2H), 5.76(s, 1H), 3.28(m, 6H), 2.98(m, 6H) | 1068.18 | 1067.17 |
| Compound 25 | 6.91(m, 2H), 6.90(m, 2H), 6.74(m, 2H), 6.68(m, 2H), 6.23(m, 2H), 6.22(m, 2H), 6.10(s, 1H), 6.86(m, 2H), 5.84(m, 2H), 5.79(m, 2H), 3.36(m, 6H), 2.98(m, 6H) | 1069.91 | 1068.17 |
| Compound 33 | 7.75(s, 2H), 7.59(s, 2H), 7.48(s, 2H), 7.43(s, 2H), 6.22(s, 1H), 5.87(m, 2H), 5.80(m, 2H), 3.43(m, 6H), 3.00(m, 6H) | 1119.93 | 1118.15 |

-continued

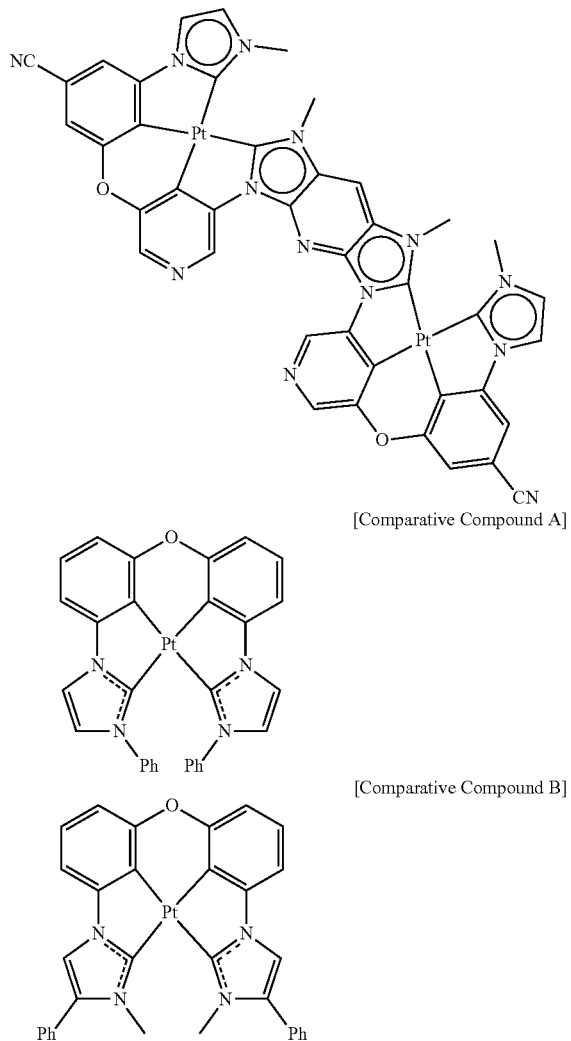

[Comparative Compound A]

[Comparative Compound B]

TABLE 2

| Compound number | T1 (eV) | Emission wavelength(nm) | MLCT ratio |
|---|---|---|---|
| Example compound 1 | 2.31 | 537 | 14.52% |
| Example compound 25 | 2.32 | 534 | 13.30% |

TABLE 2-continued

| Compound number | T1 (eV) | Emission wavelength(nm) | MLCT ratio |
|---|---|---|---|
| Example compound 33 | 2.53 | 492 | 16.11% |
| Comparative compound A | 2.53 | 490 | 9.82% |
| Comparative compound B | 2.67 | 465 | 10.8% |

The table 2 shows that the Example compounds 1, 25, and 33 had relatively low levels of T1 and high MLCT ratios, compared with the comparative compounds A and B. Thus, in the case where the Example compound 1, 25, or 33 is used for a light-emitting device, it is expected that the device has a long lifetime and high light-emitting efficiency.

3. Fabrication and Evaluation of an Organic Electroluminescence Device Including an Organometallic Complex (The Fabrication of the Organic Electroluminescence Device)

An organic electroluminescence device, in which an organometallic complex according to an embodiment of the inventive concept is used as a light emitting layer, was fabricated by the following method.

A substrate, on which ITO/Ag/ITO serving as an anode were deposited, was cut to have a size of 50 mm×50 mm×0.7 mm, was cleaned with an ultrasonic wave for each 5 minutes using isopropyl alcohol and distilled water, and was irradiated with an ultraviolet light for 30 minutes, was exposed and cleaned to ozone, and then, the ITO substrate was disposed in a vacuum deposition apparatus.

A compound 2-TNATA was vacuum-deposited to form a 60 nm-thick hole injection layer on the ITO substrate, and then, NPB was vacuum-deposited on the hole injection layer to form a 30 nm-thick hole transport layer.

A mixture host, in which a weight ratio of ETH2:HTH2 was 5:5, along with the Example Compound or Comparative Compound as dopants of 10 wt %, were simultaneously deposited on the hole transport layer to form a 30 nm-thick light emitting layer. Next, ETH2 was vacuum-deposited to a thickness of 5 nm to form a hole blocking layer. Thereafter, a 30 nm-thick Alq$_3$ layer serving as an electron transport layer was deposited on the hole blocking layer, a 1 nm-thick LiF (alkali metal halide) layer serving as an electron injection layer was deposited on this electron transport layer, and then, a 300 nm-thick Al layer was vacuum-deposited to form a LiF/Al cathode electrode. The organic light emitting device according to an embodiment of the inventive concept was fabricated by the above method.

(Evaluation of Characteristics of Organic Electroluminescence Device)

TABLE 3

| Fabricated Devices | Light emitting layer material | Driving voltage (V) | Current density (ma/cm$^2$) | Brightness (cd/m$^2$) | Efficiency (cd/A) | Emission wavelength (nm) | Lifetime LT80 (h) |
|---|---|---|---|---|---|---|---|
| Example 1 | Example compound 1 | 5.84 | 50 | 3976 | 8.25 | 533 | 390 |
| Example 2 | Example compound 25 | 6.02 | 50 | 3840 | 8.02 | 530 | 378 |
| Example 3 | Example compound 33 | 5.52 | 50 | 4105 | 8.19 | 494 | 402 |
| Comparative example 1 | Comparative compound a | 6.56 | 50 | 3870 | 7.74 | 490 | 357 |
| Comparative example 2 | Comparative compound b | 5.65 | 50 | 3675 | 7.34 | 465 | 365 |

The table 3 shows that light-emitting devices according to the embodiments 1 to 3 had high efficiency and long lifetime, compared with the comparative embodiments 1 and 2.

In the embodiments 1 to 3, a first metal complex and a second metal complex, whose center metals are Pt, were connected to each other by a benzene ring. The embodiments 1 to 3, in which two metal complexes are connected to each other by the aromatic ring, may have a stable structure, compared with the comparative embodiments 1 and 2 having only one metal complex. Thus, the light-emitting devices according to the embodiments 1 to 3 may have high efficiency and long lifetime characteristics.

The organometallic complexes according to the comparative embodiments 1 and 2 have two substituted or unsubstituted imidazolyl groups coupled to a metal atom Pt, and two benzene rings coupled to a metal atom, but have one metal complex. Thus, the organometallic complexes according to the comparative embodiments 1 and 2 may have low light-emitting efficiency and short device lifetime, compared with the Example compounds.

The organic light emitting device according to an embodiment of the inventive concept includes an organometallic complex, in which a first metal complex having a metal atom as a center atom of the first metal complex, a second metal complex having a metal atom as a center atom of the second metal complex, and an aromatic ring group connecting the first metal complex and the second metal complex are included. The results show that the organic light emitting device including the organometallic complex has a stable structure and consequently has long lifetime characteristics and excellent efficiency property.

According to an embodiment of the inventive concept, an organic electroluminescence device may have high efficiency and a long lifetime property.

An organometallic complex according to an embodiment of the inventive concept may be used for a light emitting layer of an organic electroluminescence device and may contribute to high efficiency and lifetime of the organic electroluminescence device.

While an embodiment of the inventive concepts has been particularly shown and described, it will be understood by one of ordinary skill in the art that variations in form and detail may be made therein without departing from the spirit and scope of the attached claims.

What is claimed is:

1. An organic electroluminescence device, comprising:
   first electrode;
   a second electrode opposite to the first electrode; and
   organic layers disposed between the first electrode and the second electrode,
   wherein at least one of the organic layers is an organometallic complex including a first metal complex having a metal atom as a center atom of the first metal complex, a second metal complex having the metal atom as a center atom of the second metal complex, and an aromatic ring group connecting the first metal complex to the second metal complex.

2. The organic electroluminescence device of claim 1, wherein the first metal complex and the second metal complex are the same as each other.

3. The organic electroluminescence device of claim 1, wherein the metal atom is Pt, Pd, Cu, Ag, Au, Rh, Ir, Ru, or Os.

4. The organic electroluminescence device of claim 1, wherein the aromatic ring group is an aryl group or a hetero aryl group.

5. The organic electroluminescence device of claim 1, wherein the first metal complex and the second metal complex each independently further comprise:
   a substituted or unsubstituted imidazolyl group bonded to the metal atom; and
   a substituted or unsubstituted aryl group or a substituted or unsubstituted hetero aryl group bonded to the metal atom.

6. The organic electroluminescence device of claim 1, wherein the organic layers comprise a hole transport region, a light emitting layer, and an electron transport region, and
   the organometallic complex is included in the light emitting layer.

7. The organic electroluminescence device of claim 1, wherein the organometallic complex is represented by the following chemical formula 1:

[Chemical formula 1]

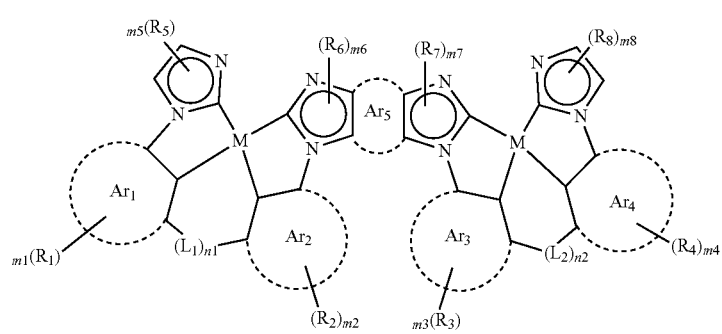

in the chemical formula 1,

M is Pt, Pd, Cu, Ag, Au, Rh, Ir, Ru, or Os, $Ar_1$, $Ar_2$, $Ar_3$, $Ar_4$, and $Ar_5$ are each independently a substituted or unsubstituted aryl group having 6 to 60 ring-forming carbon atoms or a substituted or unsubstituted hetero aryl group having 2 to 60 ring-forming carbon atoms, $L_1$ and $L_2$ are each independently selected from a direct linkage, *—O—*, *—S—*, *—$C(R_{11})(R_{12})$—*, *—$C(R_{13})$=*, *=$C(R_{14})$—*, *—$C(R_{15})$=$C(R_{16})$—*, *—C(=O)—*, *—C(=S)—*, *—C≡C—*, *—$B(R_{17})$—*, *—$N(R_{18})$—*, *—$P(R_{19})$—*, *—$Si(R_{20})(R_{21})$—*, *—$P(R_{21})(R_{22})$—*, and *—$Ge(R_{22})(R_{23})$—*;

$n_1$ and $n_2$ are each independently an integer from 0 to 3, $m_1$ to $m_5$ and $m_8$ are each independently an integer from 0 to 3, $m_6$ and $m_7$ are each independently an integer from 0 to 1, $R_1$ to $R_8$ are each independently a hydrogen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms, or are bonded to an adjacent group to form a ring, and $R_{11}$ to $R_{23}$ are each independently a hydrogen atom, an oxygen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms.

8. The organic electroluminescence device of claim 7, wherein the organometallic complex represented by the chemical formula 1 is represented by the following chemical formula 1-1 or 1-2:

[Chemical formula 1-1]

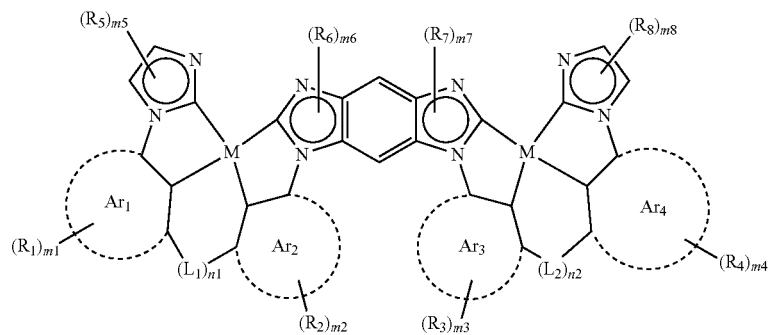

[Chemical formula 1-2]

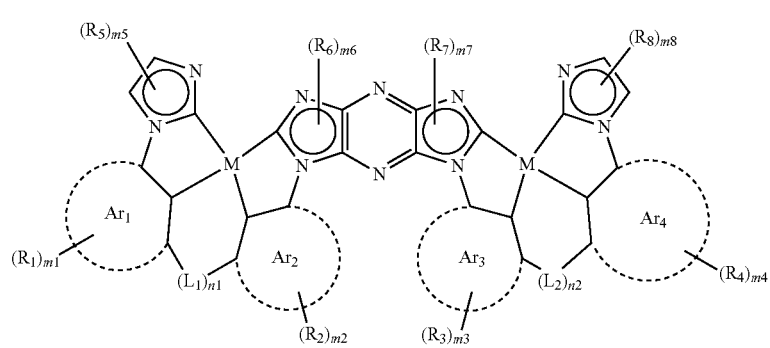

in the chemical formulae 1-1 and 1-2, and

M, $Ar_1$ to $Ar_4$, $R_1$ to $R_8$, $m_1$ to $m_5$, $L_1$, $L_2$, $n_1$, and $n_2$ are defined the same as in the chemical formula 1.

9. The organic electroluminescence device of claim 7, wherein the organometallic complex represented by the chemical formula 1 is represented by the following chemical formula 1-3:

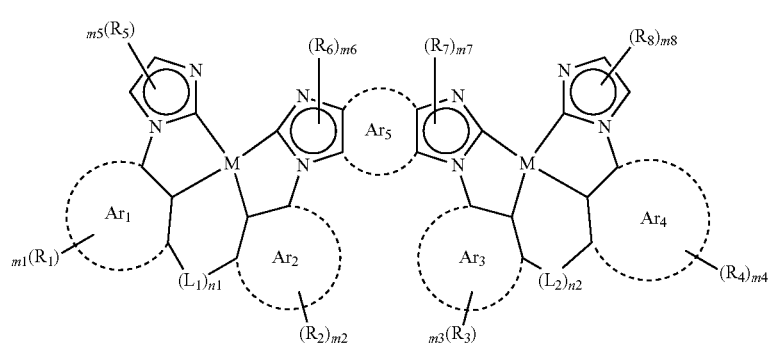
in the chemical formula 1-3,
Ar$_1$ to Ar$_5$, R$_1$ to R$_8$, m$_1$ to m$_5$, L$_1$, L$_2$, n$_1$, and n$_2$ are defined the same as in the chemical formula 1.
10. The organic electroluminescence device of claim 1, wherein the organometallic complex comprises at least one of compounds represented by the following compound group 1:
[Compound group 1]
1
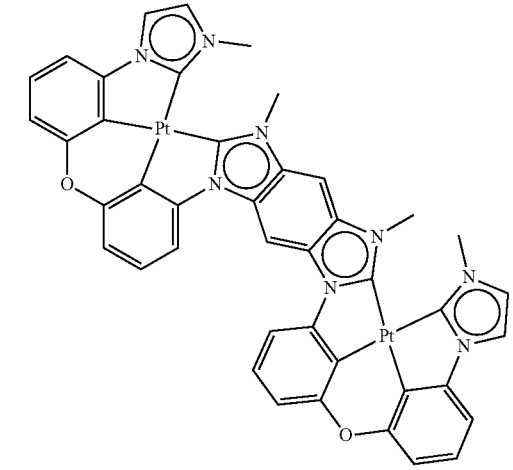
2
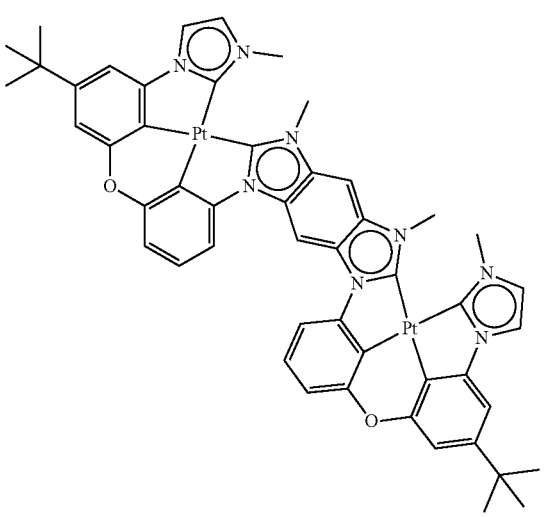
-continued
3
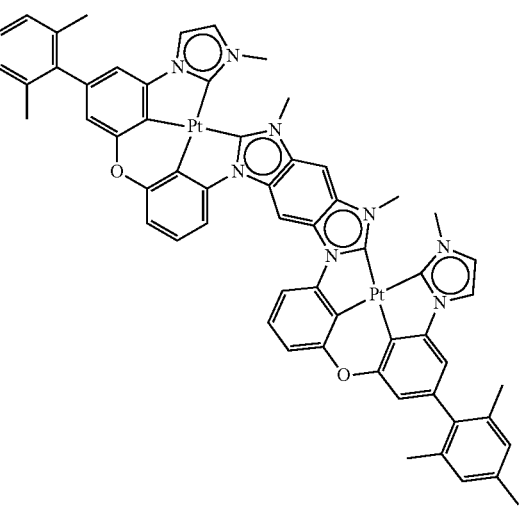
4
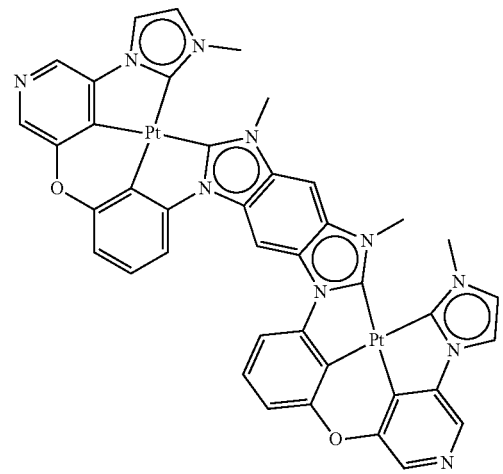

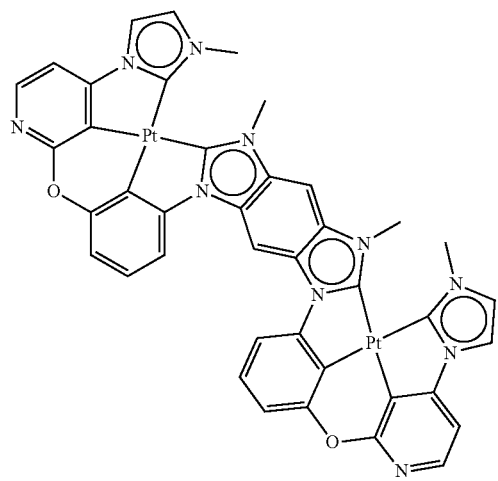
5
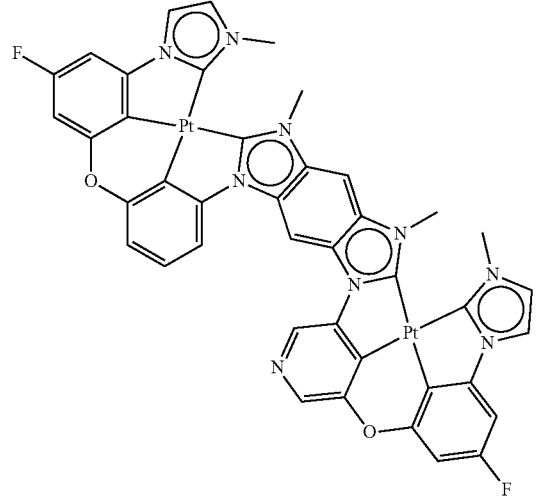
8
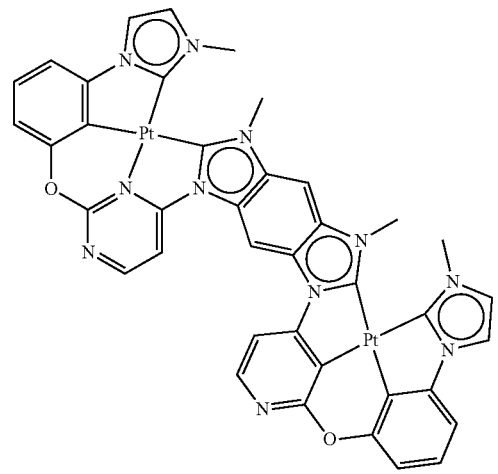
6
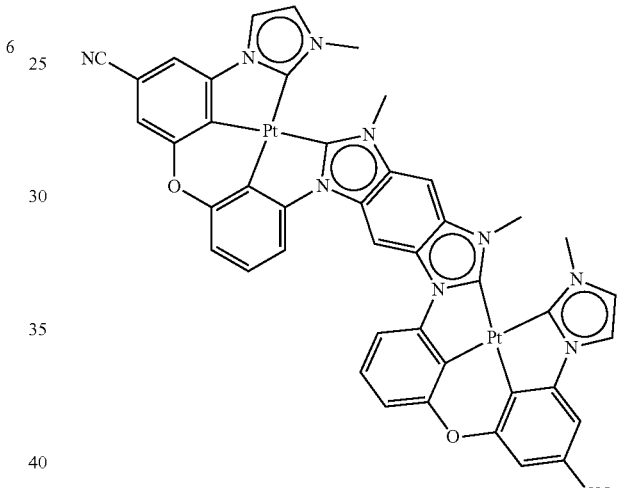
9
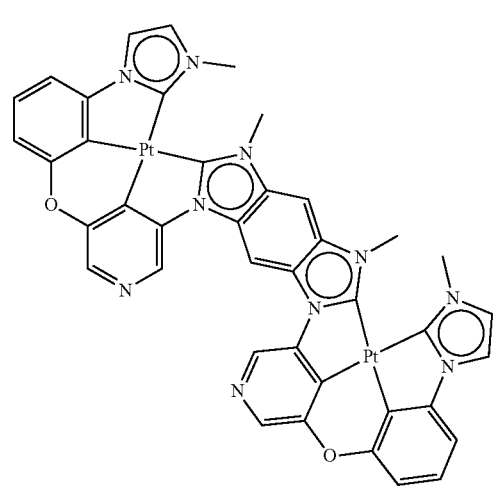
7
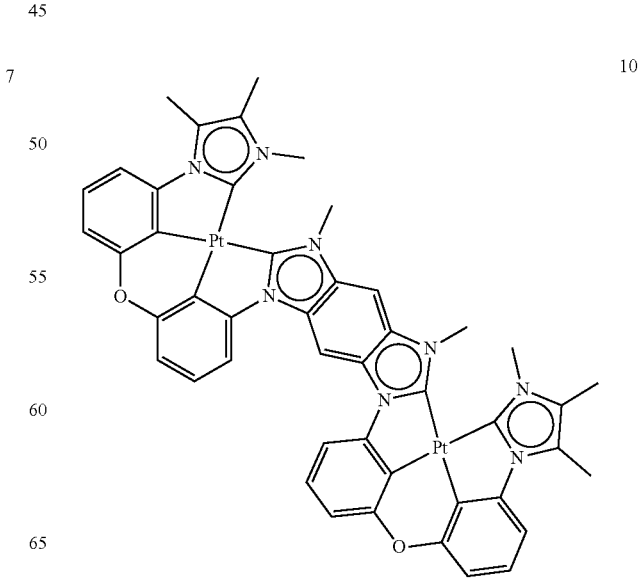
10

11
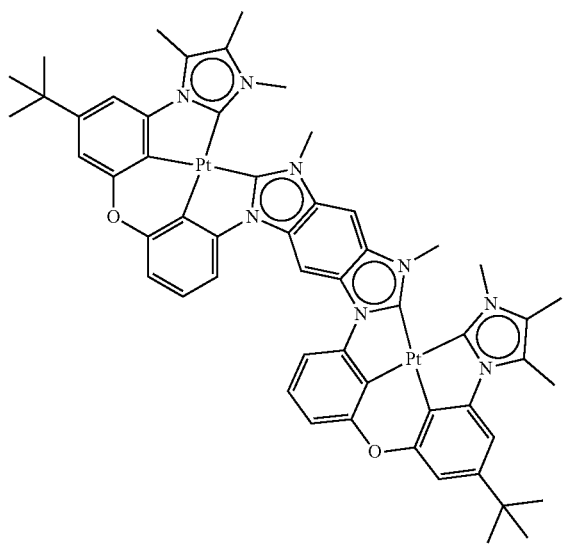
14
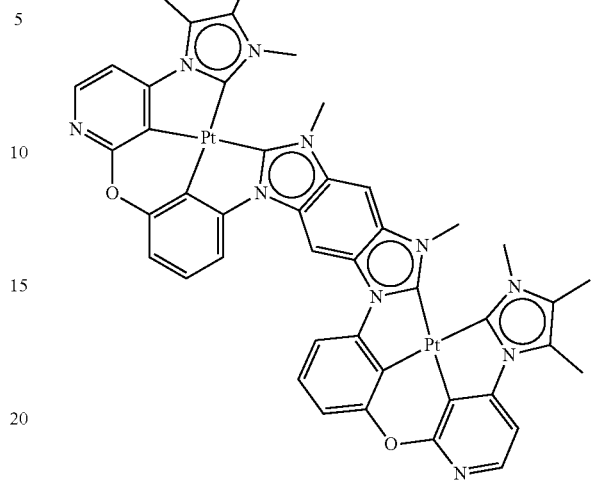
12
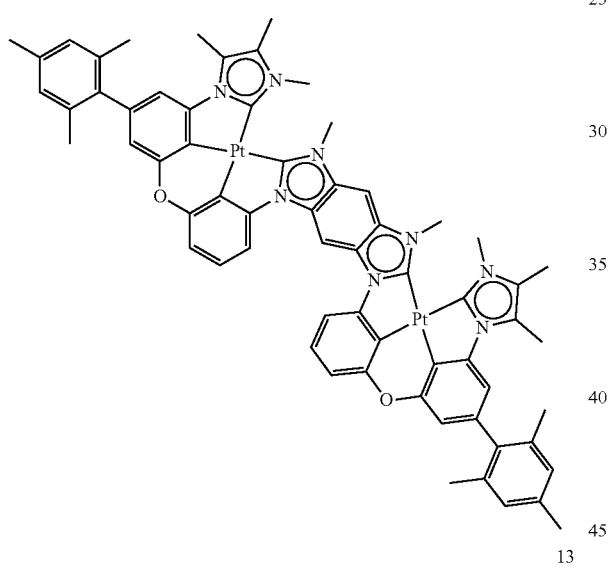
15
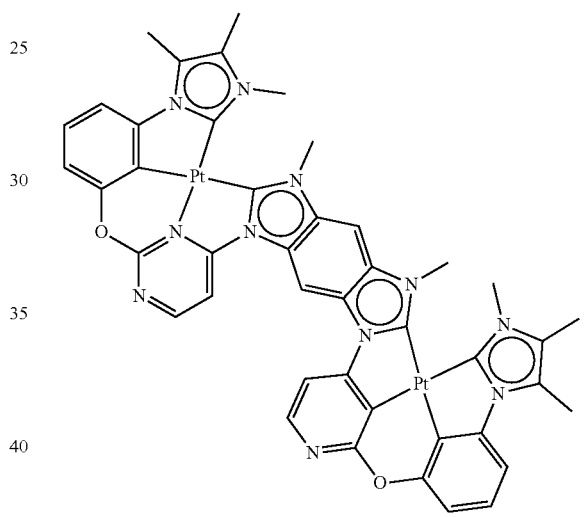
13
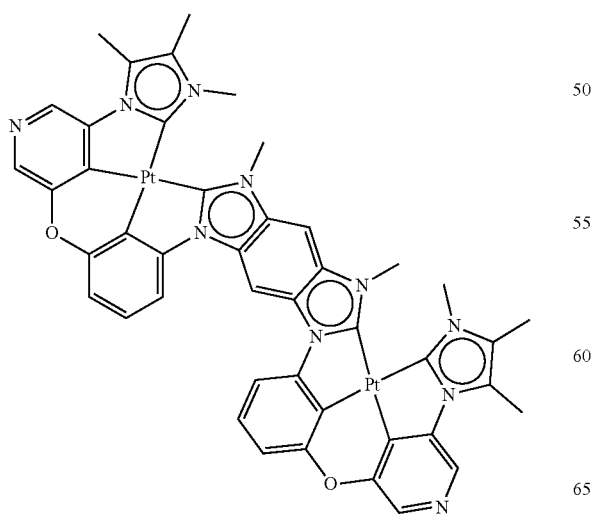
16
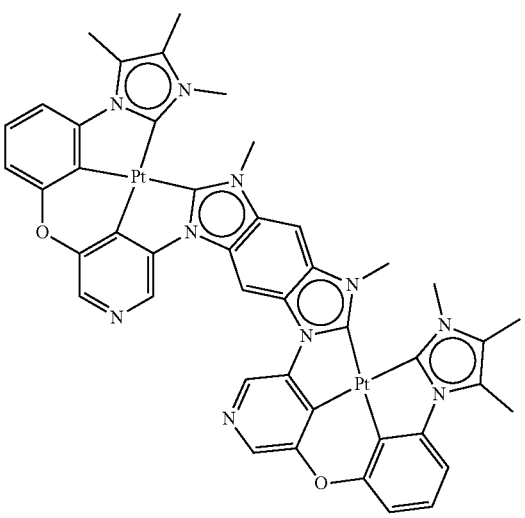

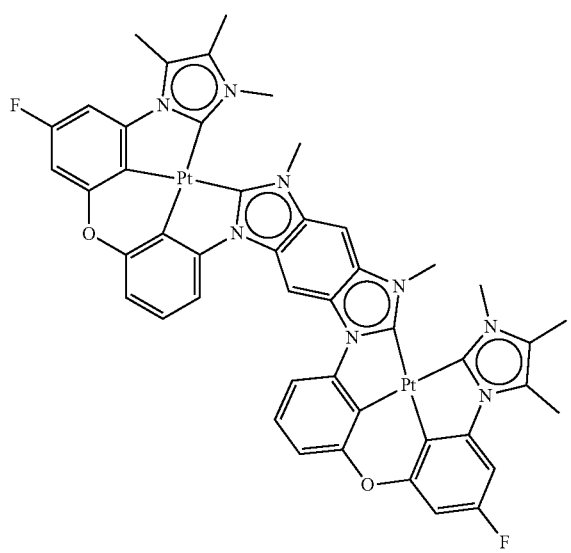
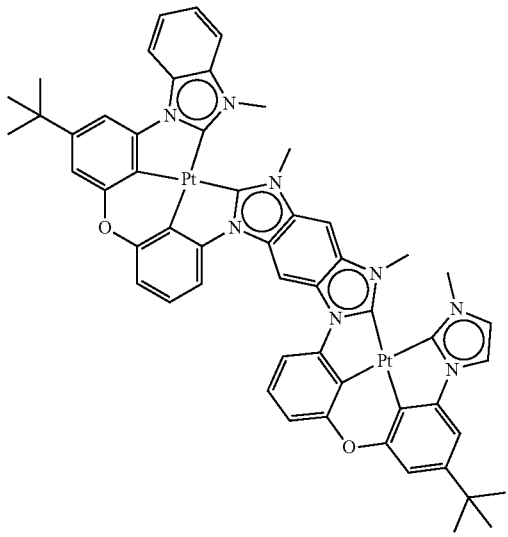
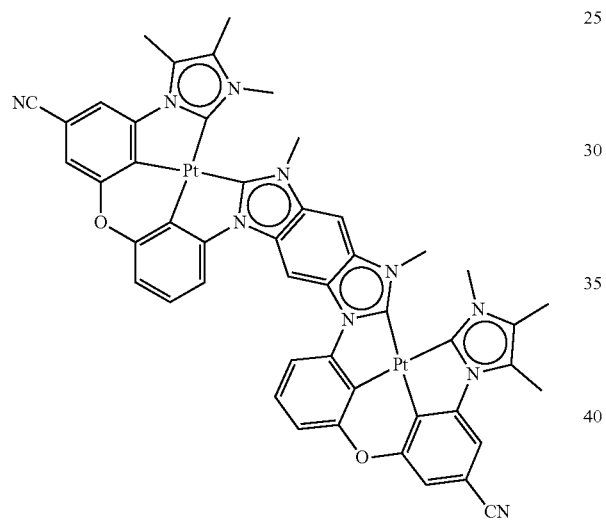
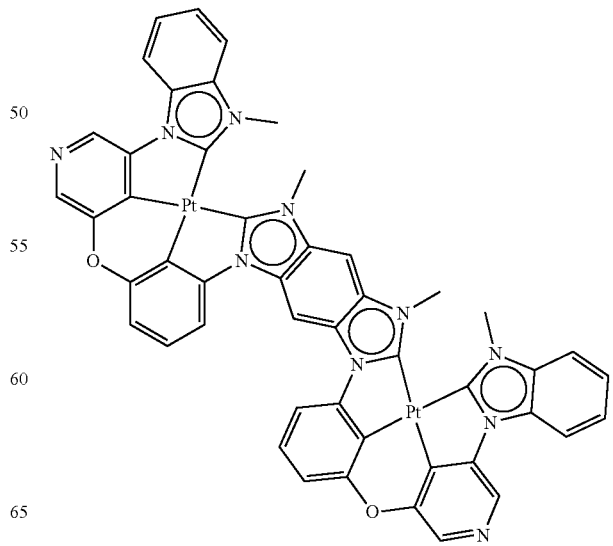
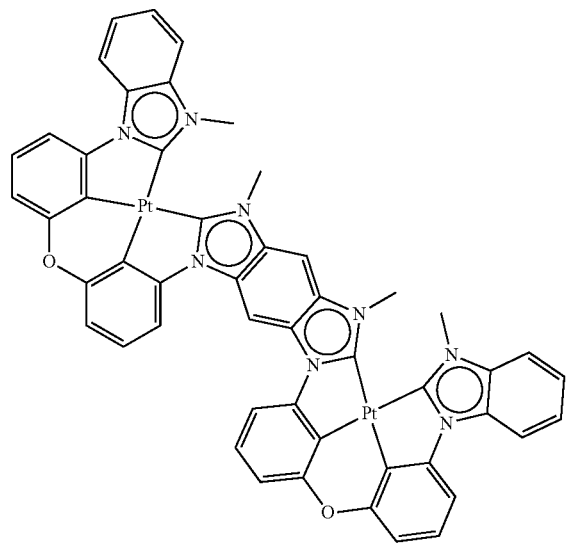

23
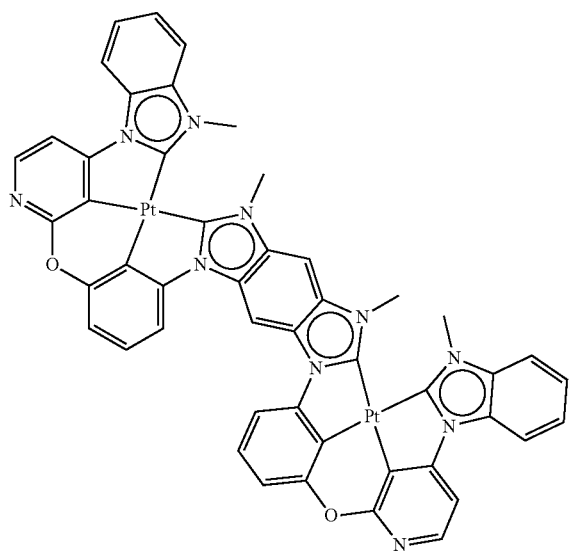
24
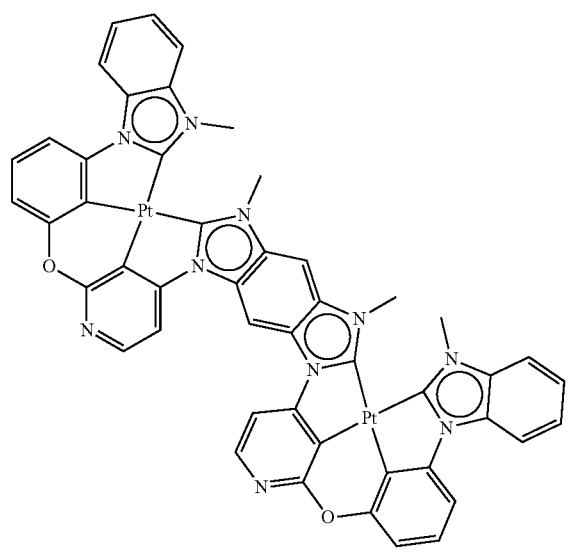
25
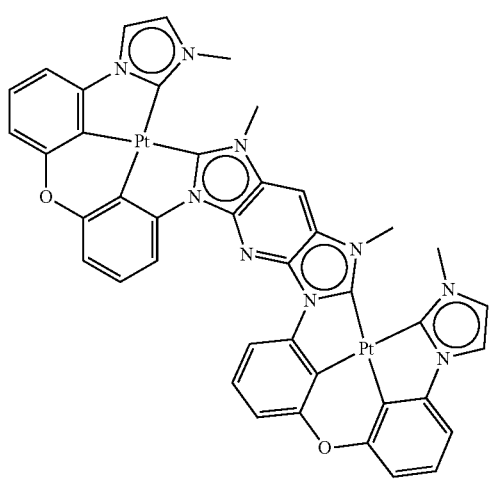
26
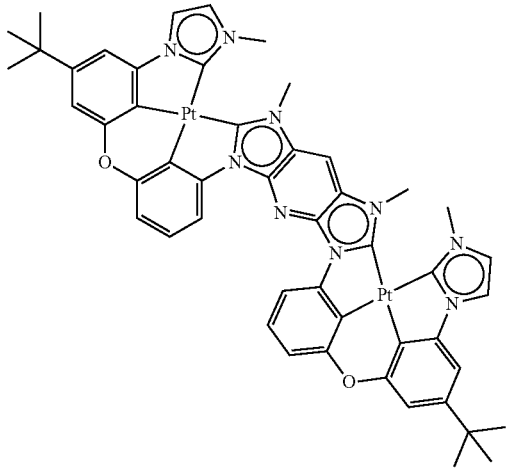
27
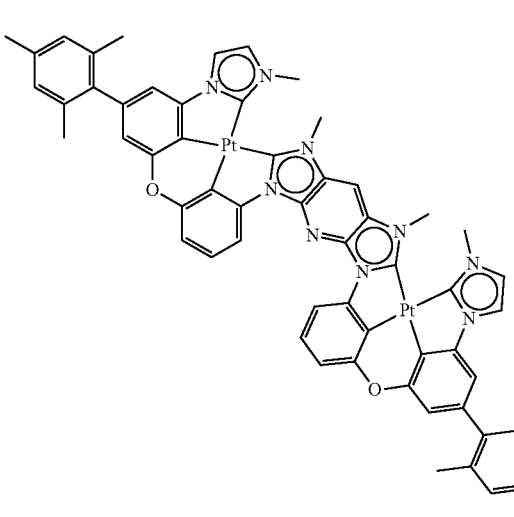
28
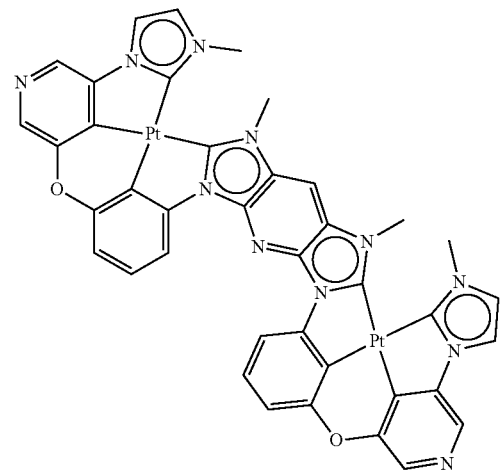

29
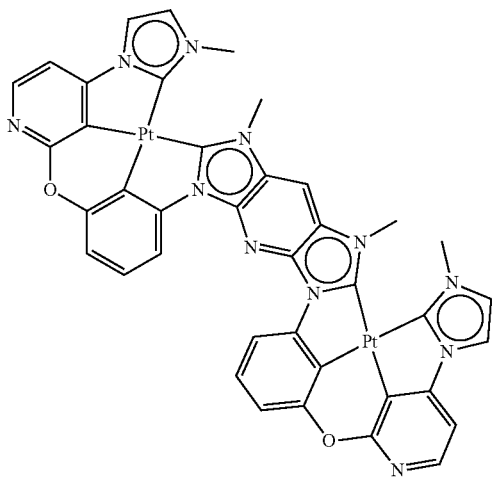
30
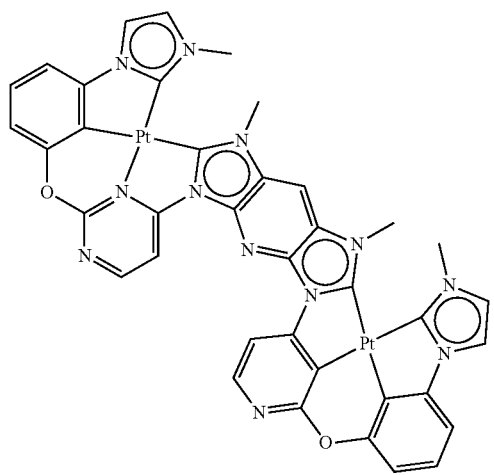
31
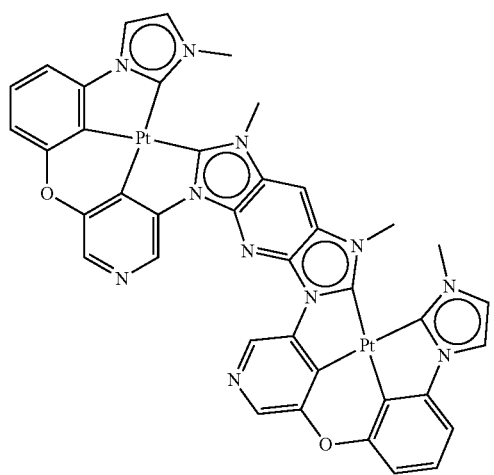
32
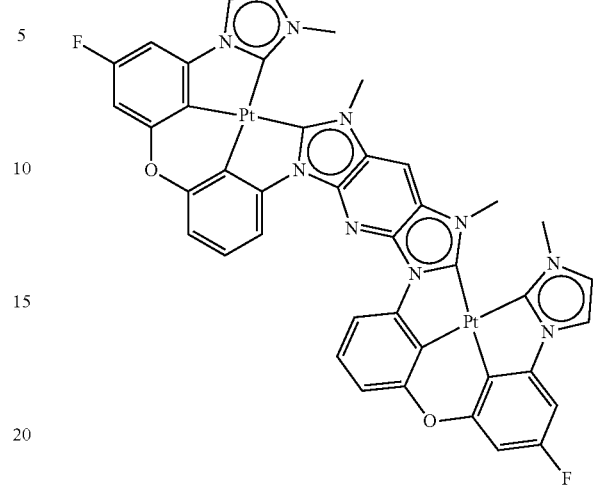
33
34
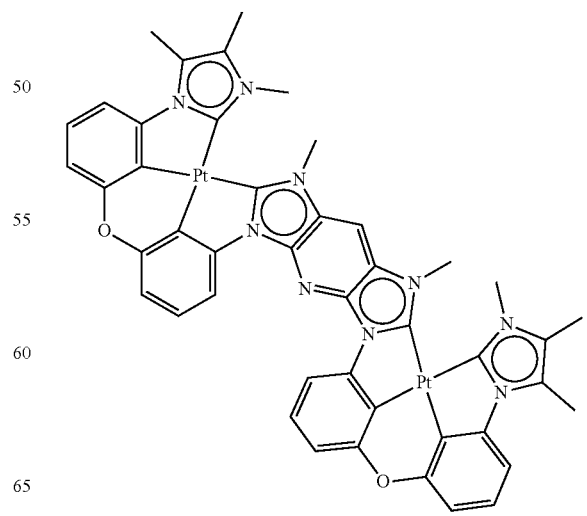

35
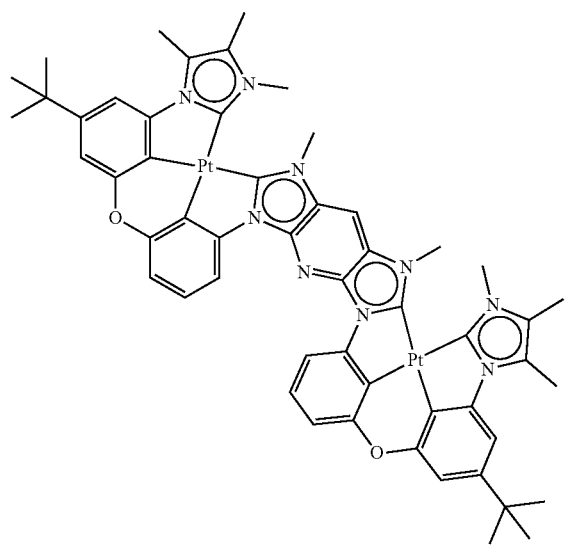
36
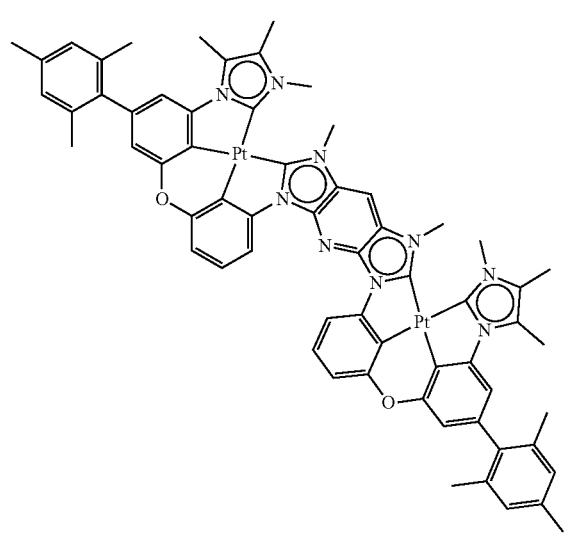
37
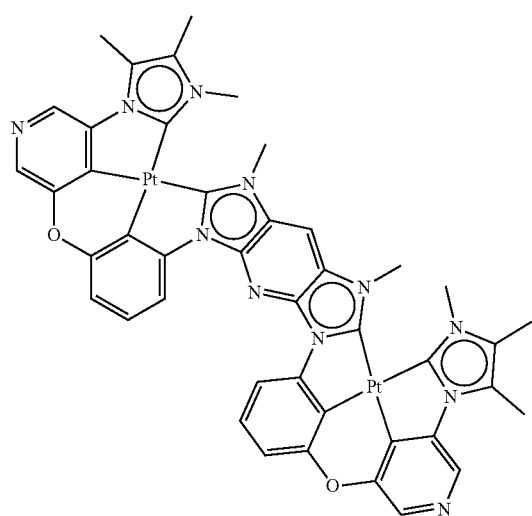
38
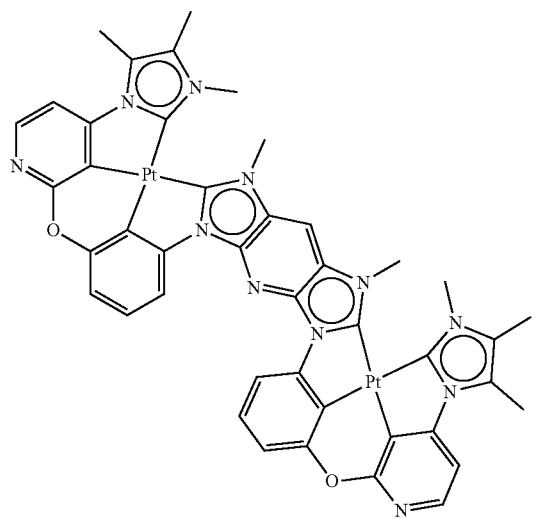
39
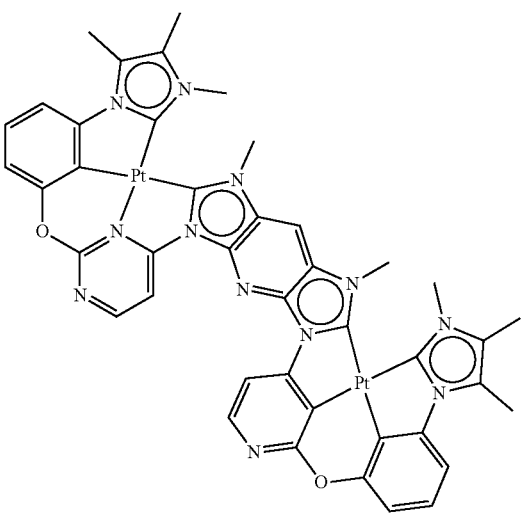
40
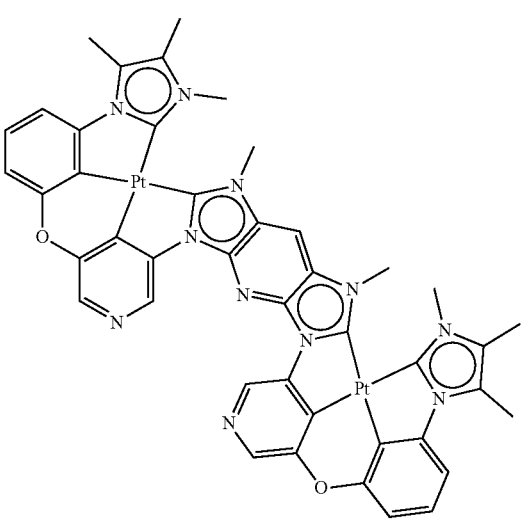

41
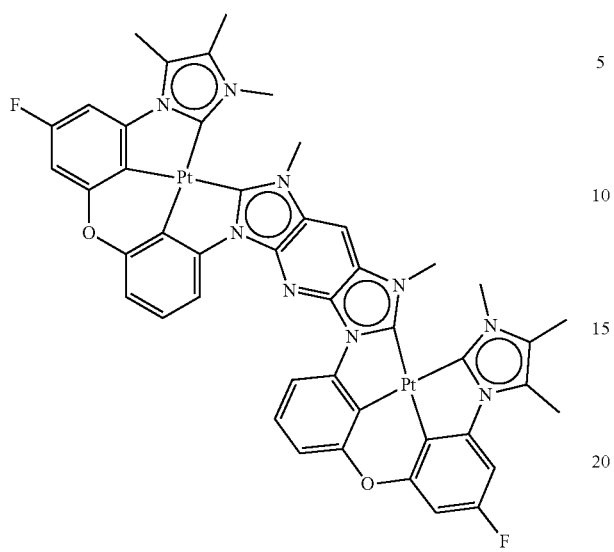
42
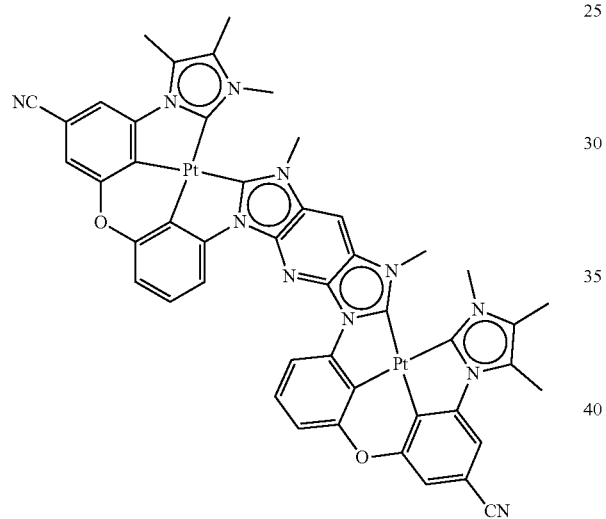
43
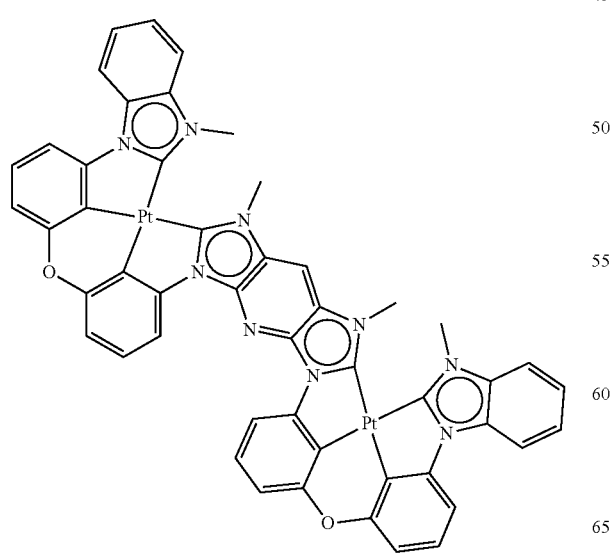
44
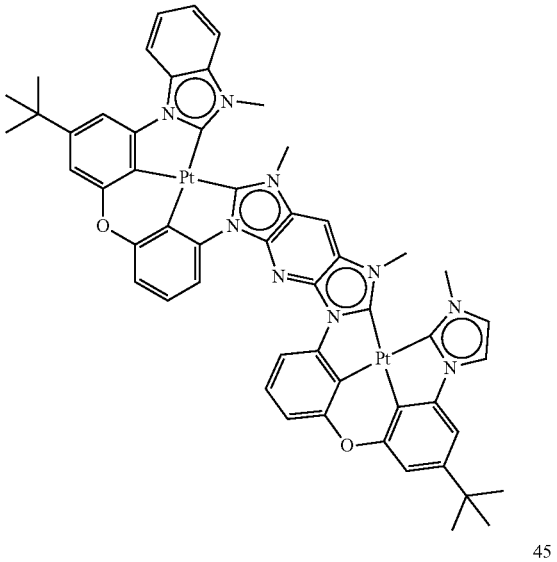
45
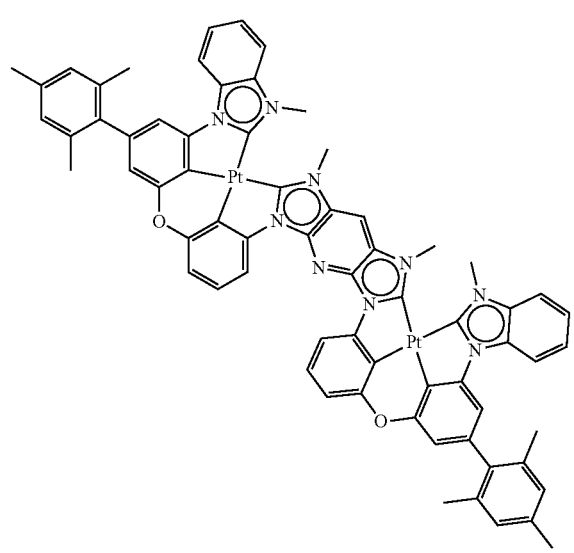
46
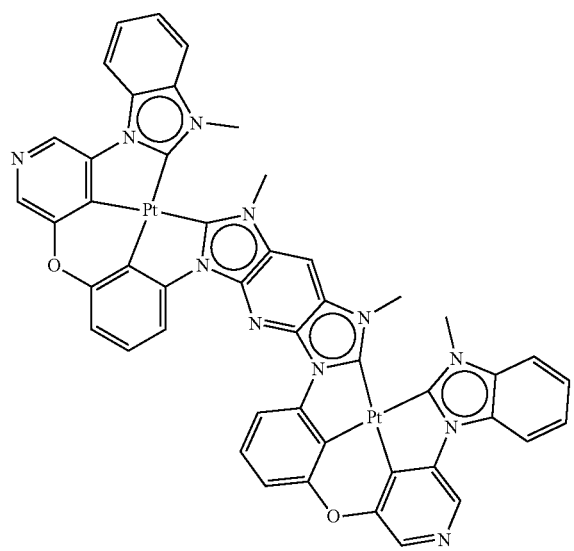

-continued

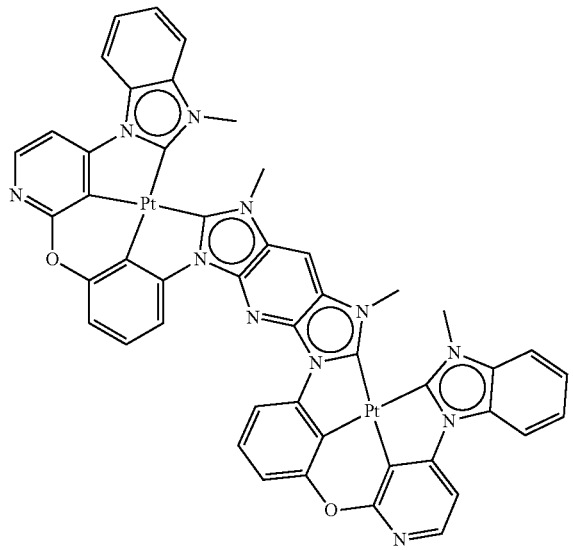

47

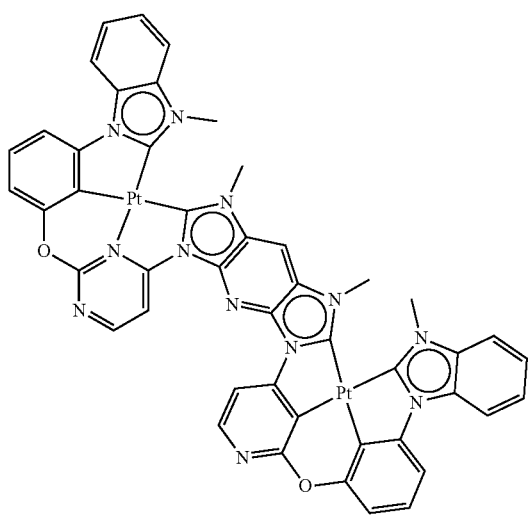

48

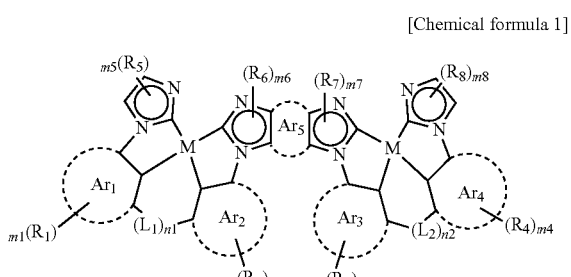

[Chemical formula 1]

at least one of the organic layers comprises an organometallic complex represented by the following chemical formula 1:

in the chemical formula 1,

M is Pt, Pd, Cu, Ag, Au, Rh, Ir, Ru, or Os, $Ar_1$, $Ar_2$, $Ar_3$, $Ar_4$, and $Ar_5$ are each independently a substituted or unsubstituted aryl group having 6 to 60 ring-forming carbon atoms or a substituted or unsubstituted hetero aryl group having 2 to 60 ring-forming carbon atoms, $L_1$ and $L_2$ are each independently selected from a direct linkage, *—O—*, *—S—*, *—C($R_{11}$)($R_{12}$)—*, *—C($R_{13}$)=*, *=C($R_{14}$)—*, *—C($R_{15}$)=C($R_{16}$)—*, *—C(=O)—*, *—C(=S)—*, *—C≡C—*, *—B($R_{17}$)—*, *—N($R_{18}$)—*, *—P($R_{19}$)—*, *—Si($R_{20}$)($R_{21}$)—*, *—P($R_{21}$)($R_{22}$)—*, and *—Ge($R_{22}$)($R_{23}$)—*;

$n_1$ and $n_2$ are each independently an integer from 0 to 3, $m_1$ to $m_5$ and $m_8$ are each independently an integer from 0 to 3, $m_6$ and $m_7$ are each independently an integer from 0 to 1, $R_1$ to $R_8$ are each independently a hydrogen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms, or are bonded to an adjacent group to form a ring, and $R_{11}$ to $R_{23}$ are each independently an oxygen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms.

12. The organic electroluminescence device of claim 11, wherein the organometallic complex represented by the chemical formula 1 is represented by the following chemical formula 1-1 or 1-2:

11. An organic electroluminescence device, comprising:
a first electrode;
a second electrode opposite to the first electrode; and
organic layers disposed between the first electrode and the second electrode,

[Chemical formula 1-1]

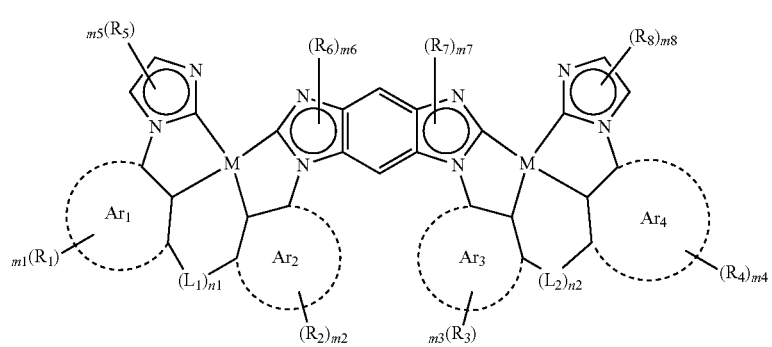

[Chemical formula 1-2]

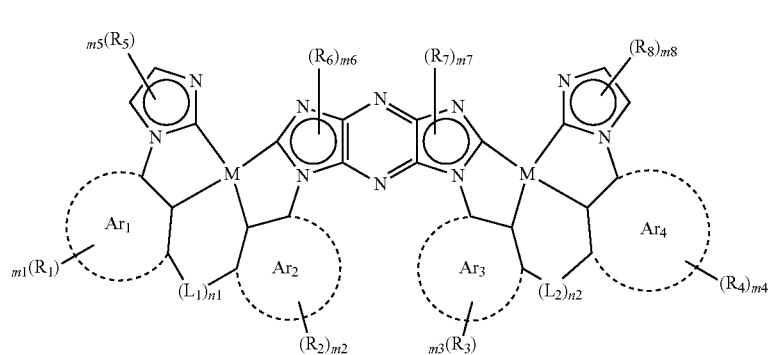

in the chemical formulae 1-1 and 1-2, and

M, $Ar_1$ to $Ar_4$, $R_1$ to $R_8$, $m_1$ to $m_8$, $L_1$, $L_2$, $n_1$, and $n_2$ are the same as those defined in the chemical formula 1.

13. The organic electroluminescence device of claim 11, wherein the organometallic complex comprises at least one of compounds represented by the following compound group 1:

[Compound group 1]

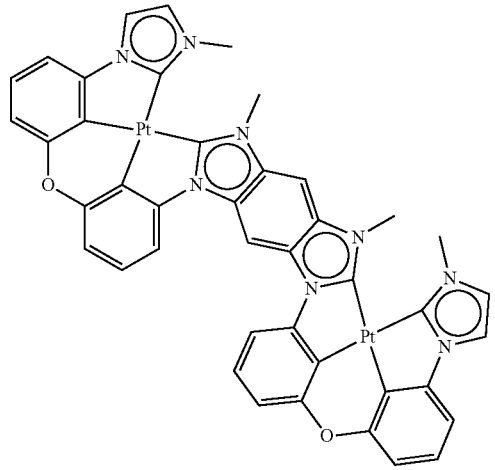

1

-continued

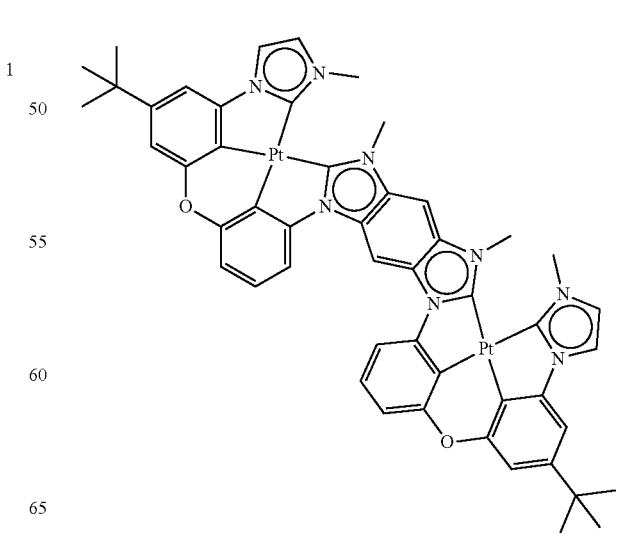

2

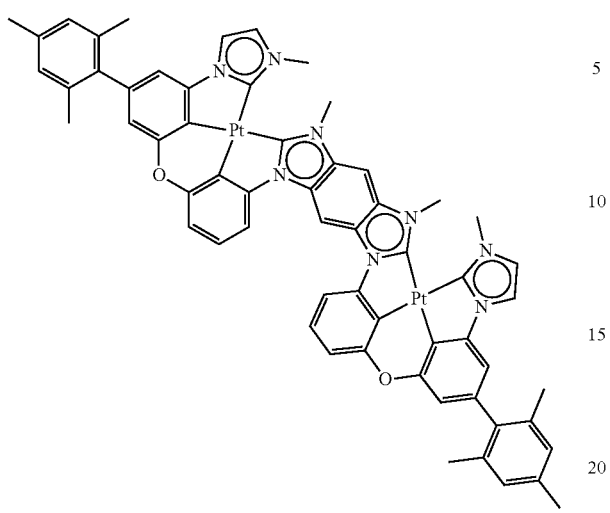
3
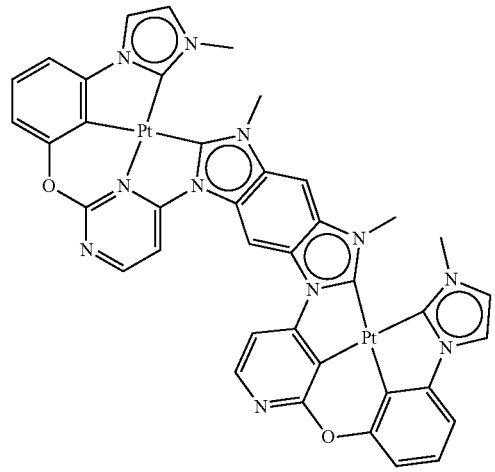
6
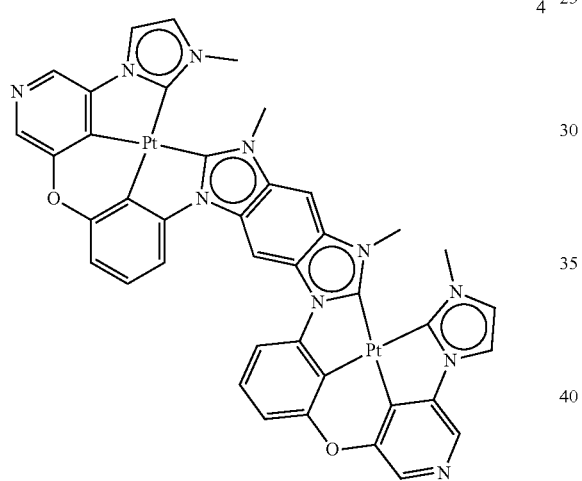
4
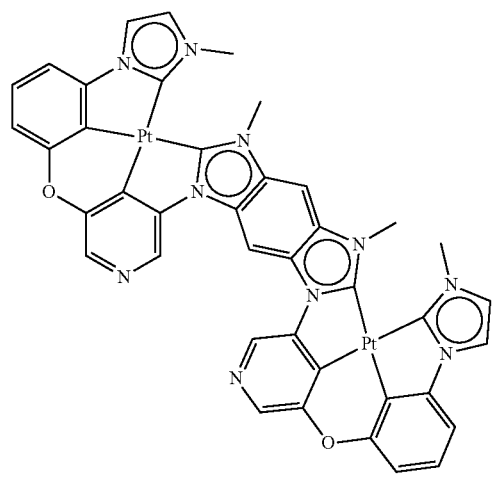
7
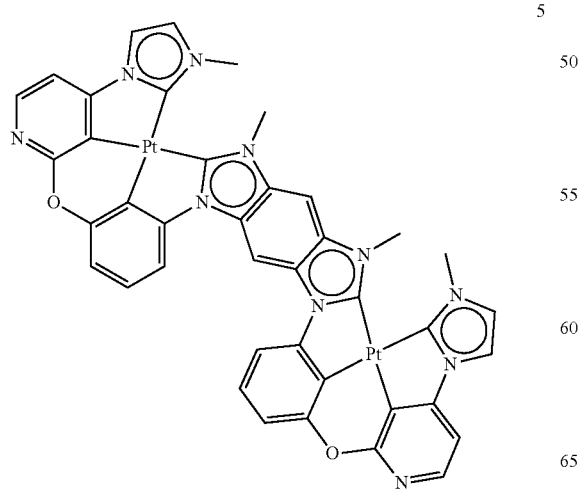
5
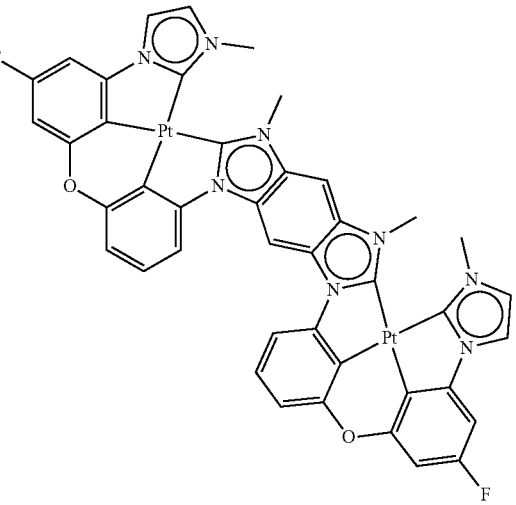
8

9
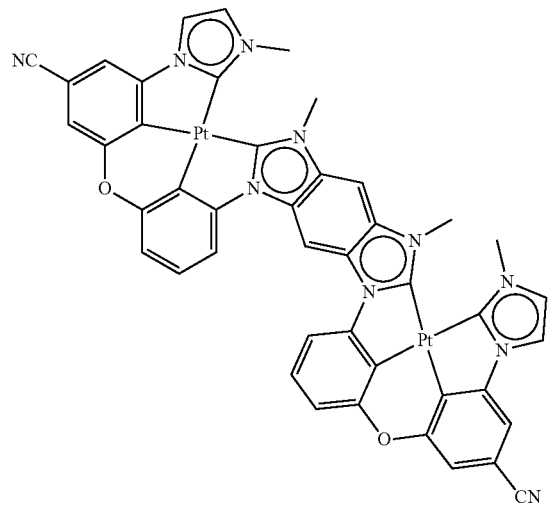
10
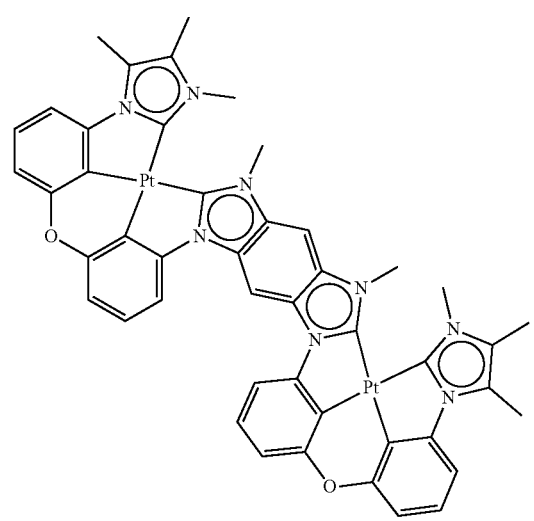
11
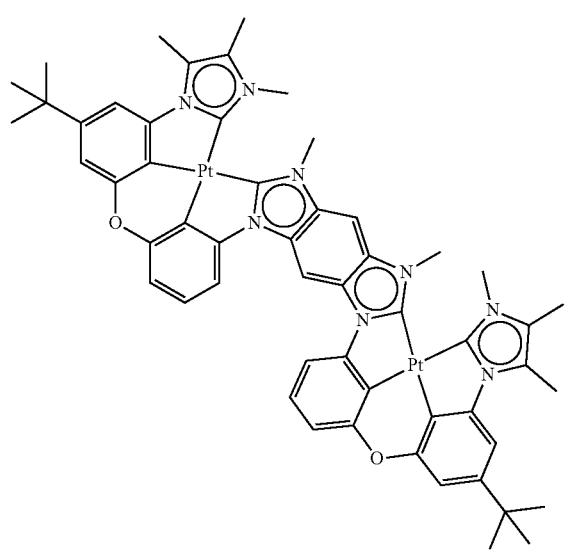
12
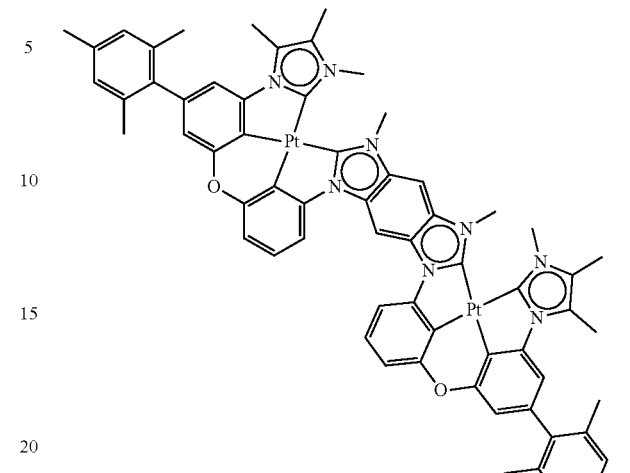
13
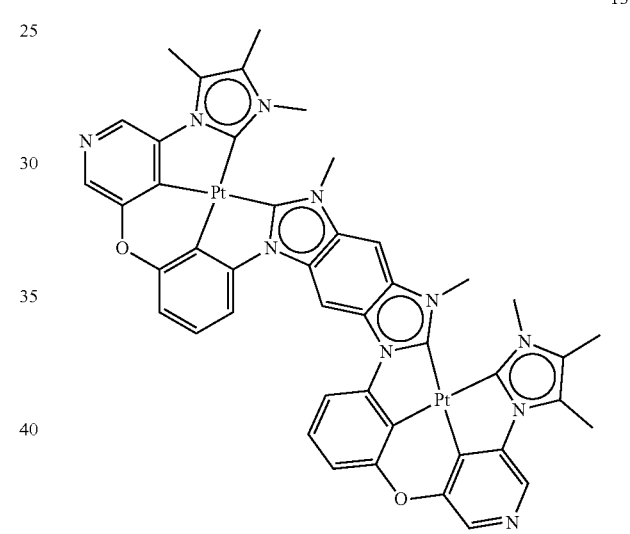
14
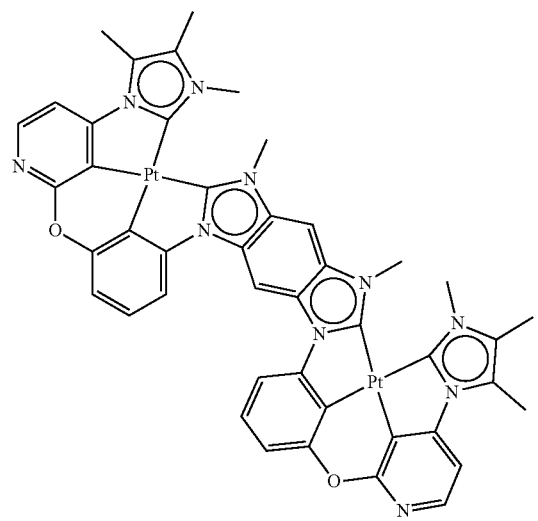

15
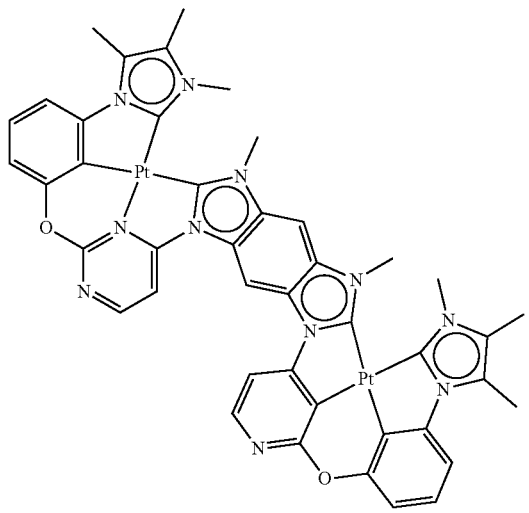
16
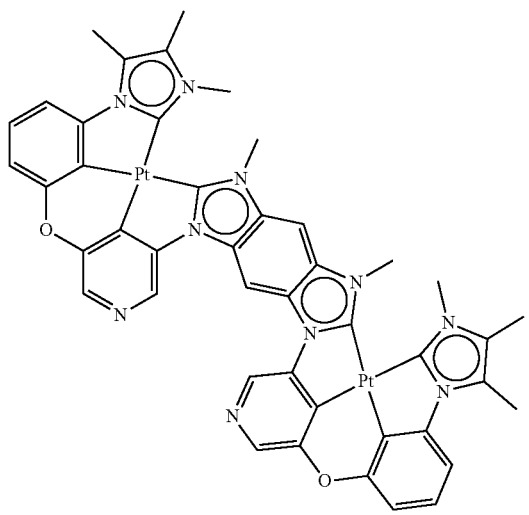
17
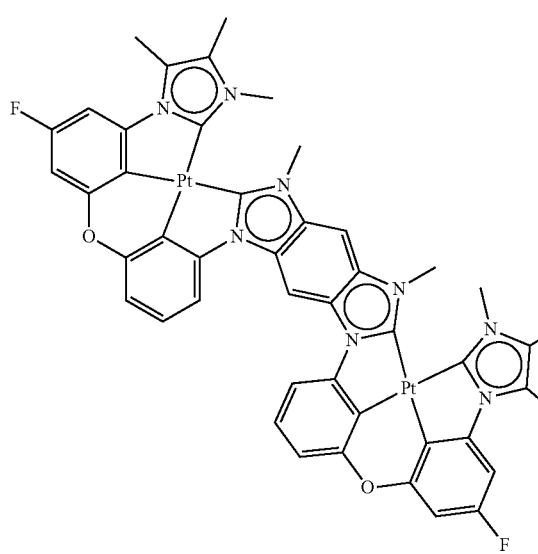
18
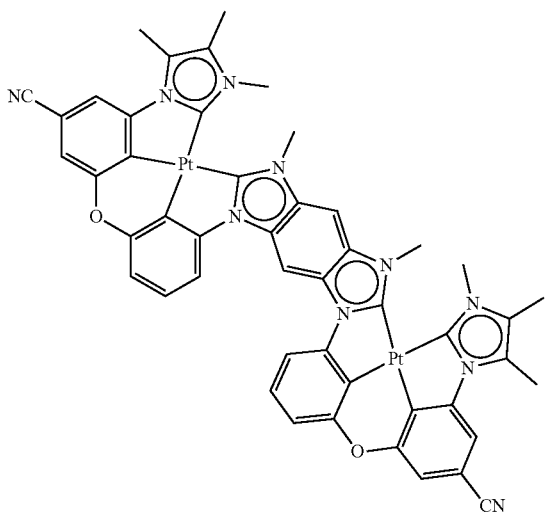
19
20
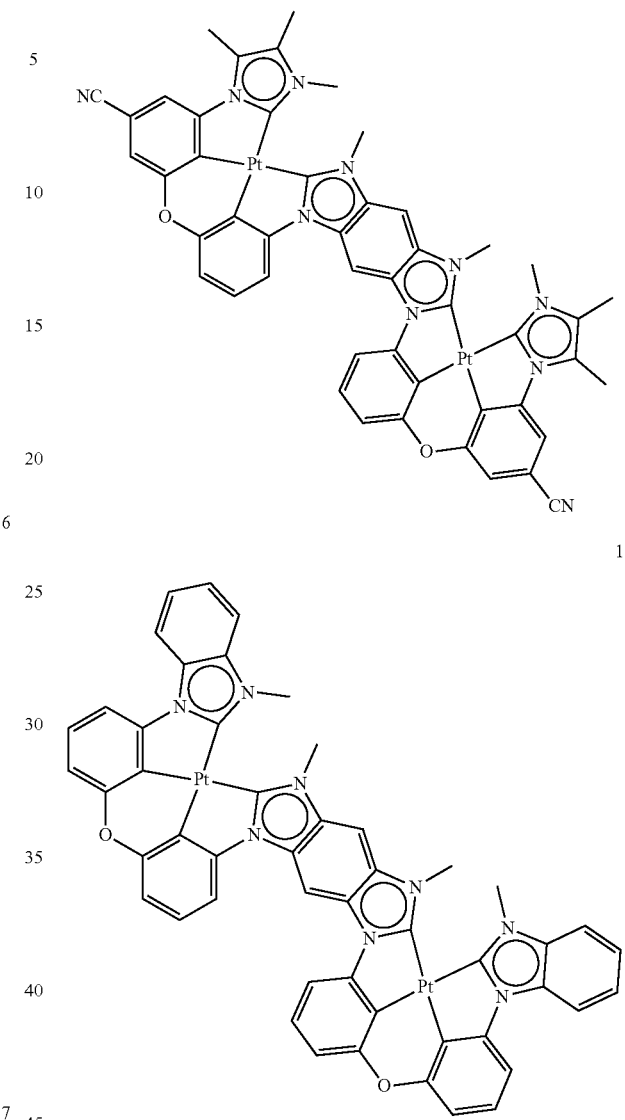
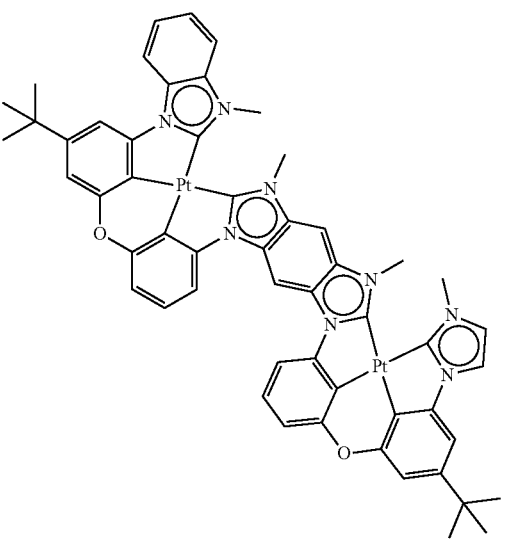

21
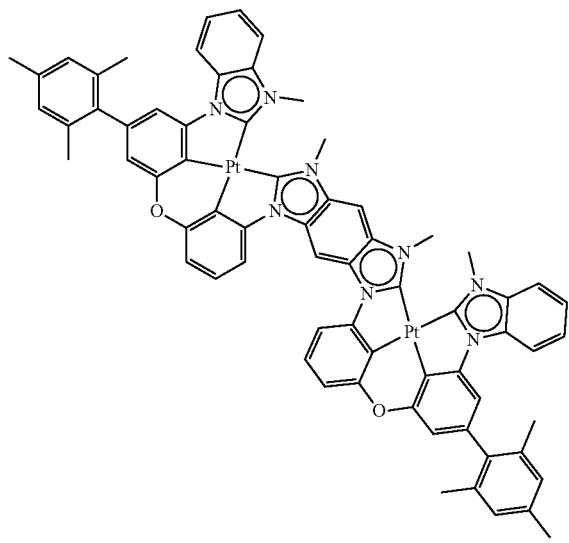
22
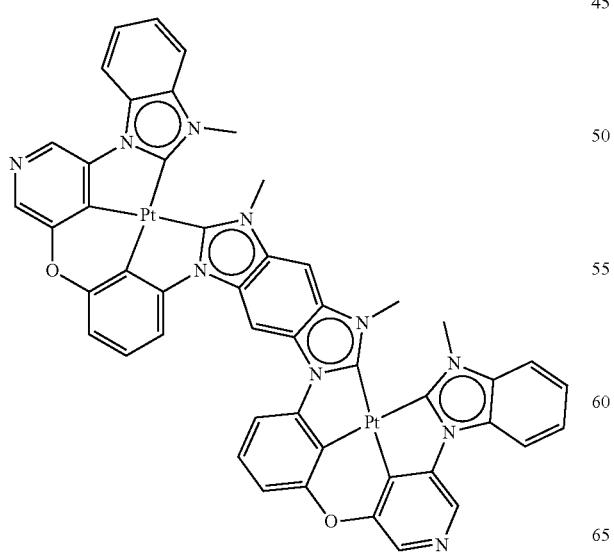
23
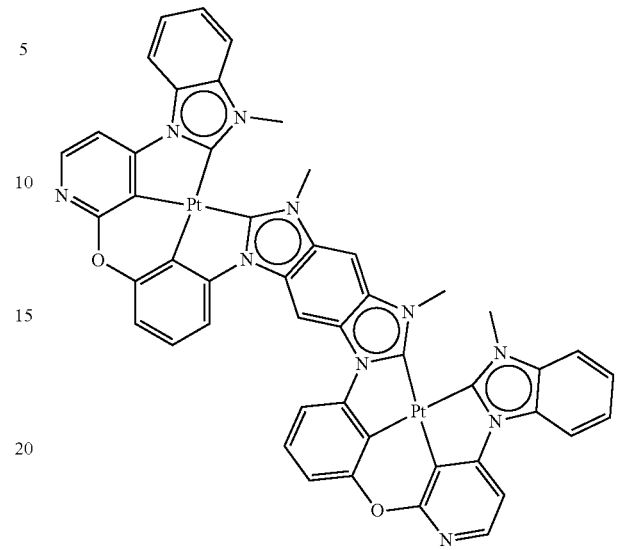
24
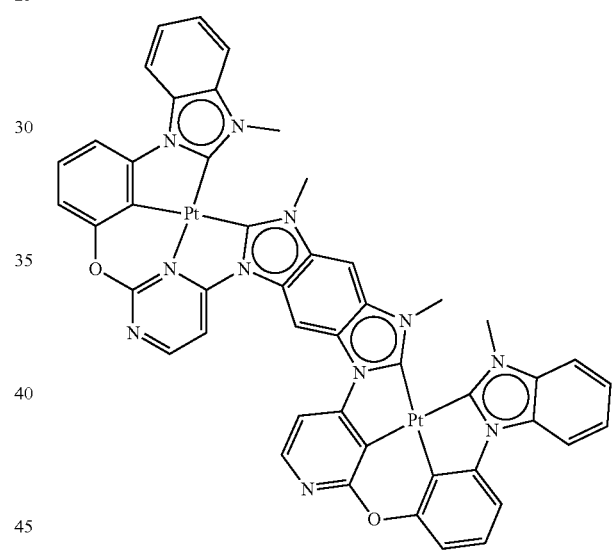
25

87
26
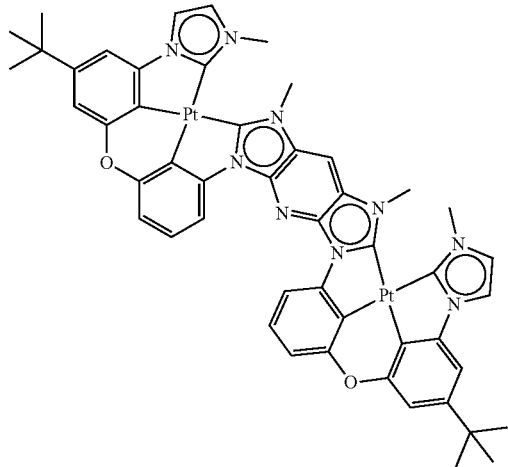
27
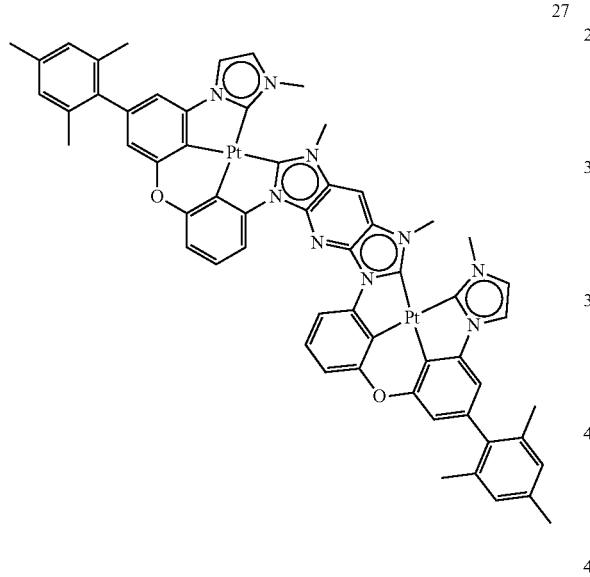
28
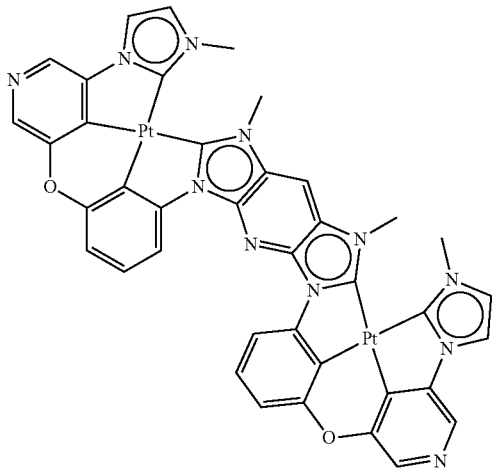
88
29
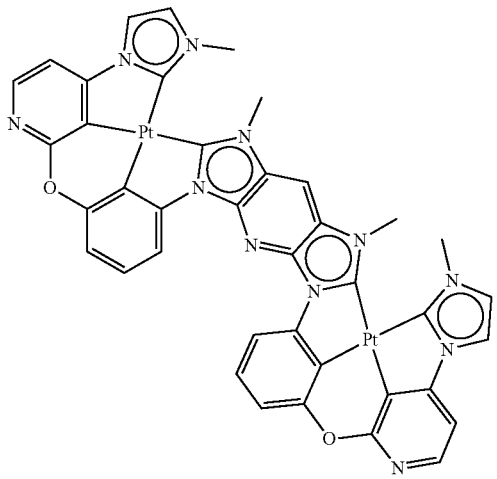
30
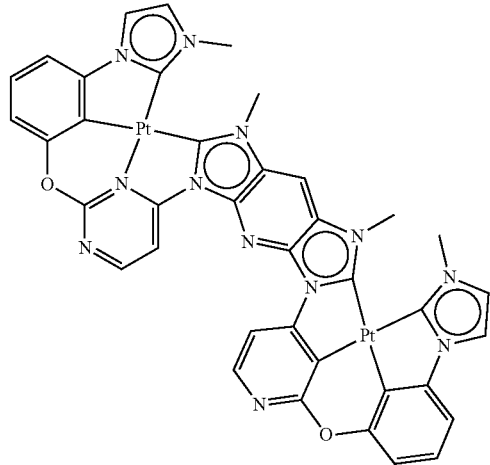
31

32
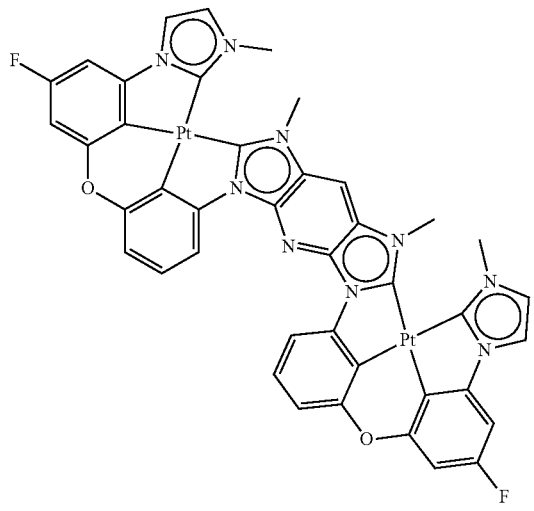
33
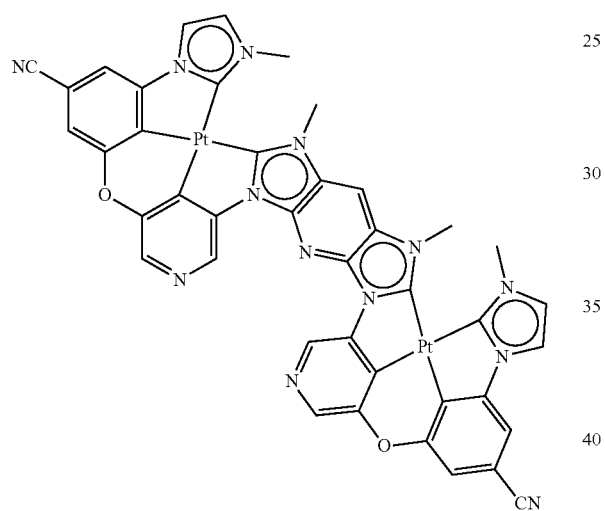
34
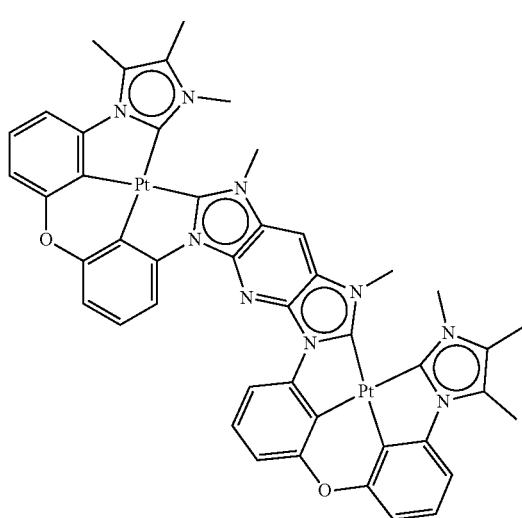
35
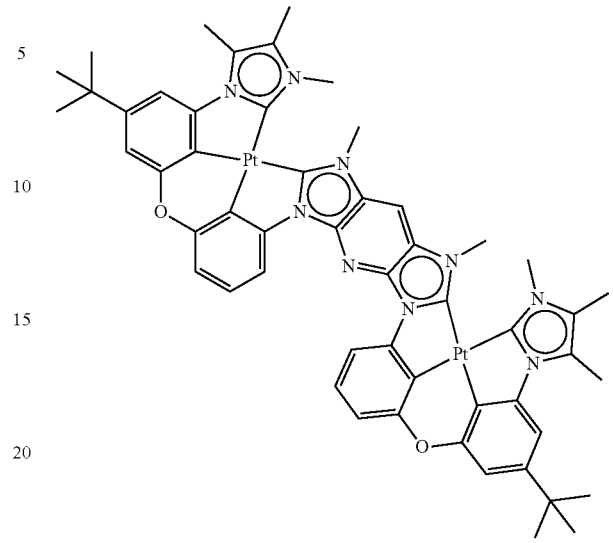
36
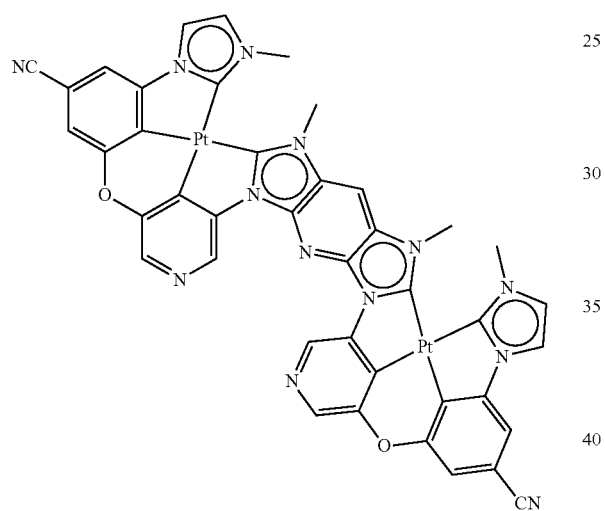
37
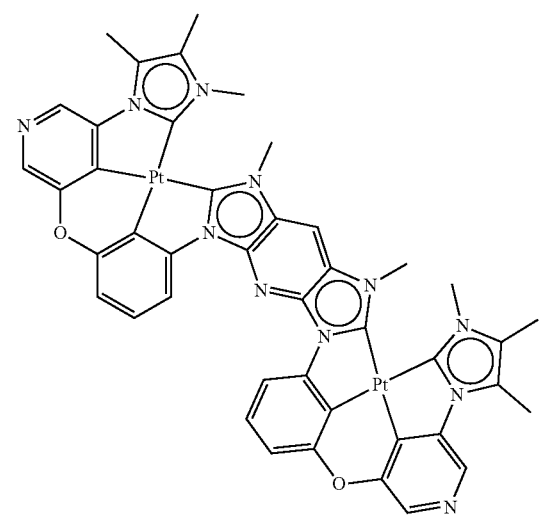

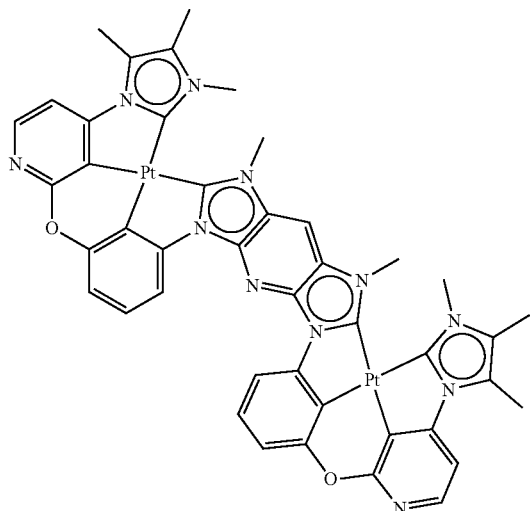
38
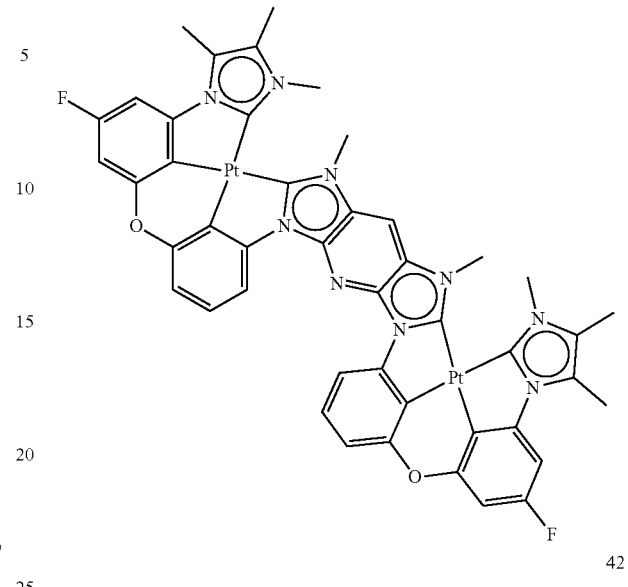
41
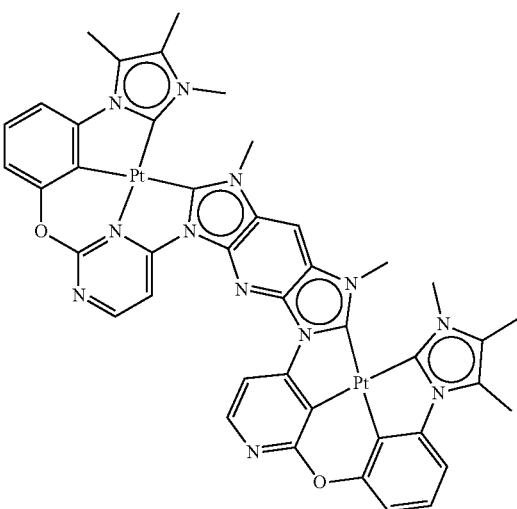
39
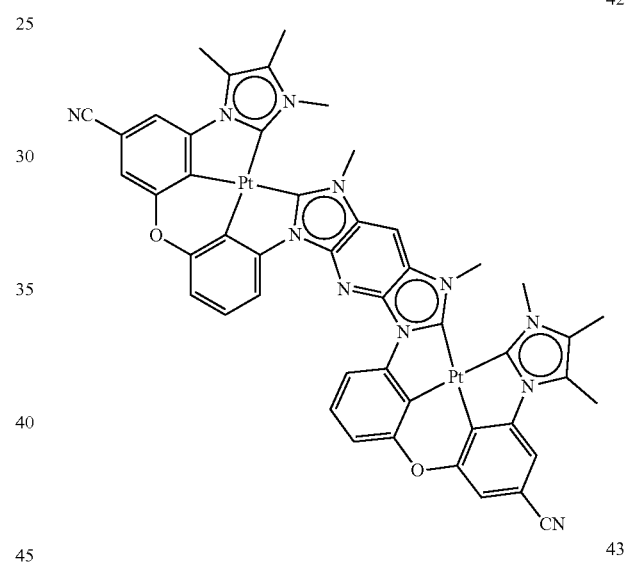
42
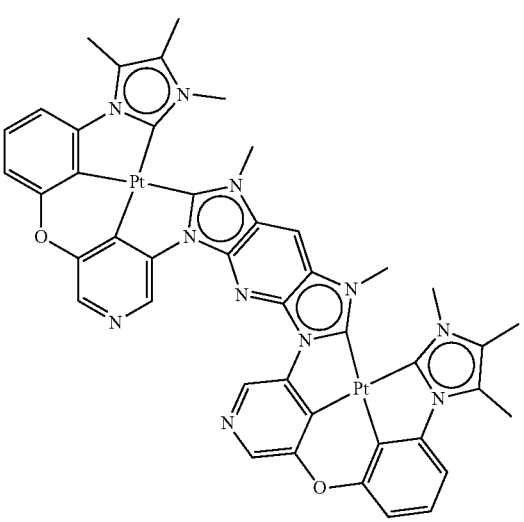
40
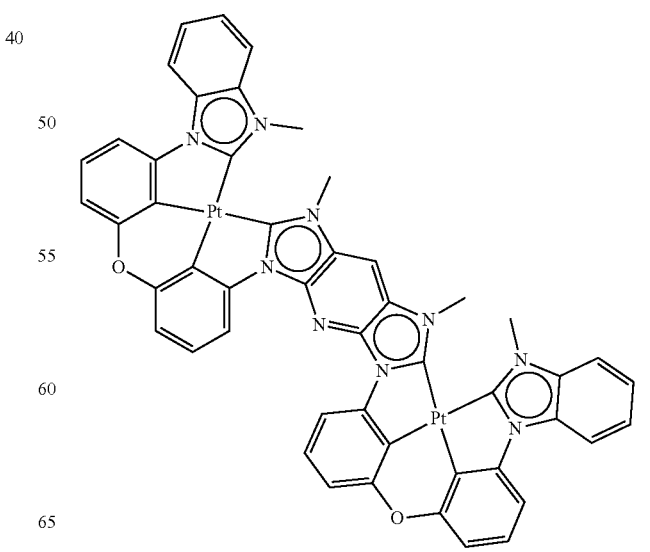
43

44
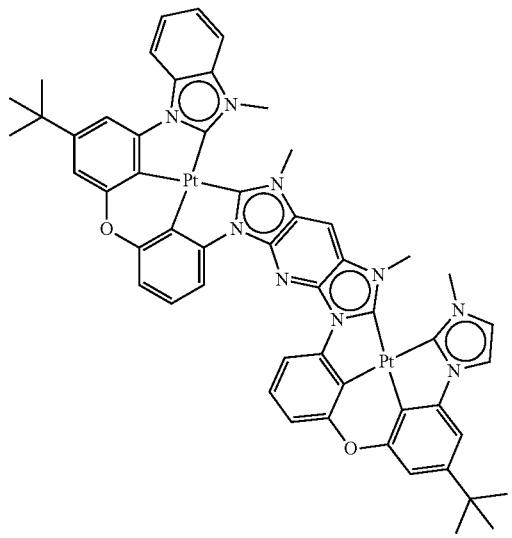
45
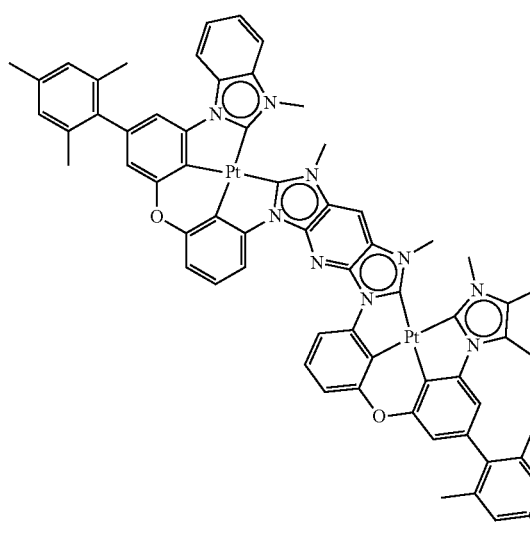
46
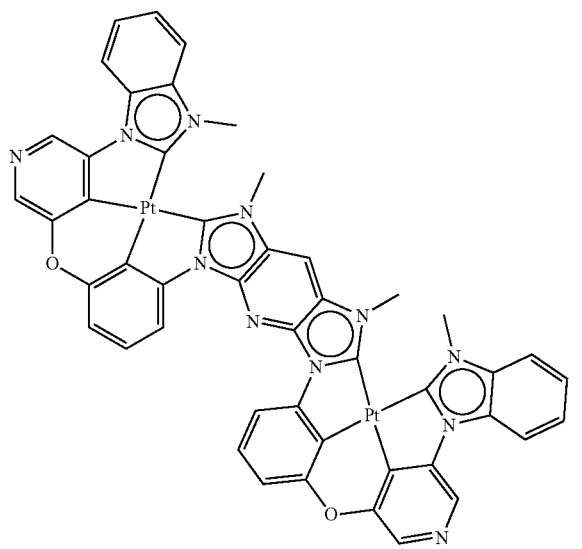
47
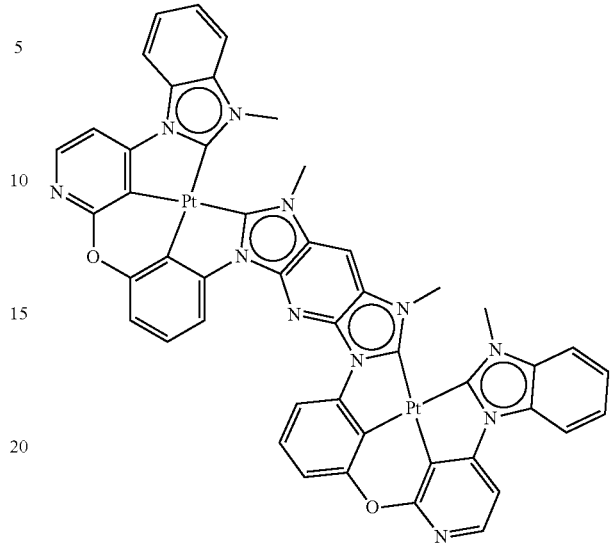
48
14. An organometallic complex represented by the following chemical formula 1:

[Chemical formula 1]

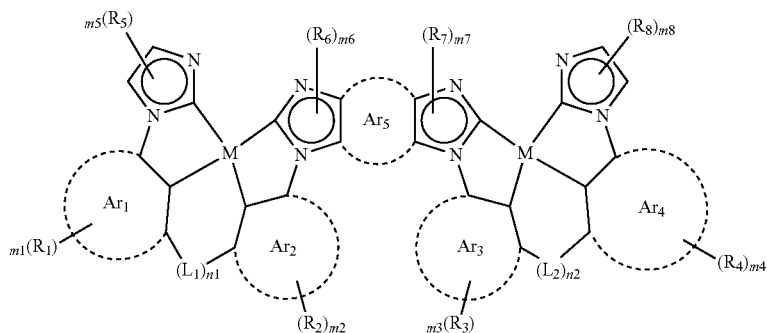

in the chemical formula 1,

M is Pt, Pd, Cu, Ag, Au, Rh, Ir, Ru, or Os, $Ar_1$, $Ar_2$, $Ar_3$, $Ar_4$, and $Ar_5$ are each independently a substituted or unsubstituted aryl group having 6 to 60 ring-forming carbon atoms or a substituted or unsubstituted hetero aryl group having 2 to 60 ring-forming carbon atoms, $L_1$ and $L_2$ are each independently selected from a direct linkage, *—O—*, *—S—*, *—$C(R_{11})(R_{12})$—*, *—$C(R_{13})$=*, *=$C(R_{14})$—*, *—$C(R_{15})$=$C(R_{16})$—*, *—C(=O)—*, *—C(=S)—*, *—C≡C—*, *—$B(R_{17})$—*, *—$N(R_{18})$—*, *—$P(R_{19})$—*, *—$Si(R_{20})(R_{21})$—*, *—$P(R_{21})(R_{22})$—*, and *—$Ge(R_{22})(R_{23})$—*;

$n_1$ and $n_2$ are each independently an integer from 0 to 3, $m_1$ to $m_5$ and $m_8$ are each independently an integer from 0 to 3, $m_6$ and $m_7$ are each independently an integer from 0 to 1, $R_1$ to $R_8$ are each independently a hydrogen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms, or are bonded to an adjacent group to form a ring, and $R_{11}$ to $R_{23}$ are each independently an oxygen atom, a deuterium atom, a halogen atom, a substituted or unsubstituted alkyl group having 1 to 20 carbon atoms, a substituted or unsubstituted aryl group having 6 to 40 ring-forming carbon atoms, or a substituted or unsubstituted hetero aryl group having 2 to 40 ring-forming carbon atoms.

15. The organometallic complex of claim 14, wherein the organometallic complex represented by the chemical formula 1 is represented by the following chemical formula 1-1 or 1-2:

[Chemical formula 1-1]

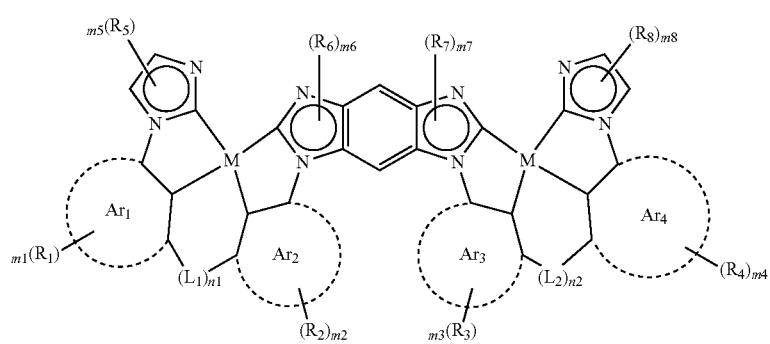

[Chemical Formula 1-2]

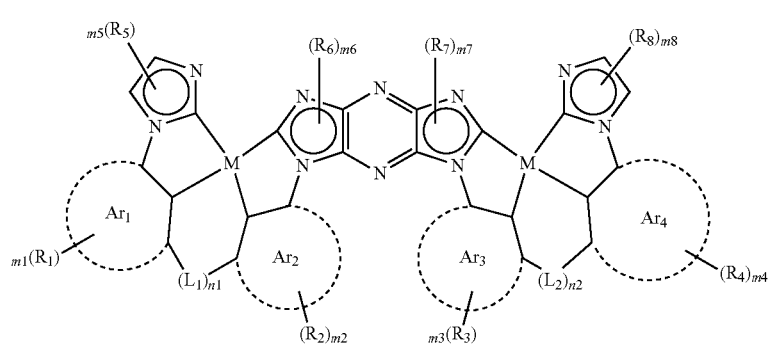

the chemical formulae 1-1 and 1-2, M, $Ar_1$ to $Ar_4$, $R_1$ to $R_8$, and $m_1$ to $m_5$ are defined the same as in the chemical formula 1.

16. The organometallic complex of claim 14, wherein the organometallic complex represented by the chemical formula 1 is represented by the following chemical formula 1-3:

[Chemical formula 1-3]

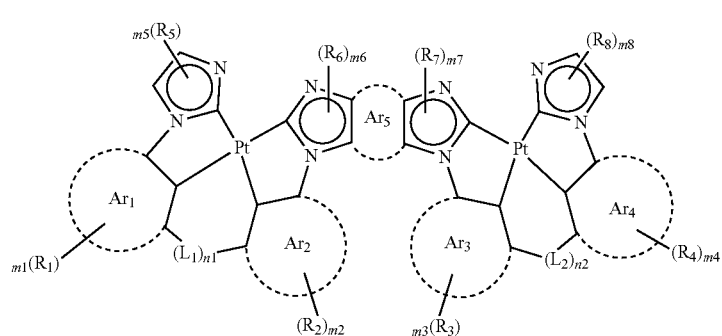

in the chemical formula 1-3,
$Ar_1$ to $Ar_5$, $R_1$ to $R_8$, $m_1$ to $m_8$, $L_1$, $L_2$, $n_1$ and $n_2$ are defined the same as in the chemical formula 1.

17. The organometallic complex of claim 14, wherein the $R_1$ to $R_8$ are each independently represented by the following structure S1, S2, or S3:

[S1]
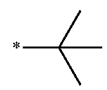

[S2]
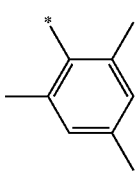

[S3]
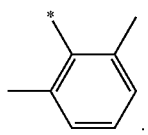

18. The organometallic complex of claim 14, wherein $Ar_1$ to $Ar_4$ are each independently a substituted or unsubstituted benzene ring.

19. The organometallic complex of claim 14, wherein the organometallic complex represented by the chemical formula 1 is phosphorescence dopants or thermally activated delayed fluorescent dopants.

20. The organometallic complex of claim 14, wherein the organometallic complex represented by the chemical formula 1 is one of compounds represented by the following compound group 1:

[Compound group 1]

1
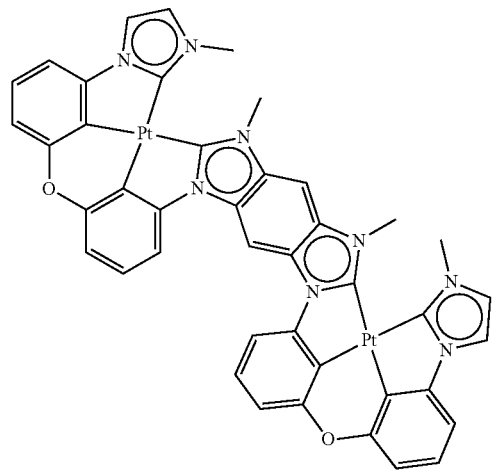

2
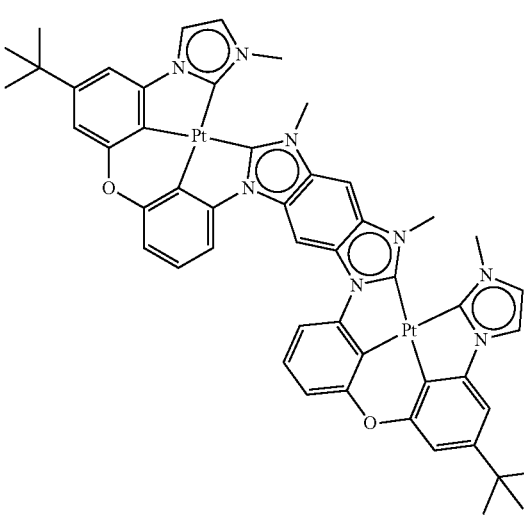

99
-continued
3
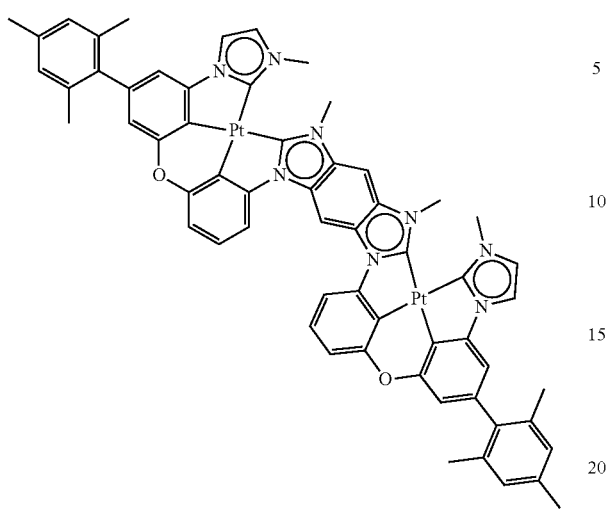
4
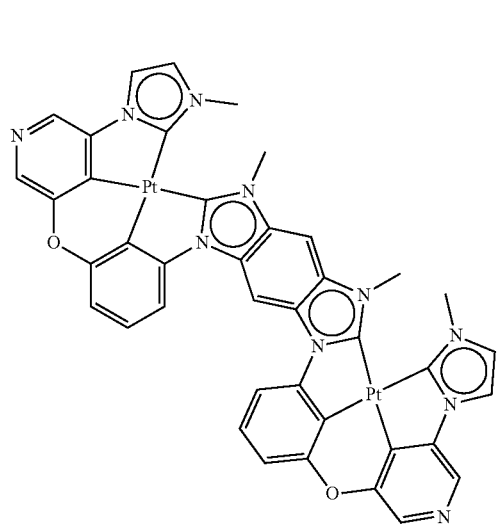
5
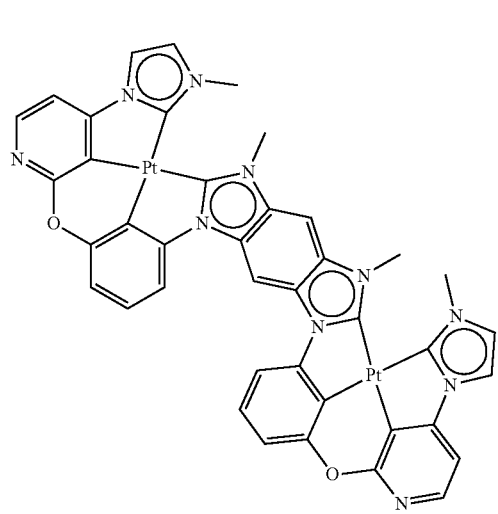
100
-continued
6
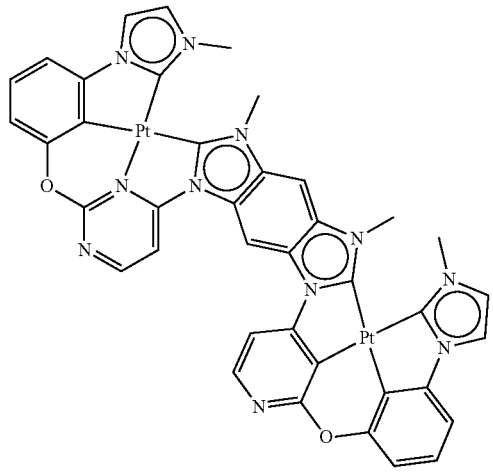
7
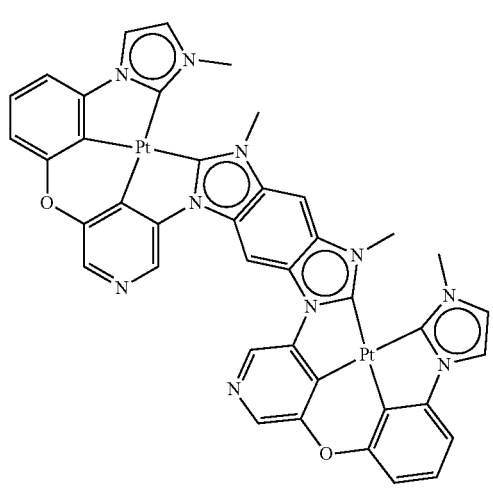
8
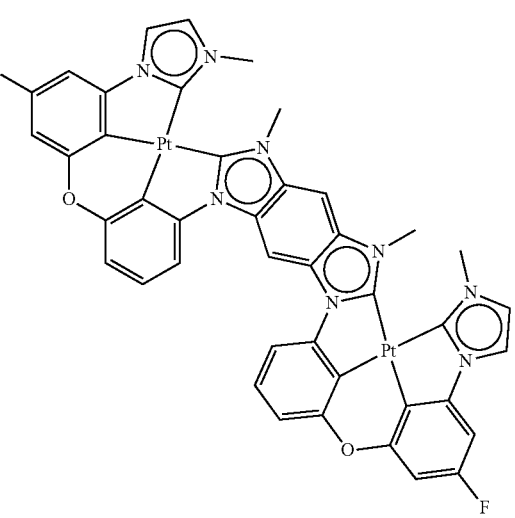

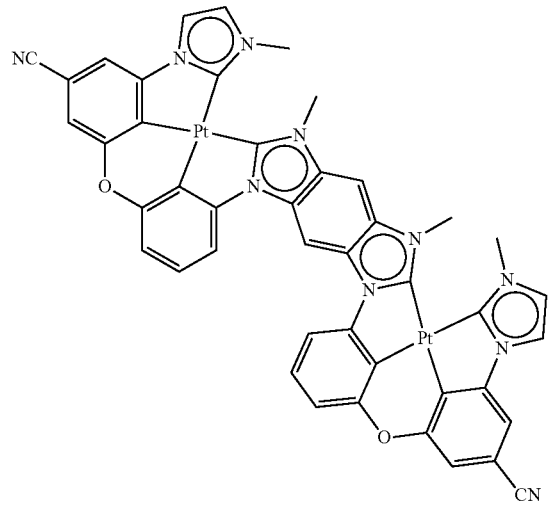
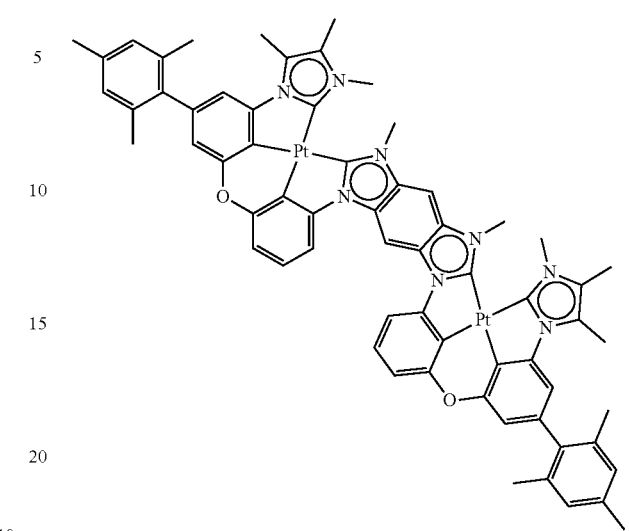
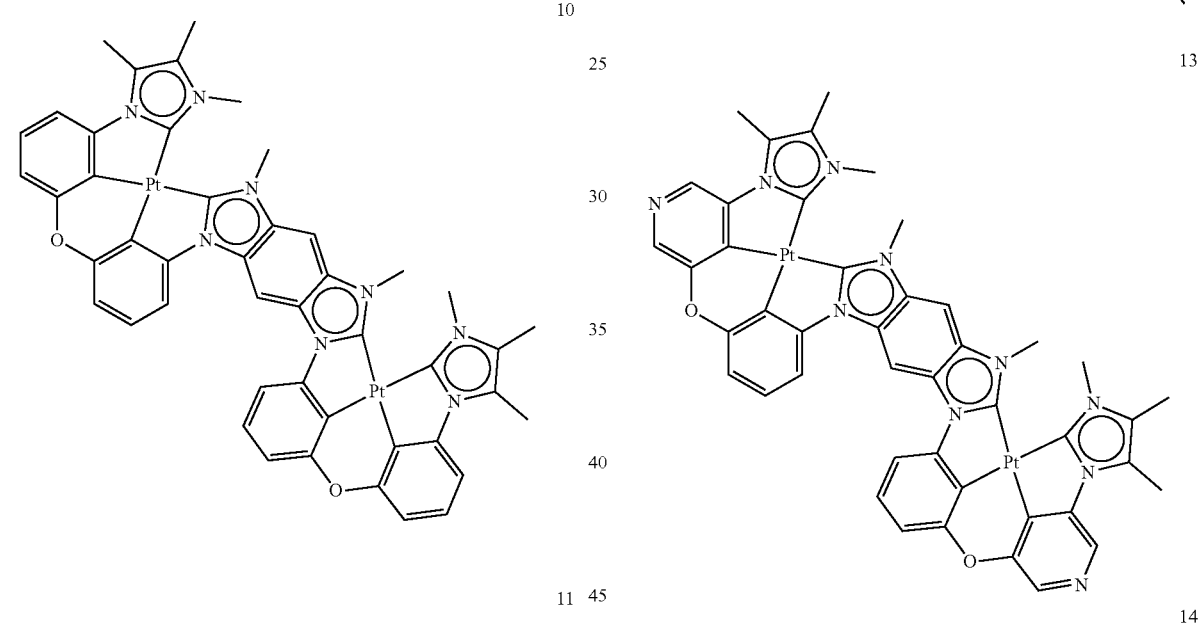
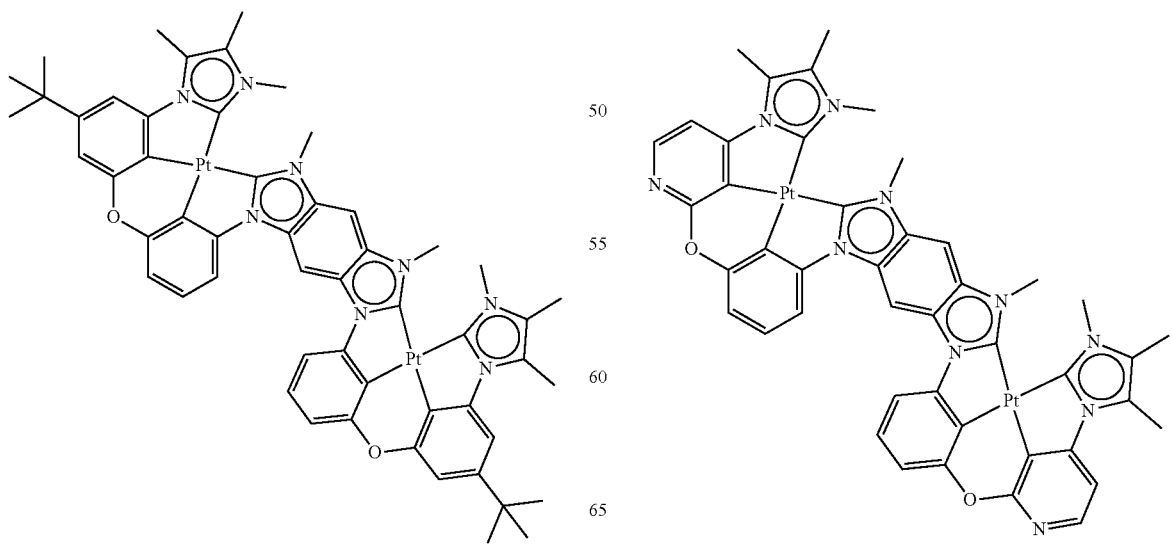

103 -continued
15
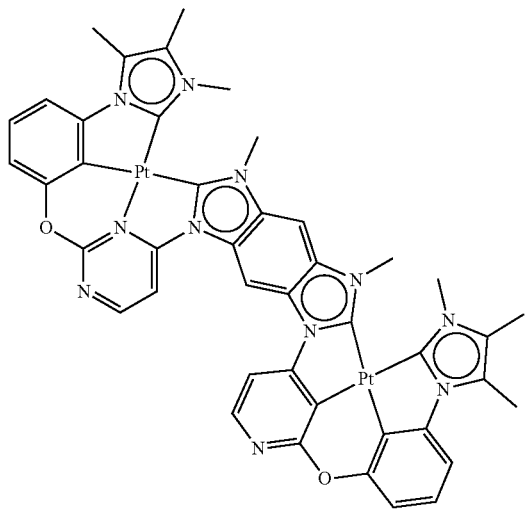
16
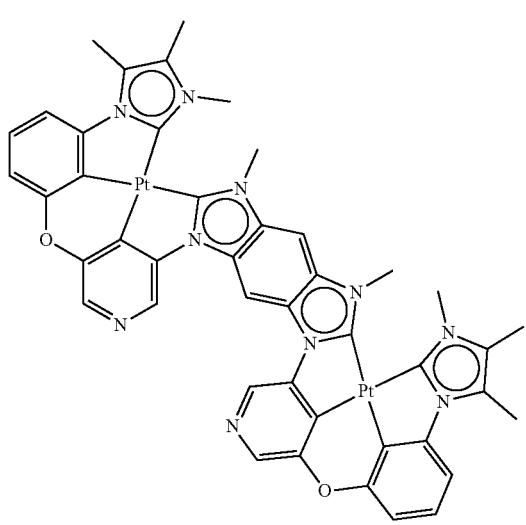
17
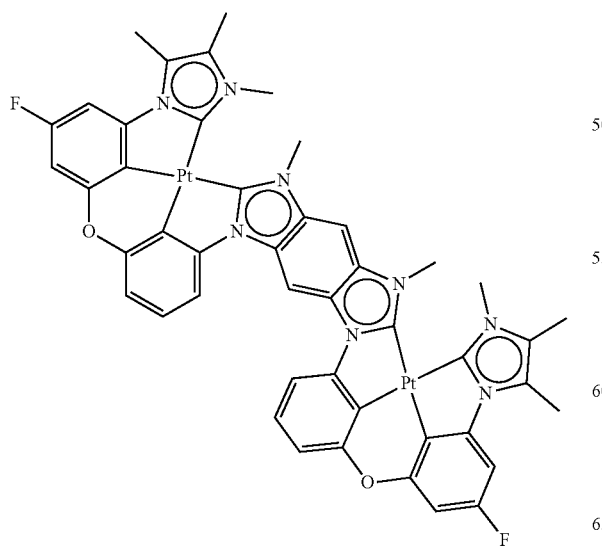
104 -continued
18
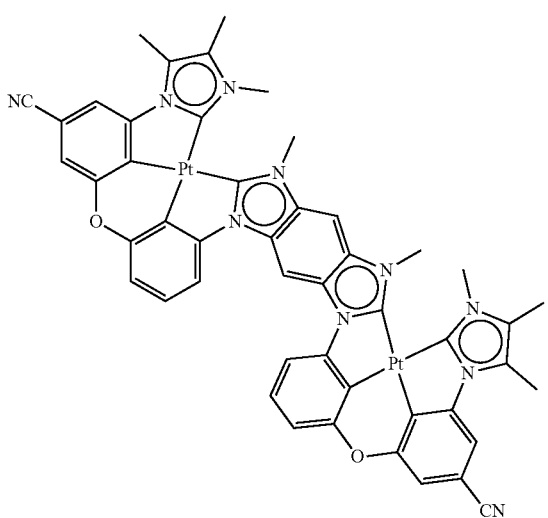
19
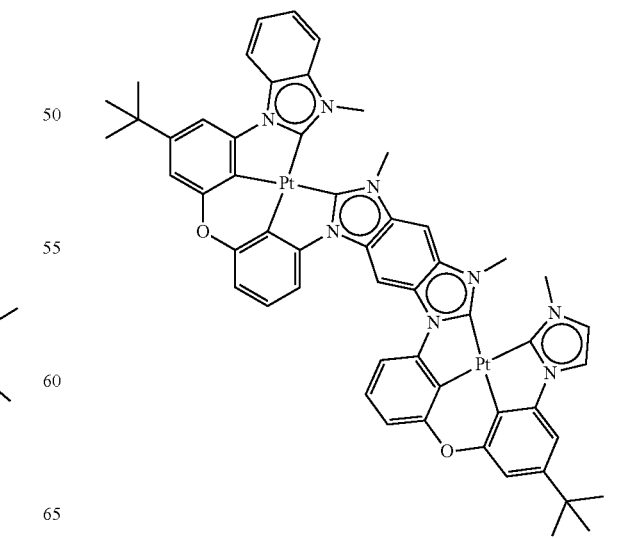
20

21
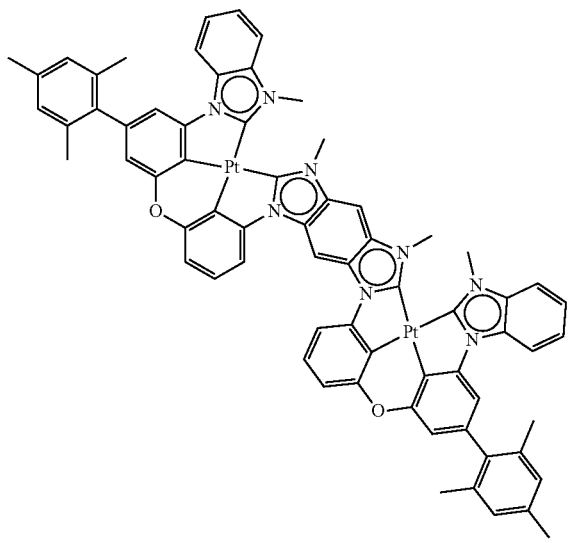
22
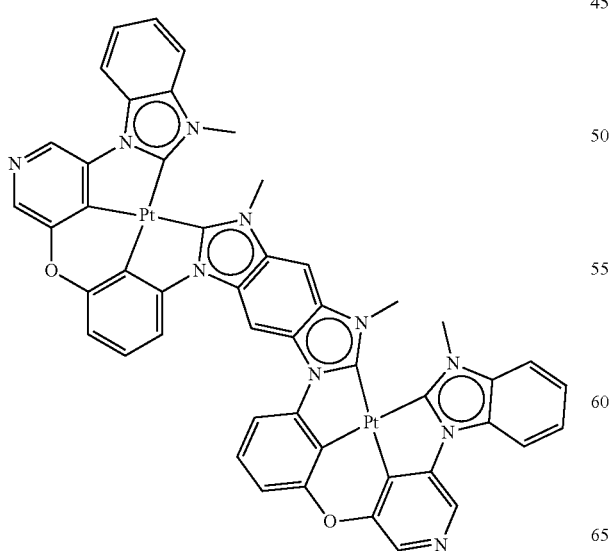
23
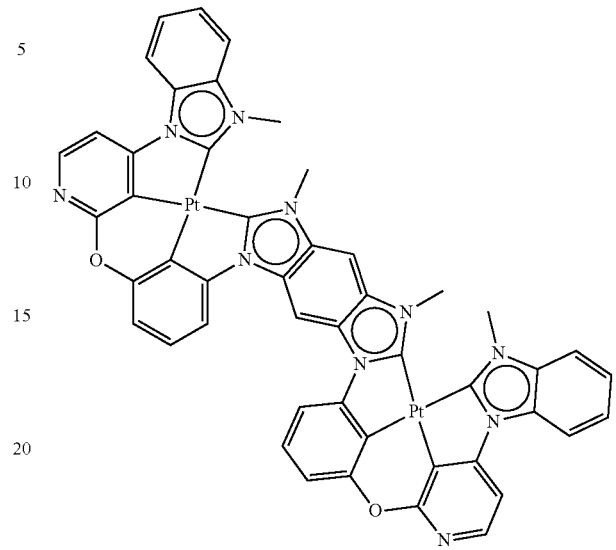
24
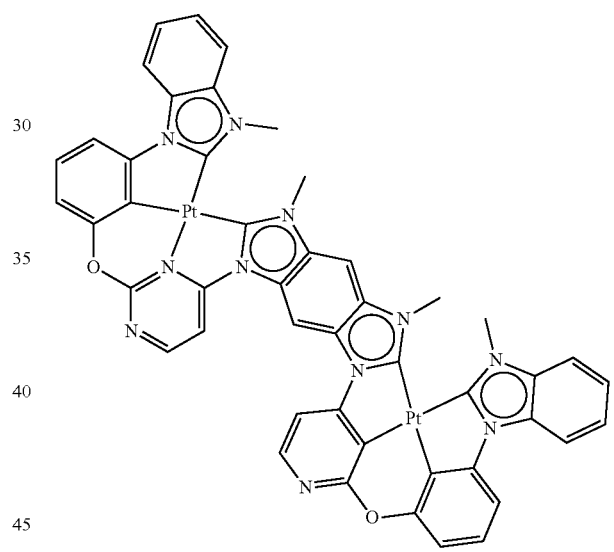
25

-continued
26
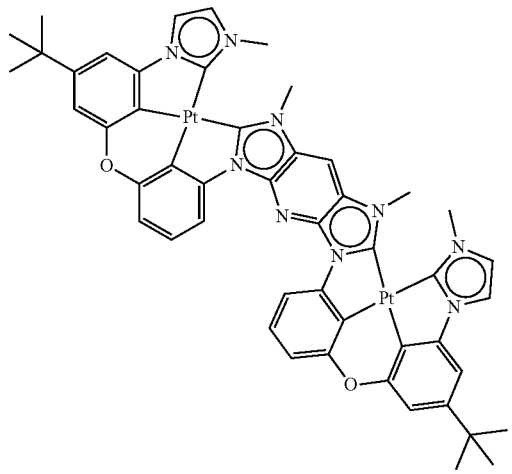
27
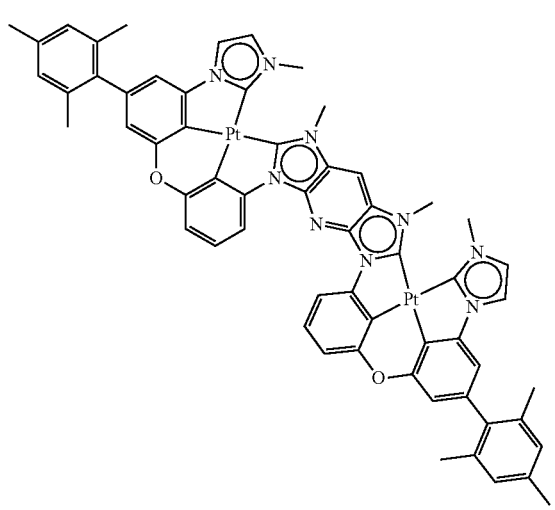
28
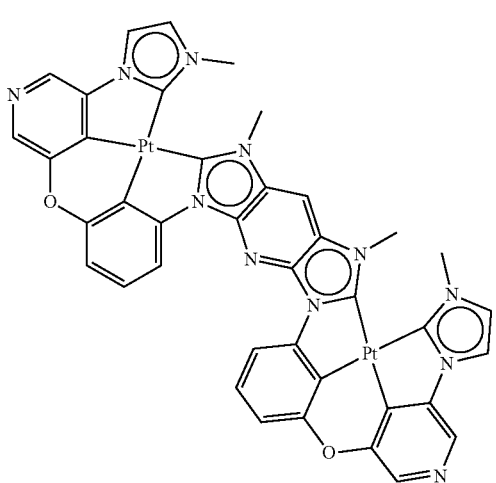
-continued
29
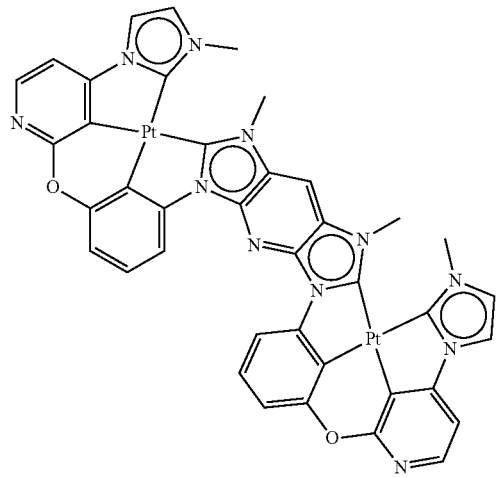
30
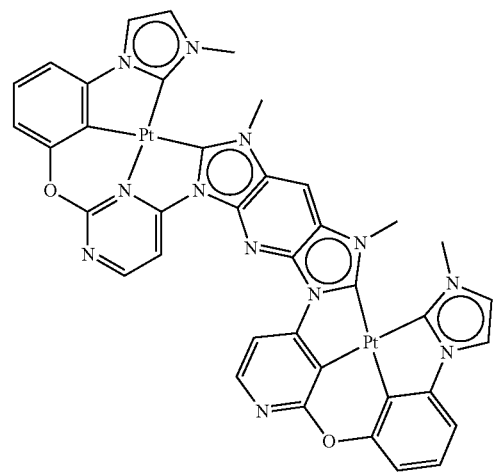
31
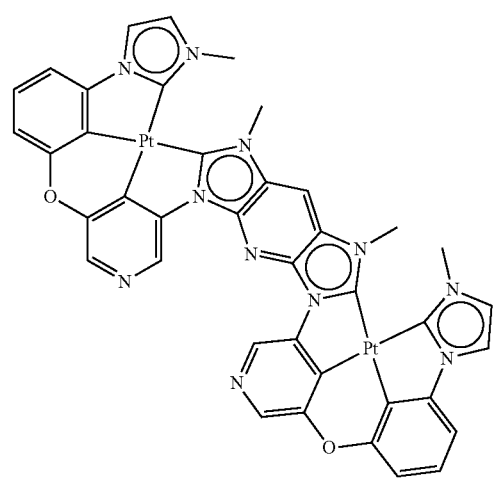

32
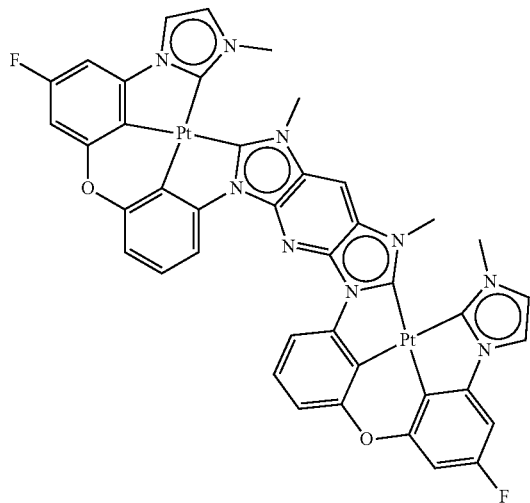
33
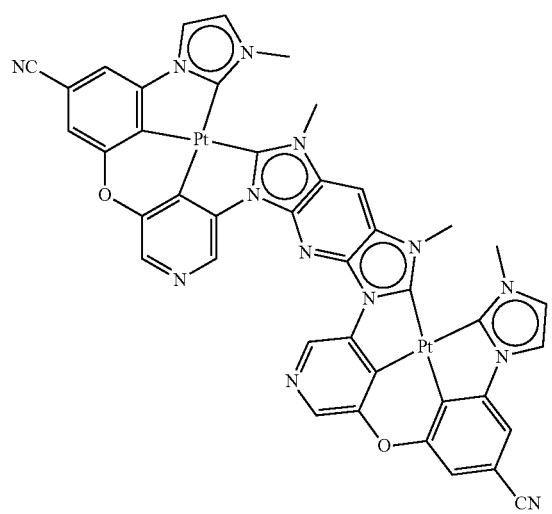
34
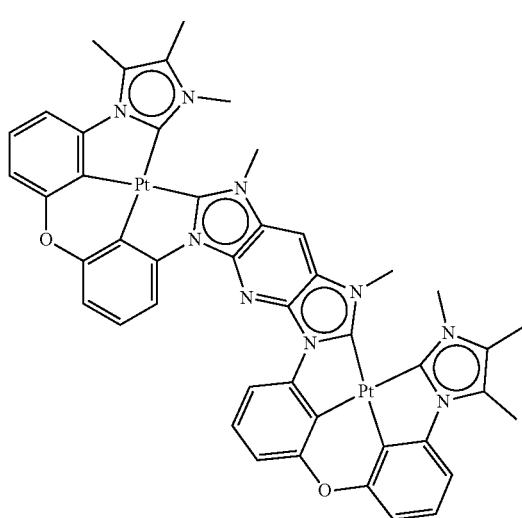
35
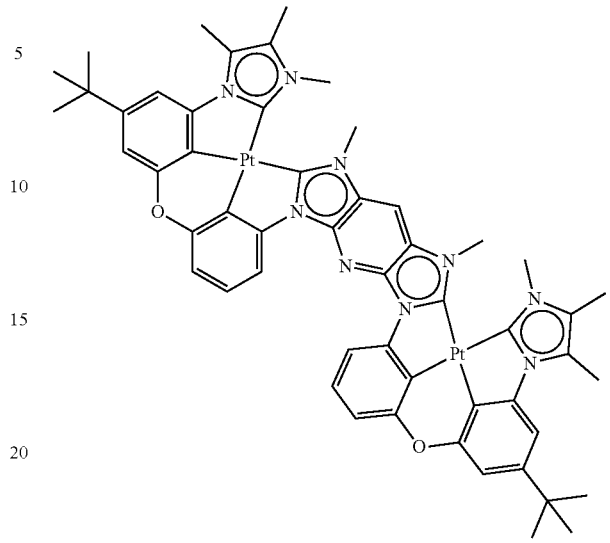
36
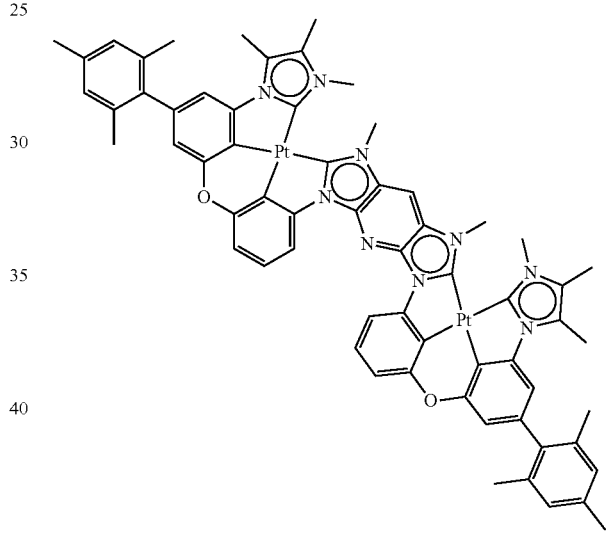
37
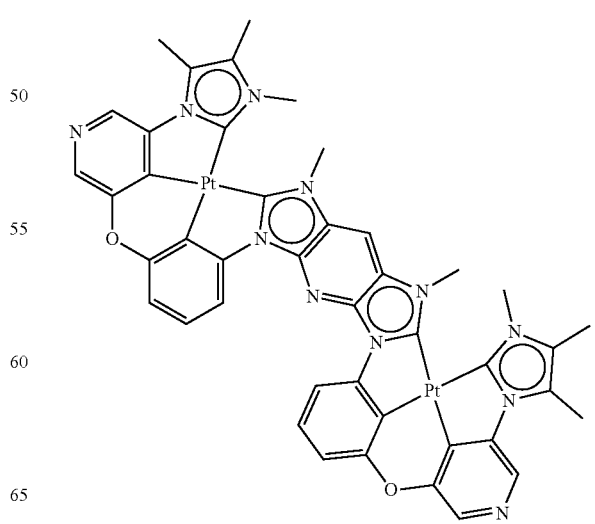

38
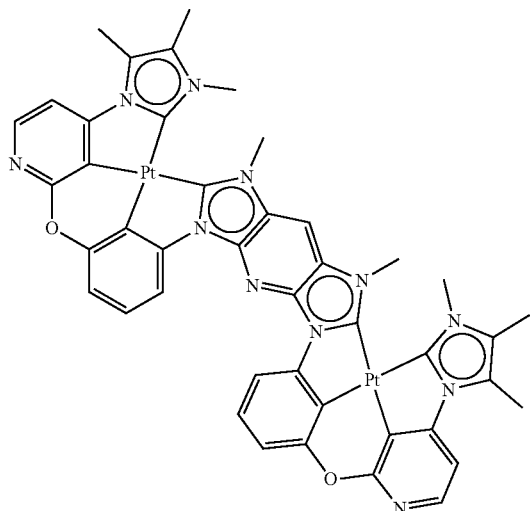
39
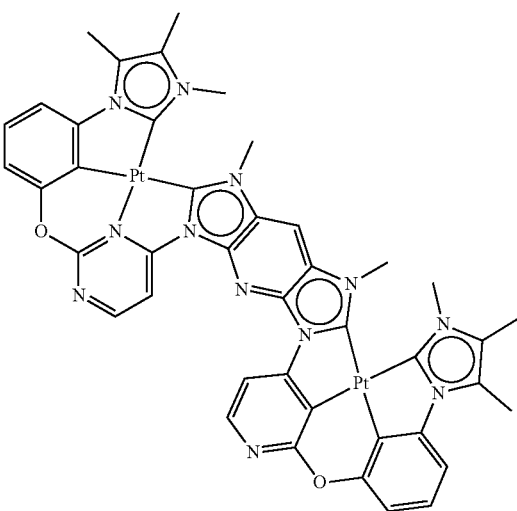
40
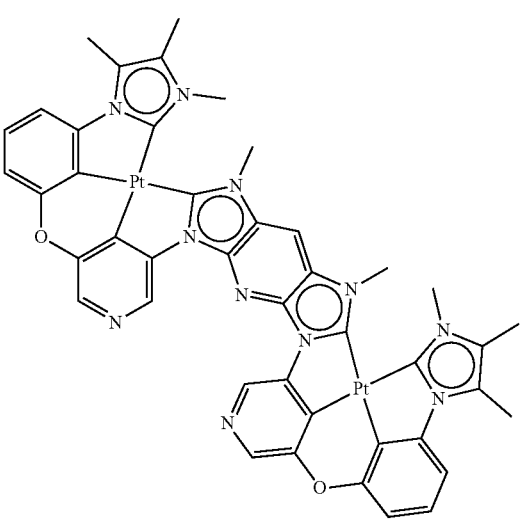
41
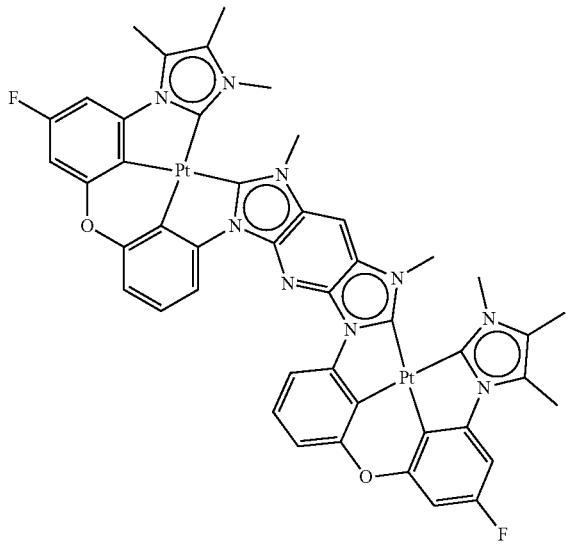
42
43
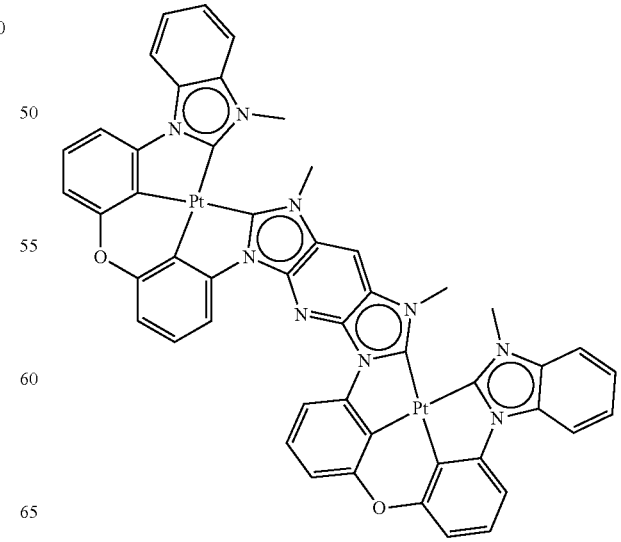

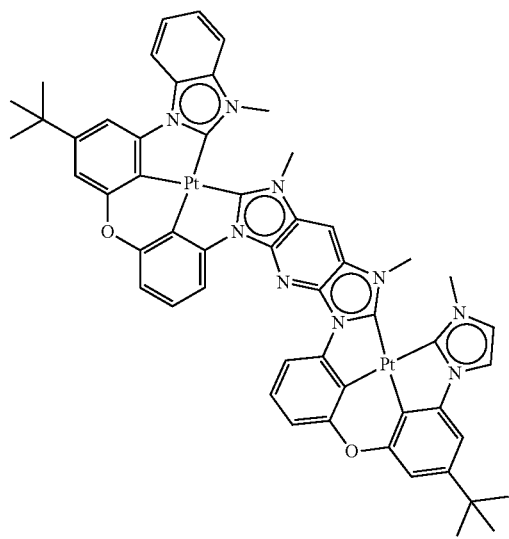
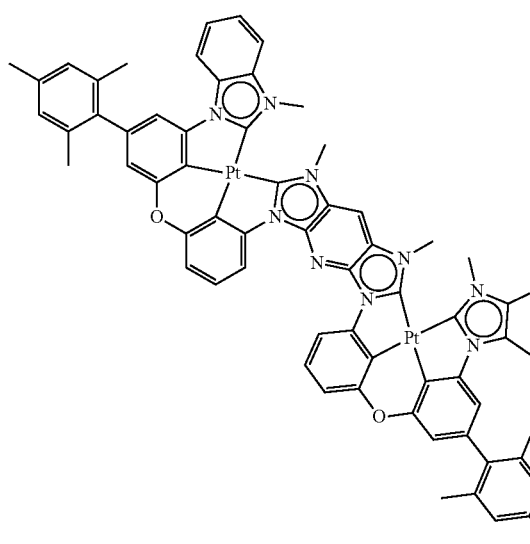
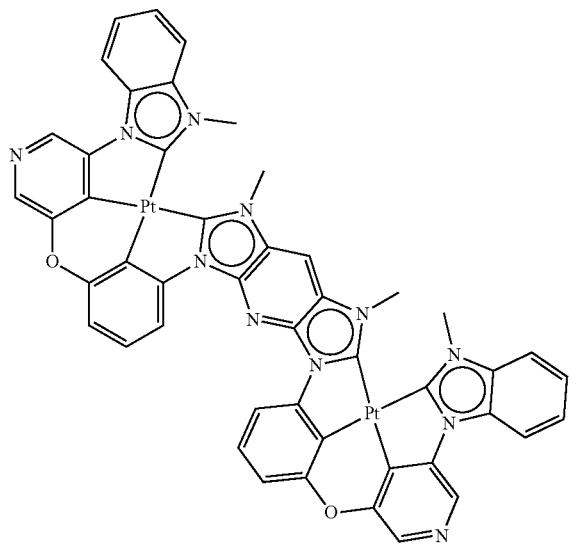
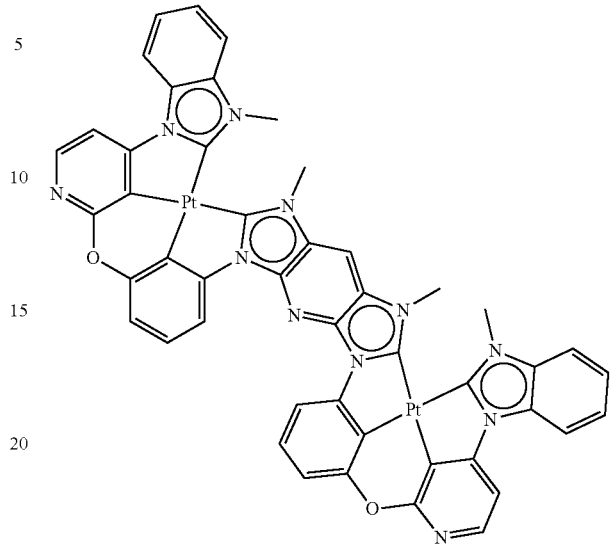
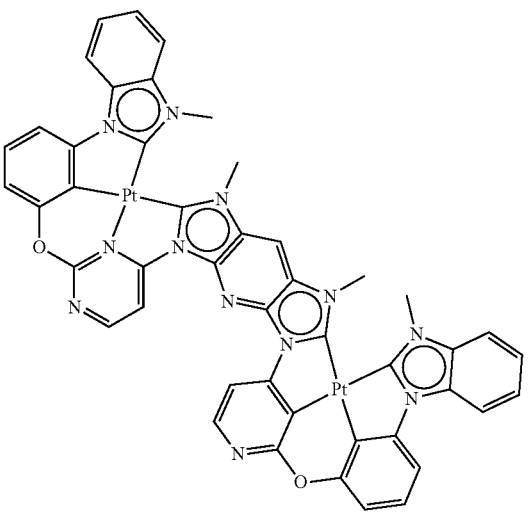
* * * * *

UNITED STATES PATENT AND TRADEMARK OFFICE
CERTIFICATE OF CORRECTION

PATENT NO. : 11,527,730 B2  
APPLICATION NO. : 16/813381  
DATED : December 13, 2022  
INVENTOR(S) : Sujin Shin et al.

Page 1 of 2

It is certified that error appears in the above-identified patent and that said Letters Patent is hereby corrected as shown below:

In the Claims

Column 58, Line 62, Claim 8 Delete "$m_5$," and Insert -- $m_8$, --
Column 59, Lines 1-7, Claim 9, Chemical Formula 1-3 Delete

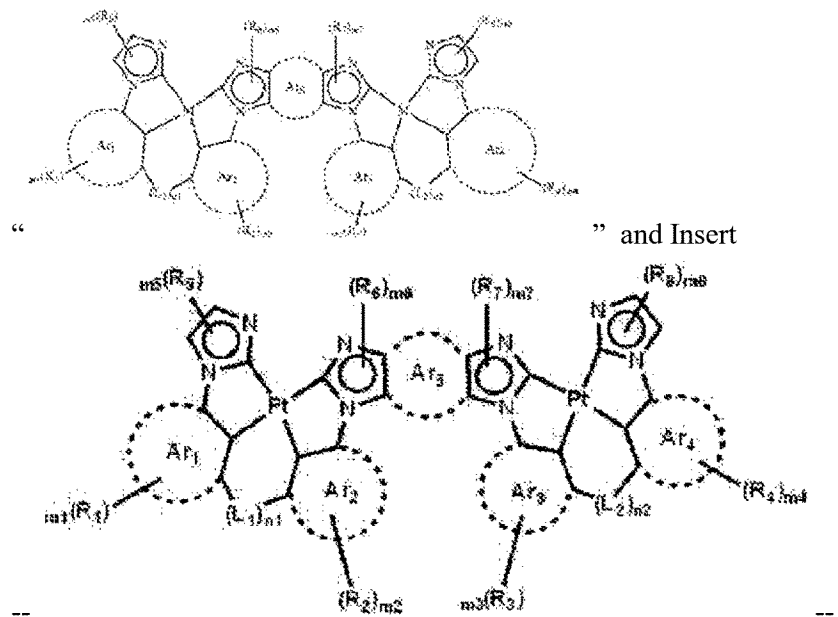

" and Insert

-- --

Column 59, Line 18, Claim 9 Delete "$m_5$" and Insert -- $m_8$, --

Signed and Sealed this  
Twenty-eighth Day of March, 2023

Katherine Kelly Vidal  
*Director of the United States Patent and Trademark Office*

CERTIFICATE OF CORRECTION (continued)
U.S. Pat. No. 11,527,730 B2

Column 62, Lines 1-21, Claim 10, Compound 8 Delete " 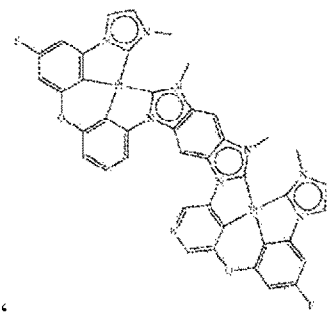 " and Insert

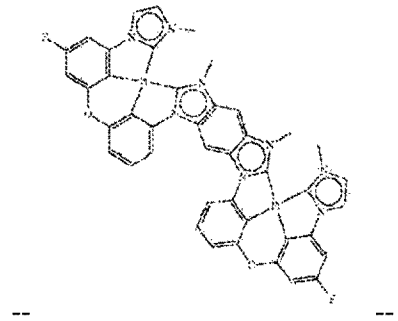

-- --